(12) United States Patent
Lee et al.

(10) Patent No.: US 12,482,798 B2
(45) Date of Patent: Nov. 25, 2025

(54) DISPLAY DEVICE AND TILED DISPLAY DEVICE

(71) Applicant: Samsung Display Co., LTD., Yongin-si (KR)

(72) Inventors: Kye Uk Lee, Yongin-si (KR); Hyun Joon Kim, Yongin-si (KR); Sang Jin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 357 days.

(21) Appl. No.: 17/988,647

(22) Filed: Nov. 16, 2022

(65) Prior Publication Data

US 2023/0238372 A1 Jul. 27, 2023

(30) Foreign Application Priority Data

Jan. 21, 2022 (KR) .................. 10-2022-0009533

(51) Int. Cl.
| | |
|---|---|
| *H01L 25/16* | (2023.01) |
| *H10D 86/40* | (2025.01) |
| *H10D 86/60* | (2025.01) |
| *H10H 20/831* | (2025.01) |
| *H01L 23/00* | (2006.01) |

(52) U.S. Cl.
CPC .......... *H01L 25/167* (2013.01); *H10D 86/441* (2025.01); *H10D 86/60* (2025.01); *H10H 20/831* (2025.01); *H01L 24/16* (2013.01); *H01L 2224/16147* (2013.01)

(58) Field of Classification Search
None
See application file for complete search history.

(56) References Cited

U.S. PATENT DOCUMENTS

| | | |
|---|---|---|
| 10,832,615 B2 | 11/2020 | Kim et al. |
| 11,037,914 B2 | 6/2021 | Kim |
| 11,550,087 B2 * | 1/2023 | Park ................. G09G 3/3607 |

(Continued)

FOREIGN PATENT DOCUMENTS

| | | |
|---|---|---|
| KR | 10-2019-0137658 A | 12/2019 |
| KR | 10-2020-0005692 A | 1/2020 |

(Continued)

*Primary Examiner* — Bo B Jang
(74) *Attorney, Agent, or Firm* — Womble Bond Dickinson (US) LLP

(57) ABSTRACT

A display device includes a pixel including a first light emitting element, a second light emitting element, and a third light emitting element that are arranged at equal distances from each other along a first direction, first pixel electrodes arranged along the first direction and contacting the first to third light emitting elements, and second pixel electrodes paired with the first pixel electrodes, arranged along the first direction, and contacting the first to third light emitting elements. Each of the first to third light emitting elements includes a first semiconductor layer, a second semiconductor layer, and an active layer between the first semiconductor layer and the second semiconductor layer, and includes a mesa area in which one of the first and second semiconductor layers is partially exposed by another thereof. The mesa area of the first light emitting element is in contact with one of the first pixel electrodes.

20 Claims, 31 Drawing Sheets

(56) References Cited

U.S. PATENT DOCUMENTS

| | | | |
|---|---|---|---|
| 2011/0291121 A1* | 12/2011 | Huang | H01L 25/0753 |
| | | | 257/E33.075 |
| 2020/0328196 A1 | 10/2020 | Han et al. | |
| 2021/0005794 A1 | 1/2021 | Sakong et al. | |
| 2021/0319727 A1 | 10/2021 | Kim | |
| 2021/0320228 A1 | 10/2021 | Kwon et al. | |
| 2023/0006095 A1 | 1/2023 | Park et al. | |

FOREIGN PATENT DOCUMENTS

| | | |
|---|---|---|
| KR | 10-2020-0119581 A | 10/2020 |
| KR | 10-2021-0005454 A | 1/2021 |
| KR | 10-2021-0073677 A | 6/2021 |
| KR | 10-2021-0125220 A | 10/2021 |
| KR | 10-2021-0127272 A | 10/2021 |

\* cited by examiner

FIG. 1
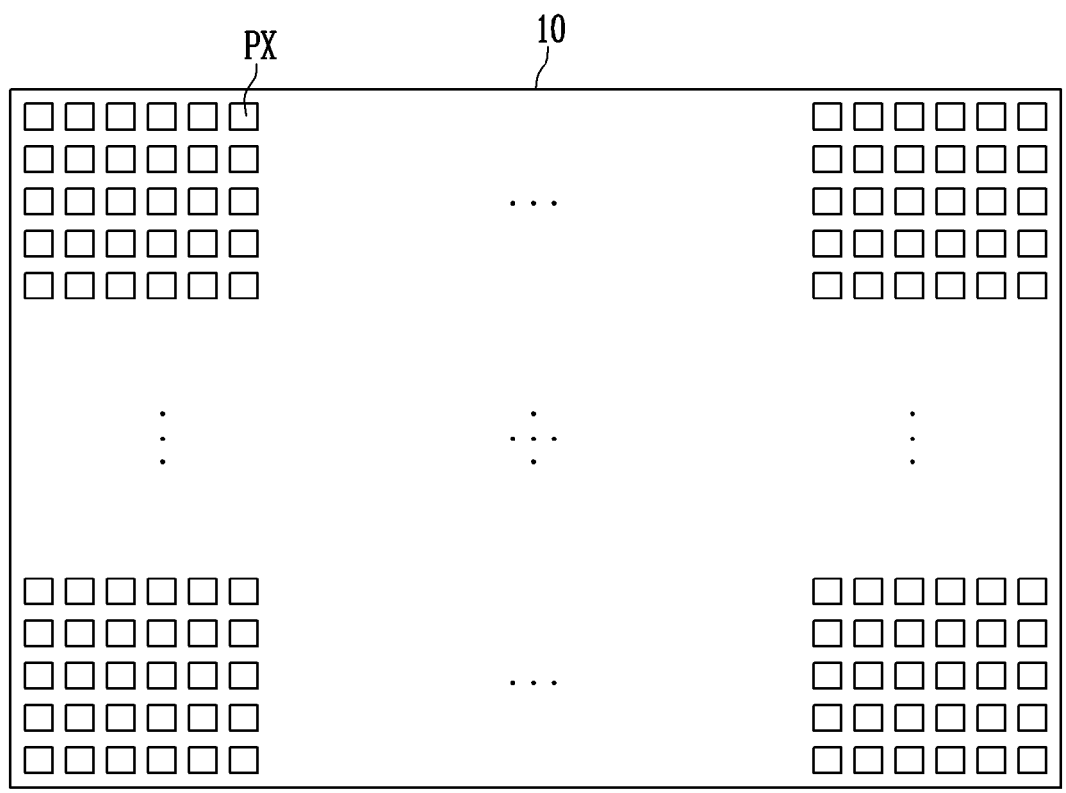
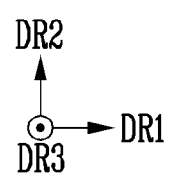

FIG. 2
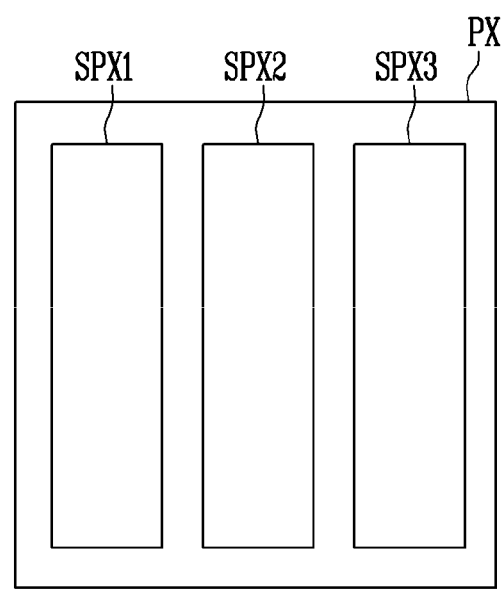
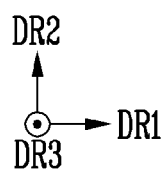

DISPLAY DEVICE AND TILED DISPLAY DEVICE

CROSS-REFERENCE TO RELATED APPLICATION

This application claims priority to and the benefit of Korean Patent Application No. 10-2022-0009533 filed in the Korean Intellectual Property Office on Jan. 21, 2022, the entire content of which is incorporated by reference herein.

BACKGROUND

1. Field

The present disclosure relates to a display device and a tiled display device.

2. Description of the Related Art

As an interest in an information display largely increases and a demand for using a portable information medium increases, a demand and commercialization for a display device has been progressed in priority.

SUMMARY

Depending on a viewing angle at which a display device is viewed, color mix may occur. For example, when a display device displaying a full white image is viewed from the side, the image may be viewed bluish or reddish.

The present disclosure has been made in an effort to provide a display device and a tiled display device that may prevent or reduce color mix occurring according to a viewing angle.

A display device according to one or more embodiments of the present invention includes a pixel. The pixel includes a first light emitting element, a second light emitting element, and a third light emitting element that are arranged at equal distances from each other along a first direction, first pixel electrodes arranged along the first direction and contacting the first to third light emitting elements, and second pixel electrodes paired with the first pixel electrodes, arranged along the first direction, and contacting the first to third light emitting elements. Each of the first to third light emitting elements includes a first semiconductor layer, a second semiconductor layer, and an active layer between the first semiconductor layer and the second semiconductor layer, and includes a mesa area in which one of the first and second semiconductor layers is partially exposed by another thereof. The mesa area of the first light emitting element is in contact with one of the first pixel electrodes, and the mesa area of the second light emitting element is in contact with one of the second pixel electrodes. An arrangement order of the first and second pixel electrodes contacting the first light emitting element is opposite to an arrangement order of the first and second pixel electrodes contacting the second light emitting element.

Each of the first to third light emitting elements may include an inclined surface along an edge of the mesa area, and the inclined surfaces of the first to third light emitting elements may respectively face a same direction.

An arrangement order of the first and second pixel electrodes contacting the third light emitting element may be a same as an arrangement order of the first and second pixel electrodes contacting the second light emitting element.

The first to third light emitting elements may be sequentially arranged along the first direction, and a distance in the first direction between the first pixel electrodes contacting the first and second light emitting elements may be different from a distance in the first direction between the first pixel electrodes contacting the second and third light emitting elements.

A distance in the first direction between the first pixel electrodes contacting the first and second light emitting elements may be different from a distance in the first direction between the second pixel electrodes contacting the first and second light emitting elements.

A distance in the first direction between the first pixel electrodes contacting the second and third light emitting elements may be a same as a distance in the first direction between the second pixel electrodes contacting the second and third light emitting elements.

The first light emitting element is configured to emit light of a red color, and the second pixel is configured to emit light of a green color or light of a blue color.

The pixel may further include a first pixel circuit, a second pixel circuit, and a third pixel circuit that are respectively configured to supply driving currents to the first to third light emitting elements through the first pixel electrodes, and each of the first to third pixel circuits may include at least one transistor and at least one capacitor.

Each of the first to third pixel circuits may further include a bridge pattern contacting the first pixel electrodes, and a shape of the bridge pattern of the first pixel circuit may be different from a shape of the bridge pattern of the second pixel circuit.

The bridge pattern of the first pixel circuit may overlap the second pixel electrodes in a plan view, and the bridge pattern of the second pixel circuit may not overlap the second pixel electrodes in a plan view.

The first to third pixel circuits may have a same circuit structure.

The first pixel circuit may be positioned in a second direction with respect to the first light emitting element, the second pixel circuit may be positioned in the second direction with respect to the second light emitting element, and the third pixel circuit may be positioned in the second direction with respect to the third light emitting element, and the second direction may be perpendicular to the first direction.

Each of the first to third light emitting elements may be a flip-chip type of micro light emitting diode.

A display device according to embodiments of the present invention includes a pixel. The pixel includes a first light emitting element, a second light emitting element, and a third light emitting element that are arranged at equal distances from each other along a first direction; and first pixel electrodes arranged along the first direction and contacting the first to third light emitting elements, and each of the first to third light emitting elements includes a first semiconductor layer, a second semiconductor layer, and an active layer between the first semiconductor layer and the second semiconductor layer, and includes a mesa area in which one of the first and second semiconductor layers is partially exposed by another thereof. The mesa area of the first light emitting element is in the first semiconductor layer, and the mesa area of the second light emitting element is in the second semiconductor layer. The first pixel electrodes are arranged at different distances along the first direction.

A tiled display device according to one or more embodiments of the present invention includes: a plurality of display devices, and a seaming portion located between the plurality of display devices, wherein a first display device of the plurality of display devices includes: a substrate; and a pixel on a first surface of the substrate. The pixel includes a first light emitting element, a second light emitting element, and a third light emitting element that are arranged at equal distances from each other along a first direction, first pixel electrodes arranged along the first direction and contacting the first to third light emitting elements, and second pixel electrodes paired with the first pixel electrodes, arranged along the first direction, and contacting the first to third light emitting elements. Each of the first to third light emitting elements includes a first semiconductor layer, a second semiconductor layer, and an active layer between the first semiconductor layer and the second semiconductor layer, and includes a mesa area in which one of the first and second semiconductor layers is partially exposed by another thereof. The mesa area of the first light emitting element is in contact with one of the first pixel electrodes, and the mesa area of the second light emitting element is in contact with one of the second pixel electrodes. An arrangement order of the first and second pixel electrodes contacting the first light emitting element is opposite to an arrangement order of the first and second pixel electrodes contacting the second light emitting element.

Each of the light emitting elements may be a flip chip type of micro light emitting diode.

The substrate includes glass.

The first display device may further include a pad on the first surface of the substrate; and a side wire on the first surface of the substrate, a second surface opposite to the first surface, and one side surface between the first surface and the second surface, and is connected to the pad.

The first display device may further include a connecting wire on the second surface of the substrate; and a flexible film connected to the connecting wire through a conductive adhesive member, and the side wire is connected to the connecting wire.

The plurality of display devices may be arranged in a matrix format in M rows and N columns.

In the display device according to the embodiment of the present invention, by swapping and disposing at least one pixel electrode and a common electrode among sub-pixels, light emitting elements that emit light in different colors and have different structures (for example, light emitting elements having opposite electrode arrangements and having a mesa structure) may be arranged in substantially the same direction or in the same shape. Accordingly, a light output rate of the light emitting elements becomes uniform for each direction (or for each viewing angle), and color mix according to the viewing angle may be prevented or alleviated.

An effect according to the embodiment of the present invention is not limited by what is illustrated in the above, and more various effects are included in the present specification.

BRIEF DESCRIPTION OF THE DRAWINGS

The above and other aspects and features of embodiments of the present disclosure will become more apparent by describing in detail embodiments thereof with reference to the attached drawings, in which:

FIG. 1 illustrates a top plan view of a display device according to one or more embodiments;

FIG. 2 illustrates an example of a pixel of FIG. 1;

DETAILED DESCRIPTION

Figure 3:
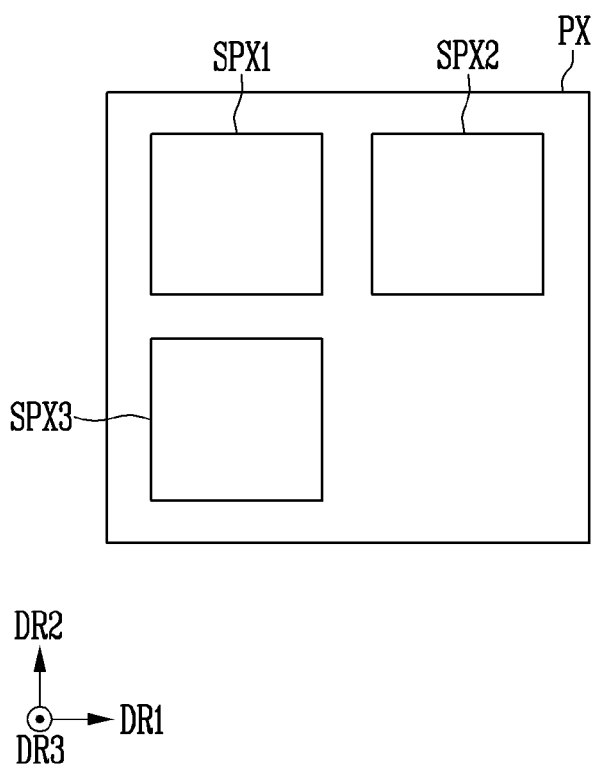
FIG. 3 illustrates an example of a pixel of FIG. 1.

Aspects and features of embodiments of the present disclosure and methods of accomplishing the same may be understood more readily by reference to the following detailed description of embodiments and the accompanying drawings. However the present disclosure is not limited to the embodiments described hereinafter, and may be embodied in many different forms, and the following embodiments are provided to make the present disclosure complete and to allow those skilled in the art to clearly understand the scope of the present disclosure, and the present disclosure is defined by the scope of the appended claims and equivalents thereof.

It will be understood that when an element or a layer is referred to as being con' another element or layer, it can be directly on another element or layer, or intervening element or layer may also be present. Throughout the specification, the same reference numerals denote the same constituent elements. The shapes, sizes, ratios, angles, numbers, and the like disclosed in the drawings for describing embodiments of the present disclosure are illustrative, and thus the present disclosure is not limited to the illustrated embodiments.

"Connection" between two elements may comprehensively mean both electrical and physical connections, but is not necessarily limited thereto. For example, "connection" used based on a circuit diagram may mean an electrical connection, and "connection" used based on a cross-sectional view and a top plan view may mean a physical connection.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure.

Each of the features of the various embodiments of the present disclosure may be coupled or combined with each other partly or entirely, and may be technically variously interlocked and driven in a manner that is sufficiently understandable to those skilled in the art. Each embodiment may be practicable independently of each other and may be practicable with together in an interrelationship.

Hereinafter, specific embodiments will be described with reference to the accompanying drawings.

FIG. 1 illustrates a top plan view of a display device according to one or more embodiments. FIG. 2 illustrates an example of a pixel of FIG. 1. FIG. 3 illustrates an example of a pixel of FIG. 1.

Referring to FIG. 1, a light emitting display device 10 (or a display panel) according to one or more embodiments is a device for displaying an image (for example, a moving image or a still image), and may be used as a display screen of a portable electronic device such as a mobile phone, a smart phone, a tablet personal computer (PC), a smart watch, a watch phone, a mobile communication terminal, an electronic note, an electronic book, a portable multimedia players (PMP), a navigation device, and an ultra-mobile PC (UMPC), and may be used as display screens of various products such as a television set, a laptop computer, a monitor, a billboard, an Internet of things (IOT).

The display device 10 may be formed as a flat surface having a rectangular shape having a long side of a first direction DR1 and a short side of a second direction DR2 crossing the first direction DR1. A corner at which the long side of the first direction DR1 and the short side of the second direction DR2 meet may be rounded to have a suitable curvature (e.g., a predetermined curvature) or may be formed to have a right angle. The flat shape of the display device 10 is not limited to a quadrangular shape, and may be formed to have another polygonal, circular, or elliptical shape. The display device 10 may be formed to be flat, but is not limited thereto. For example, the display device 10 may include curved portions that are formed at left and right ends and have a constant curvature or a variable curvature. In addition, the display device 10 may be flexibly formed to be bent, curved, folded, or rolled.

The display device 10 may further include pixels PX, scan lines extending in the first direction DR1, and data lines extending in the second direction DR2, to display an image. The pixels PX may be arranged in a matrix format in the first direction DR1 and the second direction DR2. For example, the pixels PX may be arranged along rows and columns of a matrix in the first direction DR1 and the second direction DR2.

Each of the pixels PX may include a plurality of sub-pixels SPX1, SPX2, and SPX3 as shown in FIG. 2 and FIG. 3. FIG. 2 and FIG. 3 illustrate that each of the pixels PX includes three sub-pixels SPX1, SPX2, and SPX3, that is, a first sub-pixel SPX1, a second sub-pixel SPX2, and a third sub-pixel SPX3, but the present disclosure is not limited thereto.

Each of the first sub-pixel SPX1, the second sub-pixel SPX2, and the third sub-pixel SPX3 may be connected to one of the data lines and at least one of the scan lines.

Each of the first sub-pixel SPX1, the second sub-pixel SPX2, and the third sub-pixel SPX3 may have a rectangular, square, or rhombus planar shape. For example, each of the first sub-pixel SPX1, the second sub-pixel SPX2, and the third sub-pixel SPX3 may have a rectangular planar shape having short sides in the first direction DR1 and long sides in the second direction DR2 as shown in FIG. 2. Alternatively, each of the first sub-pixel SPX1, the second sub-pixel SPX2, and the third sub-pixel SPX3 may have a square or rhombus planar shape including sides having the same length in the first direction DR1 and the second direction DR2 as shown in FIG. 3.

As shown in FIG. 2, the first sub-pixel SPX1, the second sub-pixel SPX2, and the third sub-pixel SPX3 may be arranged along the first direction DR1. Alternatively, one of the second sub-pixel SPX2 and the third sub-pixel SPX3, and the first sub-pixel SPX1 may be arranged along the first direction DR1, and the other one of the second sub-pixel SPX2 and the third sub-pixel SPX3, and the first sub-pixel SPX1 may be arranged along the second direction DR2. For example, as shown in FIG. 3, the first sub-pixel SPX1 and the second sub-pixel SPX2 may be arranged along the first direction DR1, and the first sub-pixel SPX1 and the third sub-pixel SPX3 may be arranged along the second direction DR2.

Alternatively, one of the first sub-pixel SPX1 and the third sub-pixel SPX3, and the second sub-pixel SPX2 may be arranged along the first direction DR1, and the other one of the first sub-pixel SPX1 and the third sub-pixel SPX3, and the second sub-pixel SPX2 may be arranged along the second direction DR2. Alternatively, one of the first sub-pixel SPX1 and the second sub-pixel SPX2, and the third sub-pixel SPX3 may be arranged along the first direction DR1, and the other one of the first sub-pixel SPX1 and the second sub-pixel SPX2, and the third sub-pixel SPX3 may be arranged along the second direction DR2.

The first sub-pixel SPX1 may emit first light, the second sub-pixel SPX2 may emit second light, and the third sub-pixel SPX3 may emit third light. Here, the first light may be light of a red wavelength band, the second light may be light of a green wavelength band, and the third light may be light of a blue wavelength band. The red wavelength band is a wavelength band of about 600 nm to 750 nm, the green wavelength band is a wavelength band of about 480 nm to 560 nm, and the blue wavelength band may be a wavelength band of about 370 nm to 460 nm, but are not limited thereto.

Each of the first sub-pixel SPX1, the second sub-pixel SPX2, and the third sub-pixel SPX3 has a light emitting element emitting light, and may include an inorganic light emitting element including an inorganic semiconductor. For example, the inorganic light emitting element may be a flip chip type of micro light emitting diode (LED), but the embodiment of the present specification is not limited thereto.

As shown in FIG. 2 and FIG. 3, an area of the first sub-pixel SPX1, an area of the second sub-pixel SPX2, and an area of the third sub-pixel SPX3 may be substantially the same, but the embodiment of the present specification is not limited thereto. At least one of the area of the first sub-pixel SPX1, the area of the second sub-pixel SPX2, and the area of the third sub-pixel SPX3 may be different from another one thereof. Alternatively, two of the area of the first sub-pixel SPX1, the area of the second sub-pixel SPX2, and the area of the third sub-pixel SPX3 may be substantially the same, and the other one thereof may be different from the two. Alternatively, the area of the first sub-pixel SPX1, the area of the second sub-pixel SPX2, and the area of the third sub-pixel SPX3 may be different from each other.

Figure 4:
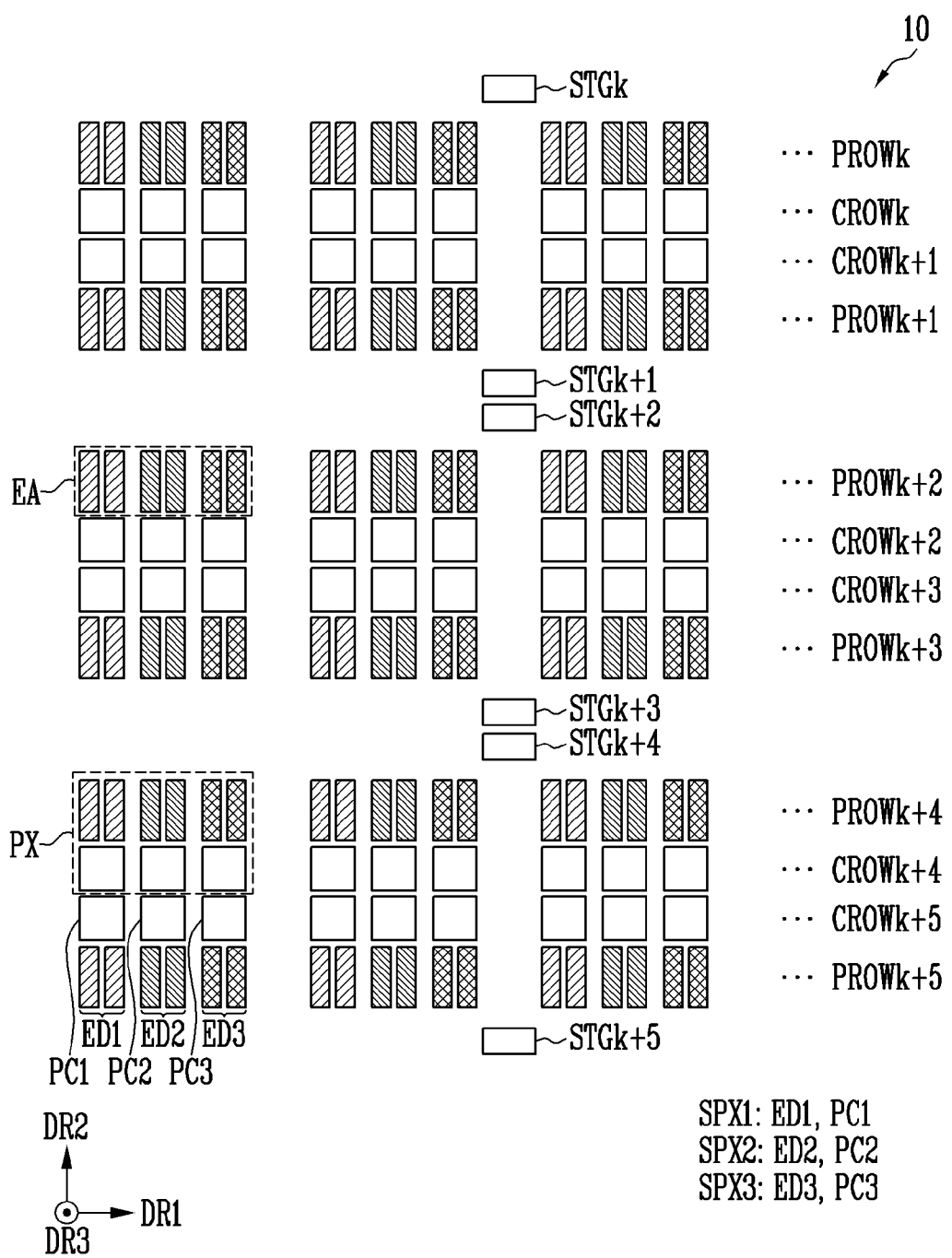
FIG. 4 illustrates a top plan view of an embodiment of the display device of FIG. 1.
Figure 5:
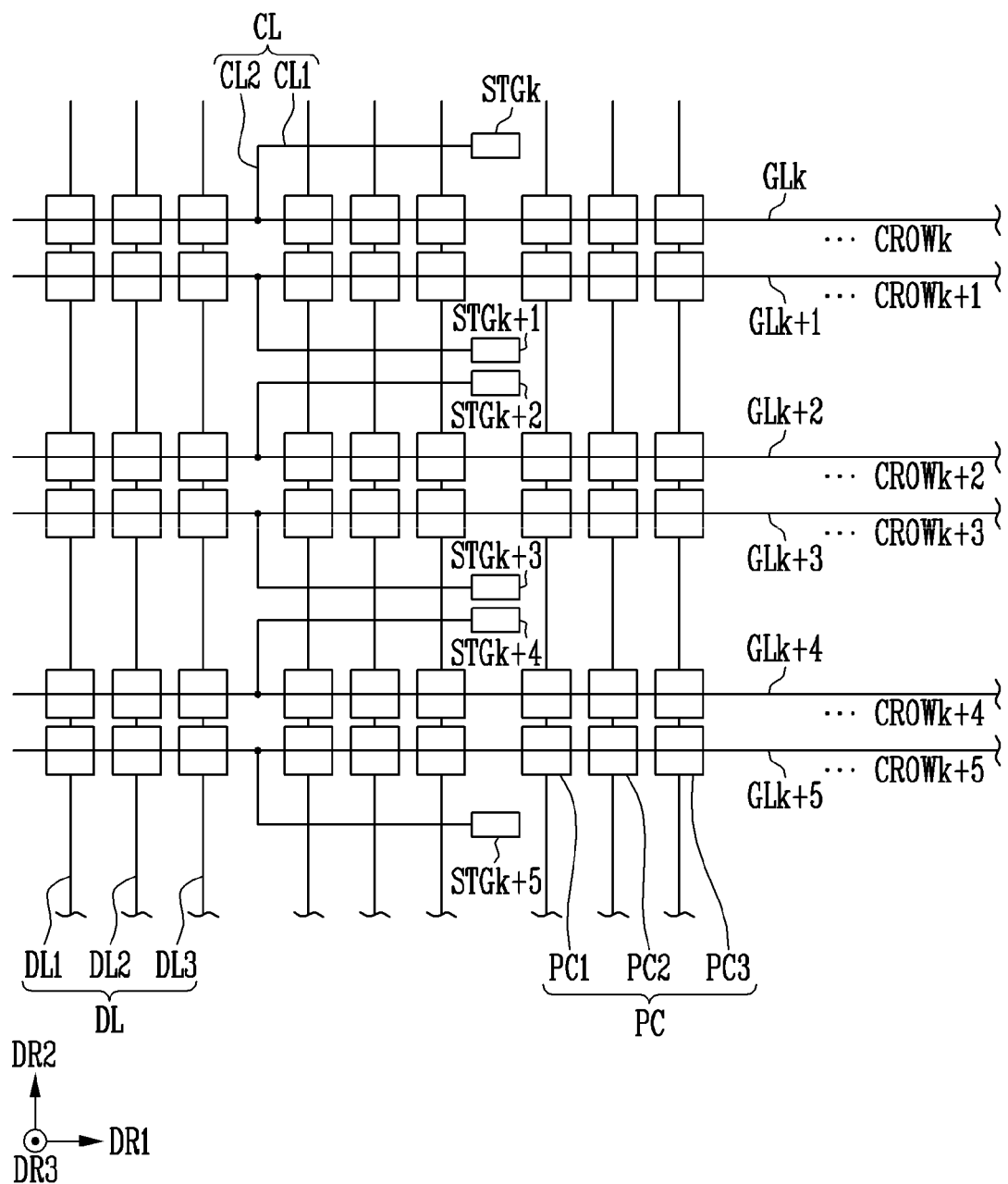
FIG. 5 illustrates a connection relationship between a pixel circuit and a stage included in the display device of FIG. 4.

FIG. 4 illustrates a top plan view of an embodiment of the display device of FIG. 1. FIG. 5 illustrates a connection relationship between a pixel circuit and a stage included in the display device of FIG. 4. A plurality of stages may configure at least one gate driver (or scan driver).

Referring to FIG. 1 and FIG. 5, the display device 10 may include the pixel PX, and the pixel PX may include the first to third sub-pixels SPX1 to SPX3.

The first sub-pixel SPX1 includes a first light emitting element ED1 and a first pixel circuit PC1, and the first pixel circuit PC1 may supply a driving current to the first light emitting element ED1. The first pixel circuit PC1 may be positioned in the second direction DR2 based on the first light emitting element ED1, and the first pixel circuit PC1 may be electrically connected to the first light emitting element ED1 through an anode connecting line (refer to FIG. 6). The second sub-pixel SPX2 includes a second light emitting element ED2 and a second pixel circuit PC2, and the second pixel circuit PC2 may supply a driving current to the second light emitting element ED2. The second pixel circuit PC2 may be positioned in the second direction DR2 based on the second light emitting element ED2, and the second pixel circuit PC2 may be electrically connected to the second light emitting element ED2 through the anode connecting line (refer to FIG. 6). The third sub-pixel SPX3 includes a third light emitting element ED3 and a third pixel circuit PC3, and the third pixel circuit PC3 may supply a driving current to the third light emitting element ED3. The third pixel circuit PC3 may be positioned in the second direction DR2 based on the third light emitting element ED3, and the third pixel circuit PC3 may be electrically connected to the third light emitting element ED3 through the anode connecting line (refer to FIG. 6). Each of the first to third pixel circuits PC1 to PC3 may include at least one transistor (refer to "TFT" in FIG. 7) and at least one capacitor (refer to "C1" in FIG. 7).

In one or more embodiments, each of the first to third sub-pixels SPX1 to SPX3 may include two light emitting elements. For example, each of the first to third sub-pixels SPX1 to SPX3 may include a main light emitting element and a repair light emitting element, but is not limited thereto. As another example, each of the first to third sub-pixels SPX1 to SPX3 may include three or more light emitting elements. As will be described later with reference to FIG. 6, the first to third light emitting elements ED1 to ED3 shown in FIG. 4 may refer to respective electrodes (for example, an anode electrode and a cathode electrode) of the first to third light emitting elements ED1 to ED3.

Based on the light emitting elements ED1, ED2, and ED3, the pixels PX may be arranged to have a uniform pixel pitch. The light emitting elements ED1, ED2, and ED3 may be arranged along a plurality of pixel rows. For example, the light emitting elements ED1, ED2, and ED3 may be arranged along a k-th to a (k+5)-th pixel rows (PROWk to PROWk+5) (wherein k is a positive integer). The pixel circuits PC1, PC2, and PC3 may be arranged along a plurality of circuit rows. The pixel circuits PC1, PC2, and PC3 may be arranged along a k-th to a (k+5)-th circuit rows (CROWk to CROWk+5).

The k-th pixel row (PROWk) may be adjacent to the k-th circuit row (CROWk) in an opposite direction of the second direction DR2, and the (k+1)-th pixel row (PROWk+1) may be adjacent to the (k+1)-th circuit row (CROWk+1) in the second direction DR2. The k-th and (k+1)-th circuit rows (CROWk and CROWk+1) may be disposed between the k-th and (k+1)-th pixel rows (PROWk and PROWk+1). Similarly, the (k+2)-th pixel row (PROWk+2) may be adjacent to the (k+2)-th circuit row (CROWk+2) in an opposite direction of the second direction DR2, and the (k+3)-th pixel row (PROWk+3) may be adjacent to the (k+3)-th circuit row (CROWk+3) in the second direction DR2. The (k+2)-th and (k+3)-th circuit rows (CROWk+2 and CROWk+3) may be disposed between the (k+2)-th and (k+3)-th pixel rows (PROWk+2 and PROWk+3). Similarly, the (k+4)-th pixel row (PROWk+4) may be adjacent to the (k+4)-th circuit row (CROWk+4) in an opposite direction of the second direction DR2, and the (k+5)-th pixel row (PROWk+5) may be adjacent to the (k+5)-th circuit row (CROWk+5) in the second direction DR2. The (k+4)-th and (k+5)-th circuit rows (CROWk+4 and CROWk+5) may be disposed between the (k+4)-th and (k+5)-th pixel rows (PROWk+4 and PROWk+5).

A k-th stage STGk may be disposed above the k-th circuit row CROWk and the k-th pixel row PROWk. The k-th stage STGk may supply a gate signal to a k-th gate line GLk connected to the pixel circuits PC1, PC2, and PC3 of the k-th circuit row CROWk. The k-th stage STGk may be connected to the k-th gate line GLk through a connecting line CL. The k-th stage STGk may be connected to the k-th gate line GLk through a first connecting line CL1 extending in the first direction DR1 and a second connecting line CL2 extending in the second direction DR2.

A (k+1)-th stage (STGk+1) and a (k+2)-th stage (STGk+2) may be disposed between the (k+1)-th pixel row (PROWk+1) and the (k+2)-th pixel row (PROWk+2). The (k+1)-th stage (STGk+1) may be disposed below the (k+1)-th circuit row (CROWk+1) and the (k+1)-th pixel row (PROWk+1). The (k+1)-th stage (STGk+1) may supply a gate signal to a (k+1)-th gate line (GLk+1) connected to the pixel circuits PC of the (k+1)-th circuit row (CROWk+1). The (k+1)-th stage STGk+1 may be connected to the (k+1)-th gate line (GLk+1) through the connecting line CL.

The (k+2)-th stage (STGk+2) may be disposed above the (k+2)-th circuit row (CROWk+2) and the (k+2)-th pixel row (PROWk+2). The (k+2)-th stage (STGk+2) may supply a gate signal to the (k+2)-th gate line (GLk+2) connected to the pixel circuits PC of the (k+2)-th circuit row (CROWk+2). The (k+2)-th stage (STGk+2) may be connected to the (k+2)-th gate line (GLk+2) through the connecting line CL.

A (k+3)-th stage (STGk+3) and a (k+4)-th stage (STGk+4) may be disposed between the (k+3)-th pixel row (PROWk+3) and the (k+4)-th pixel row (PROWk+4). The (k+3)-th stage (STGk+3) may be disposed below the (k+3)-th circuit row (CROWk+3) and the (k+3)-th pixel row (PROWk+3). The (k+3)-th stage (STGk+3) may supply a gate signal to the (k+3)-th gate line (GLk+3) connected to the pixel circuits PC of the (k+3)-th circuit row (CROWk+3). The (k+3)-th stage (STGk+3) may be connected to the (k+3)-th gate line (GLk+3) through the connecting line CL.

The (k+4)-th stage (STGk+4) may be disposed above the (k+4)-th circuit row (CROWk+4) and the (k+4)-th pixel row (PROWk+4). The (k+4)-th stage (STGk+4) may supply a gate signal to the (k+4)-th gate line (GLk+4) connected to the pixel circuits PC of the (k+4)-th circuit row (CROWk+4). The (k+4)-th stage (STGk+4) may be connected to the (k+4)-th gate line (GLk+4) through the connecting line CL.

The (k+5)-th stage (STGk+5) may be disposed below the (k+5)-th circuit row (CROWk+5) and the (k+5)-th pixel row (PROWk+5). The (k+5)-th stage (STGk+5) may supply a gate signal to the (k+5)-th gate line (GLk+5) connected to the pixel circuits PC of the (k+5)-th circuit row (CROWk+5). The (k+5)-th stage (STGk+5) may be connected to the (k+5)-th gate line (GLk+5) through the connecting line CL.

A data line DL may include first to third data lines DL1 to DL3. The first data line DL1 may supply a data voltage to a plurality of first pixel circuits PC1 disposed in the same column. The second data line DL2 may supply a data voltage to a plurality of second pixel circuits PC2 disposed in the same column. The third data line DL3 may supply a data voltage to a plurality of third pixel circuits PC3 disposed in the same column.

Figure 6:
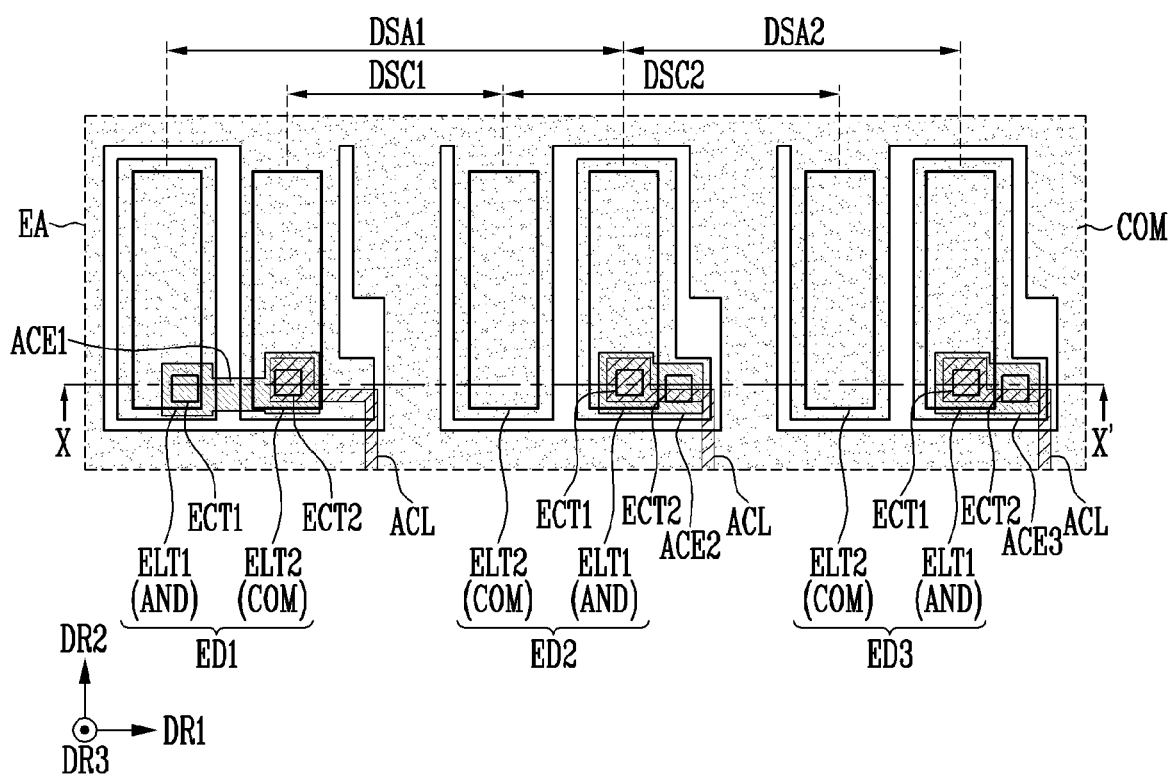
FIG. 6 illustrates a top plan view of an example of a light emitting area of FIG. 4.
Figure 7:
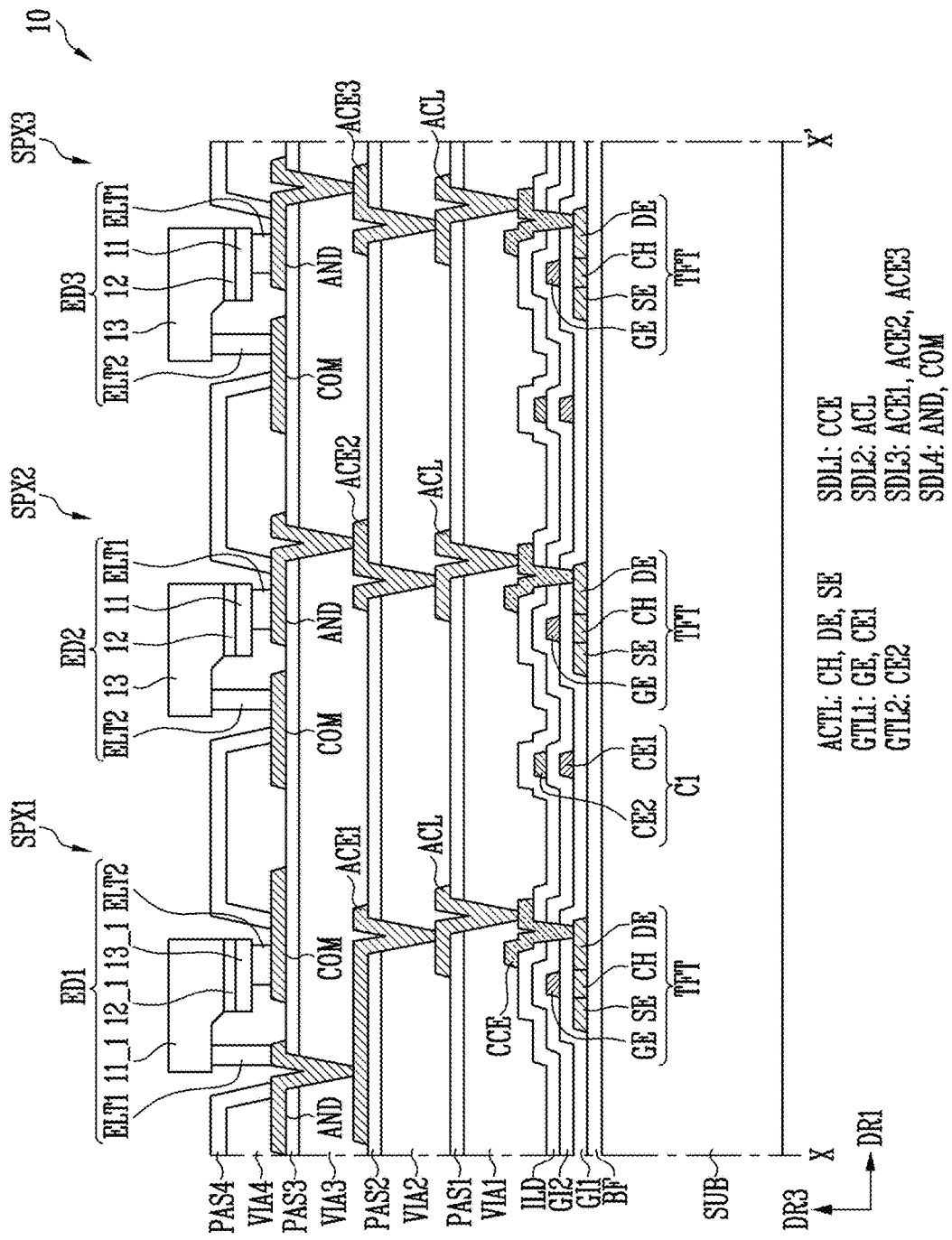
FIG. 7 illustrates a schematic cross-sectional view of an example of a display device taken along the line X-X' of FIG. 6.

FIG. 6 illustrates a top plan view of an example of a light emitting area of FIG. 4. For better understanding and ease of description, a light emitting area EA is schematically illustrated based on first and second contact electrodes ELT1 and ELT2 of the light emitting elements ED1, ED2, and ED3. FIG. 7 illustrates a schematic cross-sectional view of an example of a display device taken along the line X-X' of FIG. 6.

Referring to FIG. 1 to FIG. 7, the display device 10 may include a substrate SUB, a buffer film BF, an active layer ACTL, a first gate insulating film GI1, a first gate layer GTL1, a second gate insulating film GI2, a second gate layer GTL2, an interlayer insulating film ILD, a first source metal layer SDL1, a first via layer VIA1, a first passivation layer PAS1, a second source metal layer SDL2, a second via layer VIA2, a second passivation layer PAS2, a third source metal layer SDL3, a third via layer VIA3, a third passivation layer PAS3, a fourth source metal layer SDL4, a fourth via layer VIA4, and a fourth passivation layer PAS4.

The substrate SUB may be a base substrate or a base member for supporting the display device 10. The substrate SUB may be a rigid substrate made of a glass material. In addition, the substrate SUB may be a flexible substrate that is bendable, foldable, or rollable. In this case, the substrate SUB may include an insulating material such as a polymer resin such as polyimide PI.

The buffer film BF may be disposed on one surface of the substrate SUB. The buffer film BF may be a film for preventing penetration of air or moisture. The buffer film BF may be formed of a plurality of inorganic films that are alternately stacked. For example, the buffer film BF may be formed as a multifilm in which one or more inorganic films of a silicon nitride layer, a silicon oxynitride layer, a silicon oxide layer, a titanium oxide layer, and an aluminum oxide layer are alternately stacked. The buffer film BF may be omitted.

The active layer ACTL may be disposed on the buffer film BF. The active layer ACTL may include a silicon semiconductor such as polycrystalline silicon, single crystal silicon, low-temperature polycrystalline silicon, and amorphous silicon, or an oxide semiconductor.

The active layer ACTL may include a channel CH, a first electrode SE, and a second electrode DE of a thin film transistor TFT. The channel CH of the thin film transistor TFT may be an area overlapping the gate electrode GE of the thin film transistor TFT in a third direction DR3 that is a thickness direction of the substrate SUB. The first electrode SE of the thin film transistor TFT may be disposed at one side of the channel CH, and the second electrode DE may be disposed at the other side of the channel CH. The first electrode SE and the second electrode DE of the thin film transistor TFT may be areas that do not overlap the gate electrode GE in the third direction DR3. The first electrode SE and the second electrode DE of the thin film transistor TFT may be areas having conductivity by doping ions in a silicon semiconductor or an oxide semiconductor.

The first gate insulating film GI1 may be disposed on the active layer ACTL and the buffer layer BF. The first gate insulating film GI1 may be formed as an inorganic film, for example, a silicon nitride layer, a silicon oxynitride layer, a silicon oxide layer, a titanium oxide layer, or an aluminum oxide layer.

The first gate layer GTL1 may be disposed on the first gate insulating film GI1. The first gate layer GTL1 may include the gate electrode GE of the thin film transistor TFT and the first capacitor electrode CE1. The first gate layer GTL1 may be formed as a single layer or a multilayer that is made of one of molybdenum (Mo), aluminum (Al), chromium (Cr), gold (Au), titanium (Ti), nickel (Ni), neodymium (Nd), and copper (Cu) or an alloy thereof.

The second gate insulating film GI2 may be disposed on the first gate layer GTL1 and the first gate insulating film GI1. The second gate insulating film GI2 may be formed as an inorganic film, for example, a silicon nitride layer, a silicon oxynitride layer, a silicon oxide layer, a titanium oxide layer, or an aluminum oxide layer.

The second gate layer GTL2 may be disposed on the second gate insulating film GI2. The second gate layer GTL2 may include a second capacitor electrode CE2. The second capacitor electrode CE2 may configure the first capacitor C1 together with a first capacitor electrode CE1. The second gate layer GTL2 may be formed as a single layer or a multilayer that is made of one of molybdenum (Mo), aluminum (Al), chromium (Cr), gold (Au), titanium (Ti), nickel (Ni), neodymium (Nd), and copper (Cu) or an alloy thereof.

The interlayer insulating film ILD may be disposed on the second gate layer GTL2 and the second gate insulating film GI2. The interlayer insulating film ILD may be formed as an inorganic film, for example, a silicon nitride layer, a silicon oxynitride layer, a silicon oxide layer, a titanium oxide layer, or an aluminum oxide layer.

The first source metal layer SDL1 including a connecting electrode CCE (or a connecting pattern) may be disposed on the interlayer insulating film ILD. The first source metal layer SDL1 may be formed as a single layer or a multilayer that is made of one of molybdenum (Mo), aluminum (Al), chromium (Cr), gold (Au), titanium (Ti), nickel (Ni), neodymium (Nd), and copper (Cu) or an alloy thereof.

The connecting electrode CCE may be connected to the first electrode SE or the second electrode DE of the thin film transistor TFT through a contact hole passing through the interlayer insulating film ILD, the second gate insulating film GI2, and the first gate insulating film GI1.

The first via layer VIA1 (or a first planarization layer) for flattening a step caused by the active layer ACTL, the first gate layer GTL1, the second gate layer GTL2, and the first source metal layer SDL1 may be formed on the first source metal layer SDL1 and the interlayer insulating film ILD. The first via layer VIA1 may be formed as an organic film including an acryl resin, an epoxy resin, a phenolic resin, a polyamide resin, a polyimide resin, and the like.

The first passivation layer PAS1 (or a first insulating film) may be disposed on the first via layer VIA1. The first passivation layer PAS1 may be formed as an inorganic film, for example, a silicon nitride layer, a silicon oxynitride layer, a silicon oxide layer, a titanium oxide layer, or an aluminum oxide layer.

The second source metal layer SDL2 may be disposed on the first passivation layer PAS1. The second source metal layer SDL2 may include an anode connecting line ACL. The anode connecting line ACL may be connected to the connecting electrode CCE through a contact hole passing through the first passivation layer PAS1 and the first via layer VIA1. The second source metal layer SDL2 may be formed as a single layer or a multilayer that is made of one of molybdenum (Mo), aluminum (Al), chromium (Cr), gold (Au), titanium (Ti), nickel (Ni), neodymium (Nd), and copper (Cu) or an alloy thereof.

As shown in FIG. 4 and FIG. 6, the anode connecting line ACL may extend from the pixel circuits PC1, PC2, and PC3 in the second direction DR2. The anode connecting lines ACL of the sub-pixels SPX1, SPX2, and SPX3 may have substantially the same shape and the same disposition.

In one or more embodiments, the first via layer VIA1 and the first passivation layer PAS1 may be omitted. In this case, the connecting electrode CCE may be included in the anode connecting line ACL, or it may be omitted. For example, the anode connecting line ACL may also be connected to the first electrode SE or the second electrode DE of the thin film transistor TFT through a contact hole passing through the interlayer insulating film ILD, the second gate insulating film GI2, and the first gate insulating layer GI1.

The second via layer VIA2 for flattening a step may be disposed on the second source metal layer SDL2 and the first passivation layer PAS1. The second via layer VIA2 may be formed as an organic film including an acryl resin, an epoxy resin, a phenolic resin, a polyamide resin, a polyimide resin, and the like.

The second passivation layer PAS2 (or a second insulating film) may be disposed on the second via layer VIA2. The second passivation layer PAS2 may be formed as an inorganic film, for example, a silicon nitride layer, a silicon oxynitride layer, a silicon oxide layer, a titanium oxide layer, or an aluminum oxide layer.

The third source metal layer SDL3 may be formed on the second passivation layer PAS2. The third source metal layer SDL3 may include anode connecting electrodes ACE1, ACE2, and ACE3 (or bridge electrodes or bridge patterns). Each of the anode connecting electrodes ACE1, ACE2, and ACE3 may be connected to the anode connecting line ACL through a contact hole passing through the second passivation layer PAS2 and the second via layer VIA2. The third source metal layer SDL3 may be formed as a single layer or a multilayer that is made of one of molybdenum (Mo), aluminum (Al), chromium (Cr), gold (Au), titanium (Ti), nickel (Ni), neodymium (Nd), and copper (Cu) or an alloy thereof.

The first anode connecting electrode ACE1 may have a shape different from that of the second and third connecting electrodes ACE2 and ACE3. The second and third connecting electrodes ACE2 and ACE3 may have the same shape and the same disposition. Compared with the second and third connecting electrodes ACE2 and ACE3, the first anode connecting electrode ACE1 may further extend in the first direction DR1. The first anode connecting electrode ACE1 may extend from a pixel electrode AND (or first pixel electrode) to a common electrode COM (or second pixel electrode) (that is, from the pixel electrode AND to the common electrode COM adjacent thereto in the first direction DR1), and the first anode connecting electrode ACE1 may overlap the pixel electrode AND and the common electrode COM in the third direction DR3. The second and third connecting electrodes ACE2 and ACE3 may overlap the pixel electrode AND in the third direction DR3, and may not overlap the common electrode COM.

The third via layer VIA3 for flattening a step may be formed on the third source metal layer SDL3 and the second passivation layer PAS2. The third via layer VIA3 may be formed as an organic film including an acryl resin, an epoxy resin, a phenolic resin, a polyamide resin, a polyimide resin, and the like.

The third passivation layer PAS3 may be disposed on the third via layer VIA3. The third passivation layer PAS3 may be formed as an inorganic film, for example, a silicon nitride layer, a silicon oxynitride layer, a silicon oxide layer, a titanium oxide layer, or an aluminum oxide layer.

The pixel electrode AND (or a first pixel electrode) and the common electrode COM (or a second pixel electrode) may be disposed on the third passivation layer PAS3. The pixel electrode AND may be referred to as an anode electrode, and the common electrode COM may be referred to as a cathode electrode.

The pixel electrode AND may be connected to a corresponding one of the anode connecting electrodes ACE1, ACE2, and ACE3 through a contact hole passing through the third passivation layer PAS3 and the third via layer VIA3. Through this, the pixel electrode AND may be electrically connected to the first electrode SE or the second electrode DE of the thin film transistor TFT. Accordingly, a pixel voltage or an anode voltage controlled by the thin film transistor TFT may be applied to the pixel electrode AND.

Similar to the pixel electrode AND, the common electrode COM may be connected to a power line (for example, a third power line VSL, see FIG. 11) through a contact hole passing through the third passivation layer PAS3 and the third via layer VIA3. Through this, a power voltage of the power line may be applied to the common electrode COM.

The pixel electrode AND and the common electrode COM may include a highly reflective metallic material such as a stacked structure (Ti/Al/Ti) of aluminum and titanium, a stacked structure (ITO/Al/ITO) of aluminum and an ITO, an APC alloy, and a stacked structure (ITO/APC/ITO) of an APC alloy and an ITO. The APC alloy is an alloy of silver (Ag), palladium (Pd), and copper (Cu).

The pixel electrode AND and the common electrode COM may be arranged along the first direction DR1.

In one or more embodiments, an electrode arrangement or an electrode arrangement order (that is, an order in which the pixel electrode AND and the common electrode COM are arranged) of one of the sub-pixels SPX1, SPX2, and SPX3 may be different from an electrode arrangement of another one of the sub-pixels SPX1, SPX2, and SPX3.

As shown in FIG. 6 and FIG. 7, the pixel electrode AND of the first sub-pixel SPX1 may be positioned in an opposite direction of the first direction DR1 from the common electrode COM of the first sub-pixel SPX1. Here, the common electrode COM may refer to a portion of the common electrode COM that contacts or overlaps the light emitting element (for example, the first light emitting element ED1 of the first sub-pixel SPX1). The pixel electrode AND of the second sub-pixel SPX2 may be positioned in the first direction DR1 from the common electrode COM of the second sub-pixel SPX2. The pixel electrode AND of the third sub-pixel SPX3 may be positioned in the first direction DR1 from the common electrode COM of the third sub-pixel SPX3. That is, the pixel electrode AND and the common electrode COM of the first sub-pixel SPX1, the common electrode COM and the pixel electrode AND of the second sub-pixel SPX2, and the common electrode COM and the pixel electrode AND of the third sub-pixel SPX3 may be sequentially disposed along the first direction DR1.

Accordingly, even though the sub-pixels SPX1, SPX2, and SPX3 are disposed at equal distances within one light emitting area EA, a first distance DSA1 between the pixel electrode AND of the first sub-pixel SPX1 and the pixel electrode AND of the second sub-pixel SPX2 may be different from a second distance DSA2 between the pixel electrode AND of the second sub-pixel SPX2 and the pixel electrode AND of the third sub-pixel SPX3. Here, the first distance DSA1 and the second distance DSA2 may be calculated based on an area center of the pixel electrode AND, but is not limited thereto. For example, the first distance DSA1 and the second distance DSA2 may be calculated based on the corresponding side of the pixel electrode AND. Similarly, a first distance DSC1 between the common electrode COM of the first sub-pixel SPX1 and the common electrode COM of the second sub-pixel SPX2 may be different from a second distance DSC2 between the common electrode COM of the second sub-pixel SPX2 and the common electrode COM of the third sub-pixel SPX3.

The first distance DSC1 between the common electrode COM of the first sub-pixel SPX1 and the common electrode COM of the second sub-pixel SPX2 may be different from the first distance DSA1 between the pixel electrode AND of the first sub-pixel SPX1 and the pixel electrode AND of the second sub-pixel SPX2. In contrast, the second distance DSC2 between the common electrode COM of the second sub-pixel SPX2 and the common electrode COM of the third sub-pixel SPX3 may be the same as the second distance DSA2 between the pixel electrode AND of the second sub-pixel SPX2 and the pixel electrode AND of the third sub-pixel SPX3.

The fourth via layer VIA4 (or a bank or a pixel defining layer) covering an edge of the pixel electrode AND and an edge of the common electrode COM may be disposed on the third passivation layer PAS3. The fourth via layer VIA4 may be formed as an organic film including an acryl resin, an epoxy resin, a phenolic resin, a polyamide resin, a polyimide resin, and the like.

The fourth passivation layer PAS4 may be disposed on the fourth via layer VIA4. The fourth passivation layer PAS4 may cover the edge of the pixel electrode AND and the edge of the common electrode COM. The fourth passivation layer PAS4 may be formed as an inorganic film, for example, a silicon nitride layer, a silicon oxynitride layer, a silicon oxide layer, a titanium oxide layer, or an aluminum oxide layer.

The light emitting elements ED1, ED2, and ED3 may be disposed on the pixel electrode AND and the common electrode COM that are not covered by the fourth passivation layer PAS4.

FIG. 7 illustrates that each of the light emitting elements ED1, ED2, and ED3 is a flip-chip type of micro LED in which the first contact electrode ELT1 and the second contact electrode ELT2 are disposed to face the pixel electrode AND and the common electrode COM. The light emitting elements ED1, ED2, and ED3 may be made of an inorganic material such as GaN. A length in the first direction DR1, a length in the second direction DR2, and a length in the third direction DR3 of each of the light emitting elements ED1, ED2, and ED3 may be several to several hundred μm, respectively. For example, the length in the first direction DR1, the length in the second direction DR2, and the length in the third direction DR3 of each of the light emitting elements ED1, ED2, and ED3 may be about 100 μm or less, respectively.

The light emitting elements ED1, ED2, and ED3 may be formed by growing on a semiconductor substrate such as a silicon wafer. Each of the light emitting elements ED1, ED2, and ED3 may be directly transferred onto the pixel electrode AND and the common electrode COM of the substrate SUB from the silicon wafer.

Alternatively, each of the light emitting elements ED1, ED2, and ED3 may be transferred on the pixel electrode AND and the common electrode COM of the substrate SUB through an electrostatic method using an electrostatic head or a stamp method using an elastic polymer material such as PDMS or silicon as a transfer substrate.

Each of the light emitting elements ED1, ED2, and ED3 may be a light emitting structure including a first semiconductor layer 11 or 11_1 (or a first semiconductor), an active layer 12 or 12_1, a second semiconductor layer 13 or 13_1 (or a second semiconductor), the first contact electrode ELT1, and the second contact electrode ELT2. In one or more embodiments, the light emitting elements ED1, ED2, and ED3 may further include a base substrate (refer to "SSUB" in FIG. 28) positioned at an uppermost portion thereof. The base substrate may be a sapphire substrate, but is not limited thereto.

The first semiconductor layers 11 and 11_1 may be disposed on one surfaces of the active layers 12 and 12_1. The first semiconductor layers 11 and 11_1 may be made of GaN doped with a P-type conductive dopant such as Mg, Zn, Ca, Se, or Ba.

The active layers 12 and 12_1 may be disposed on portions of one surfaces of the first semiconductor layers 11 and 11_1. The active layers 12 and 12_1 may include a material having a single or multiple quantum well structure. When the active layers 12 and 12_1 include a material having a multi-quantum well structure, it may have a structure in which a plurality of well layers and barrier layers are alternately stacked. In this case, the well layer may be formed of InGaN, and the barrier layer may be formed of GaN or AlGaN, but are not limited thereto. Alternatively, the active layer layers 12 and 12_1 12 may have a structure in which a semiconductor material having large band gap energy and a semiconductor material having small band gap energy are alternately stacked, or may include Group III to Group V semiconductor materials depending on a wavelength band of light that emits light.

When the active layers 12 and 12_1 include InGaN, a color of emitted light may vary depending on a content of indium (In). For example, as the content of indium (In) increases, the wavelength band of the light emitted by the active layers 12 and 12_1 may move to the red wavelength band, and as the content of indium (In) decreases, the wavelength band of the light emitted thereby may move to the blue wavelength band. For example, the content of indium (In) in the active layer 12 of the third light emitting element ED3 of the third sub-pixel SPX3 is about 15%, the content of indium (In) in the active layer 12 of the second light emitting element ED2 of the second sub-pixel SPX2 is about 25%, and the content of indium (In) in the active layer 12_1 of the first light emitting element ED1 of the first sub-pixel SPX1 may be 35% or more. That is, by adjusting the content of indium (In) in the active layer 12 or 12_1, the light emitting element ED1 of the first pixel SPX1 may emit light of a first color (for example, a red color), the light emitting element ED2 of the second pixel SP2 may emit light of a second color (for example, a green color), and the light emitting element ED3 of a third pixel SP3 may emit light of a third color (for example, a blue color).

The second semiconductor layers 13 and 13_1 may be disposed on the other surfaces of the active layers 12 and 12_1. For example, the second semiconductor layer 13 and 13_1 1 may be made of GaN doped with an N-type conductive dopant such as Si, Ge, or Sn.

The first contact electrode ELT1 may be disposed on one surfaces of the first semiconductor layers 11 and 11_1, and the second contact electrode ELT2 may be disposed on one surfaces of the second semiconductor layers 13 and 13_1.

The first contact electrode ELT1 and the pixel electrode AND may be bonded to each other through a conductive adhesive member such as an anisotropic conductive film (ACF) or an anisotropic conductive paste (ACP). Alternatively, the first contact electrode ELT1 and the pixel electrode AND may be bonded to each other through a soldering process.

In one or more embodiments, for the flip chip type, each of the light emitting elements ED1, ED2, and ED3 may have a mesa structure. For example, each of the light emitting elements ED1, ED2, and ED3 may have a mesa area in which the other thereof is partially exposed by one of the first semiconductor layers 11 and 11_1 and the second semiconductor layers 13 and 13_1. For example, in the first light emitting element ED1, the second semiconductor layer 13_1 may have a protruding shape on one surface of the first semiconductor layer 11_1, and one surface of the first semiconductor layer 11_1 may be partially exposed by the second semiconductor layer 13_1. The first contact electrode ELT1 of the first light emitting element ED1 may be disposed on the exposed surface of the first semiconductor layer 11_1, that is, in the mesa area. For example, in the second and third light emitting elements ED2 and ED3, the first semiconductor layer 11 may have a protruding shape on one surface of the second semiconductor layer 13, and one surface of the second semiconductor layer 13 may be partially exposed by the first semiconductor layer 11. The second contact electrode ELT2 of the second and third light emitting elements ED2 and ED3 may be disposed on the exposed surface of the second semiconductor layer 13, that is, in the mesa area.

For reference, the second and third light emitting elements ED2 and ED3 may be manufactured by growing the active layer 12 and the first semiconductor layer 11 on the second semiconductor layer 13. Alternatively, the first light emitting element ED1 may be manufactured by growing the active layer 12_1 and the second semiconductor layer 13_1 on the first semiconductor layer 11_1 to satisfy the content of indium (In) of the active layer 12_1. Accordingly, the first to third light emitting elements ED1 to ED3 have the same shape, but the disposition of the first and second contact electrodes ELT1 and ELT2 of the first light emitting element ED1 may be different from (for example, may be opposite to) the disposition of the first and second contact electrodes ELT1 and ELT2 of the second and third light emitting elements ED2 and ED3.

By swapping the pixel electrode AND and common electrode COM of the first sub-pixel SPX1, that is, by designing the arrangement order of the pixel electrode AND and the common electrode COM of the first sub-pixel SPX1 and the arrangement of the pixel electrode AND and the common electrode COM of the second and third sub-pixels SPX2 and SPX3 to be opposite to each other, the light emitting elements ED1, ED2, and ED3 may be substantially arranged along the same direction and/or have substantially the same shape. For example, depending on the mesa structure, an inclined surface is formed at an edge of the mesa area of each of the first to third light emitting elements ED1 to ED3, and the inclined surface of each of the first to third light emitting elements ED1 to ED3 may be directed to a substantially equivalent direction (for example, the first direction DR1). In this case, the light emitting direction (or the light emitting characteristic for each direction) of the light emitting elements ED1, ED2, and ED3 becomes uniform, and the color mix according to the viewing angle may be alleviated or prevented.

Figure 8:
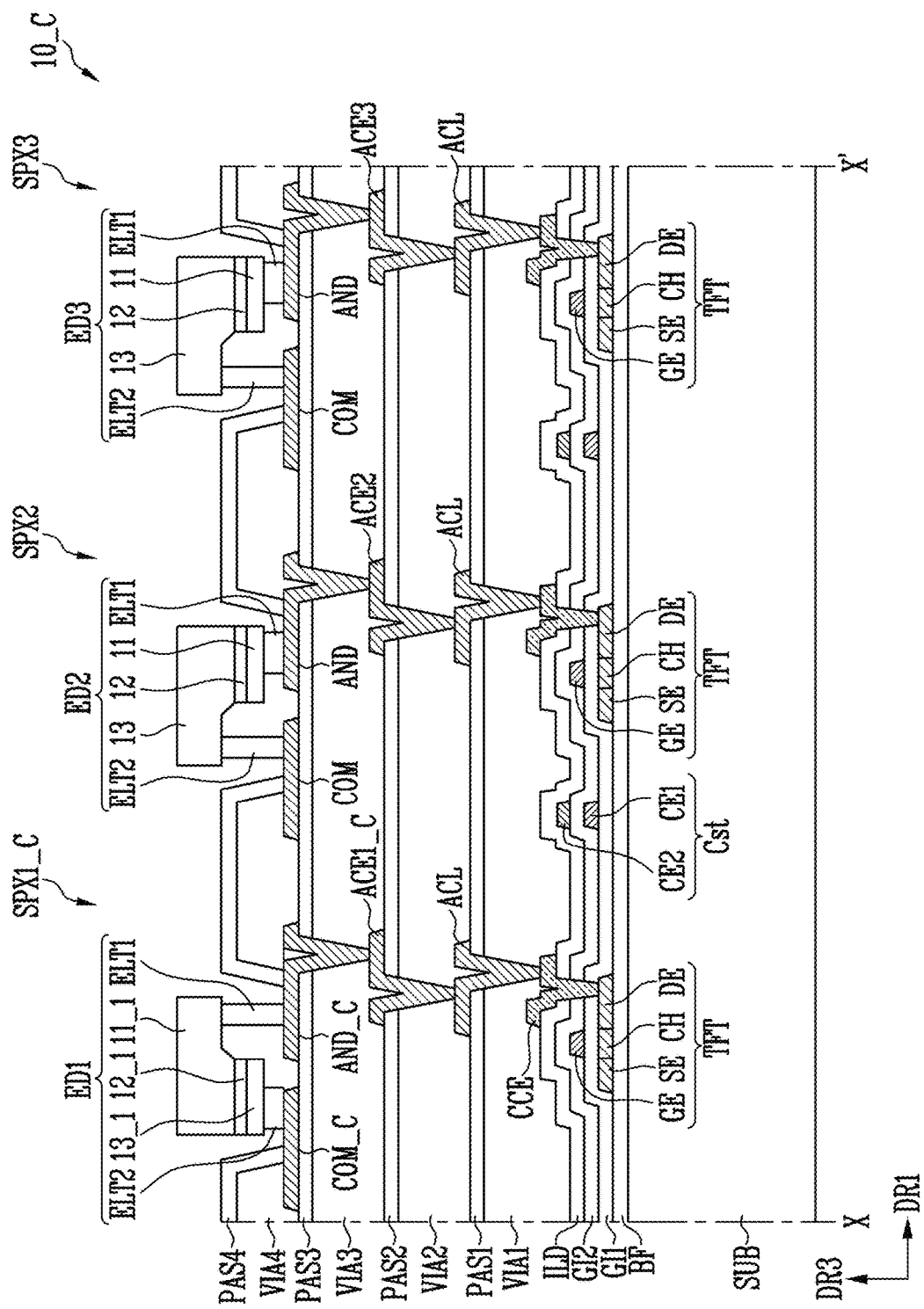
FIG. 8 illustrates a schematic cross-sectional view of an example of a display device according to a comparative embodiment.

FIG. 8 illustrates a schematic cross-sectional view of an example of a display device according to a comparative embodiment.

Referring to FIG. 1, FIG. 4, and FIG. 6 to FIG. 8, a display device 10_C according to a comparative embodiment may include a first sub-pixel SPX1_C, a second sub-pixel SPX2, and a third sub-pixel SPX3. The second sub-pixel SPX2 and the third sub-pixel SPX3 have been described with reference to FIG. 6 and FIG. 7, and because the first sub-pixel SPX1_C is similar to the first sub-pixel SPX1 of FIG. 6, a duplicate description thereof will not be repeated.

Except for the light emitting elements ED1, ED2, and ED3, the first sub-pixel SPX1_C, the second sub-pixel SPX2, and the third sub-pixel SPX3 may have the same structure. For example, a first anode connecting electrode ACE1_C of the first sub-pixel SPX1_C may have the same shape and disposition as the second and third anode connecting electrodes ACE2 and ACE3. In addition, the arrangement order of a pixel electrode AND_C and a common electrode COM_C of the first sub-pixel SPX1_C may be the same as the arrangement order of the pixel electrode AND and the common electrode COM of the second and third sub-pixels SPX2 and SPX3.

In this case, in order to contact the pixel electrode AND_C and the common electrode COM_C, the first light emitting element ED1 may be arranged in a direction different from that of the second and third light emitting elements ED2 and ED3. Although the first, second, and third light emitting elements ED1, ED2, and ED3 have the same current movement direction (for example, a direction opposite to the first direction DR1), the directions to which the inclined surfaces of the first to third light emitting elements ED1 to ED3 are directed may be different from each other.

Light emitted from the inclined surface of each of the first to third light emitting elements ED1 to ED3 (that is, the inclined surface formed at the edge of the mesa area) may be interrupted by the contact electrodes ELT1 and ELT2 (and/or a bonding material), and accordingly, the light emission rates of the first to third light emitting elements ED1 to ED3 may vary according to directions. For example, the light emission rate of the first light emitting element ED1 in the first direction DR1 (for example, the right side based on FIG. 8) may be lower than that of the first light emitting element ED1 in the opposite direction of the first direction DR1 (for example, the left side based on FIG. 8). Alternatively, the light emission rates of the second and third light emitting elements ED2 and ED3 in the first direction DR1 may be higher than the light emission rates of the second and third light emitting elements ED2 and ED3 in the opposite direction of the first direction DR1. Accordingly, the color mix may occur depending on the viewing angle. For example, when the display device 10_C is viewed from the left side, because the light of the first color (for example, red color) emitted from the first light emitting element ED1 is relatively large, an image may be viewed in redish color. As another example, when the display device 10_C is viewed from the right side, because the light of the second and third colors emitted from the second and third light emitting elements ED2 and ED3 is relatively large, an image may be viewed in bluish (or cyanish) color.

Accordingly, the display device 10 according to one or more embodiments of the present disclosure, by swapping the pixel electrode AND and the common electrode COM of the first sub-pixel SPX1, includes the light emitting elements ED1, ED2, and ED3 arranged in a substantially equivalent direction, and it is possible to prevent color mixing according to the viewing angle.

Figure 9:
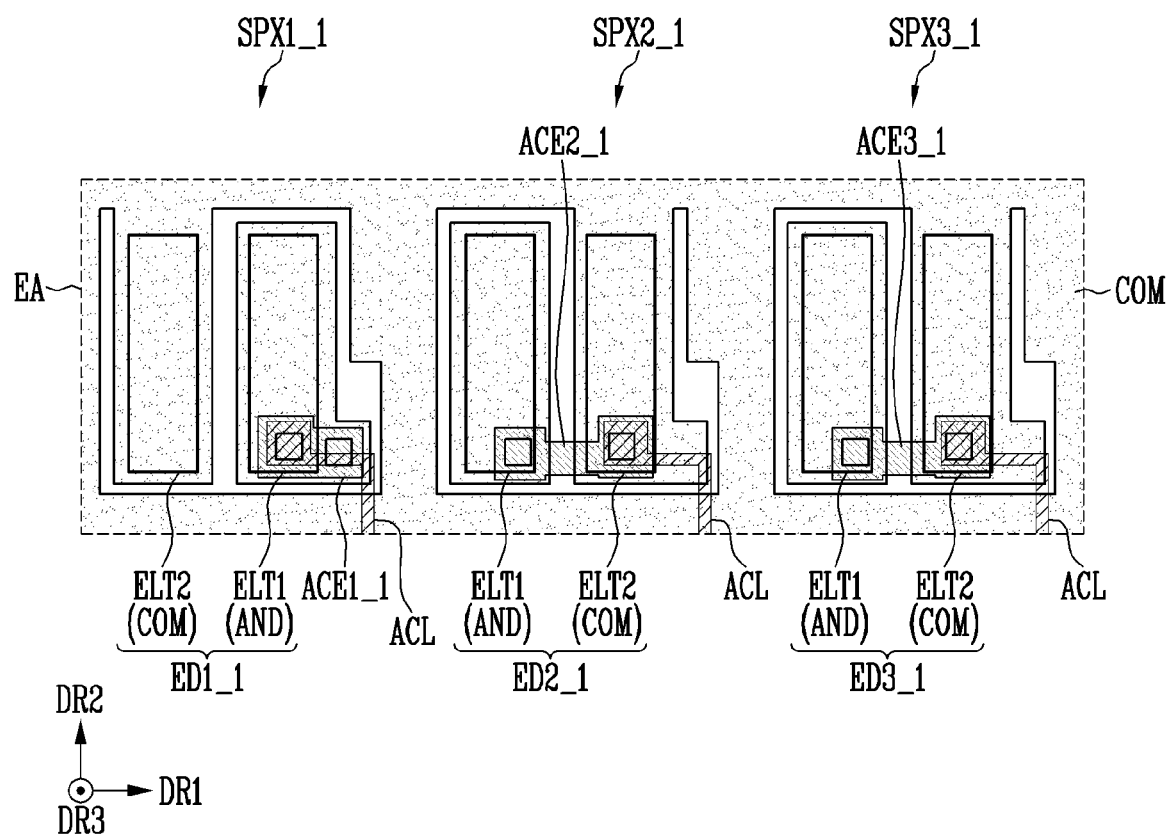
FIG. 9 and FIG. 10 illustrate top plan views of an example of a light emitting area of FIG. 4.
Figure 10:
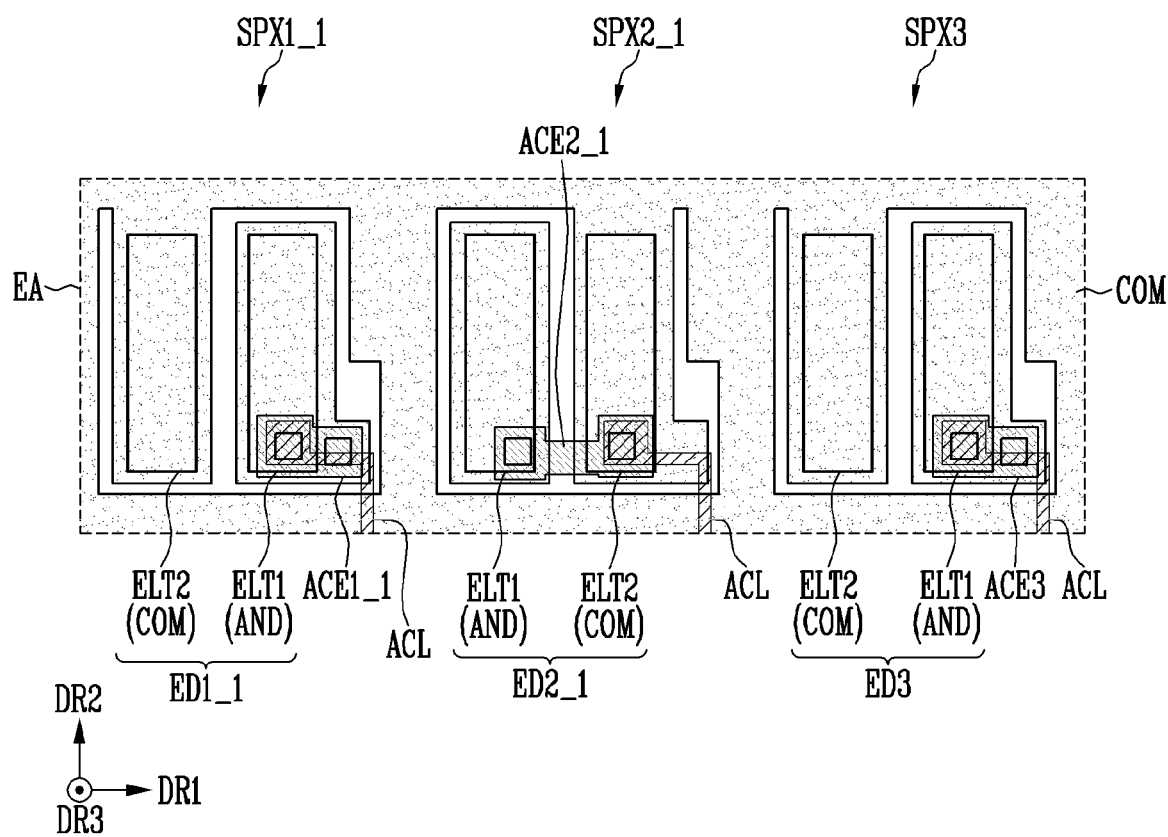

FIG. 9 and FIG. 10 illustrate top plan views of another example of a light emitting area of FIG. 4.

First, referring to FIG. 1 to FIG. 4, FIG. 6, and FIG. 9, the electrode arrangement order of the first sub-pixel SPX1_1 (that is, the arrangement order of the pixel electrode AND and the common electrode COM) may be different from the electrode arrangement order of the second and third sub-pixels SPX2_1 and SPX3_1.

Based on the pixel electrode AND being positioned in the first direction DR1 from the common electrode COM, in FIG. 6, the pixel electrode AND and the common electrode COM of the first sub-pixel SPX1 may be swapped, and in FIG. 9, instead of the first sub-pixel SPX1_1, the pixel electrode AND and the common electrode COM of the second and third sub-pixels SPX2_1 and SPX3_1 may be swapped.

For this, each of a second anode connecting electrode ACE2_1 of the second sub-pixel SPX2_1 and a third anode connecting electrode ACE3_1 of the third sub-pixel SPX3_1 may extend further in the first direction DR1 than a first anode connecting electrode ACE1_1 of the first sub-pixel SPX1_1. Each of the second and third anode connecting electrodes ACE2_1 and ACE3_1 may extend from the pixel electrode AND to the common electrode COM (that is, from the pixel electrode AND to the common electrode COM adjacent thereto in the first direction DR1), and each of the second and third anode connecting electrodes ACE2_1 and ACE3_1 may overlap the pixel electrode AND and the common electrode COM in the third direction DR3. The first anode connecting electrode ACE1_1 may overlap the pixel electrode AND in the third direction DR3, and may not overlap the common electrode COM.

In this case, the light emitting elements ED1_1, ED2_1, and ED3_1 may be aligned in the same direction to each other, and may be aligned in a direction opposite to the direction in which the light emitting elements ED1, ED2, and ED2 shown in FIG. 7 are aligned. For example, the inclined surface of each of the light emitting elements ED1_1, ED2_1, and ED3_1 (that is, the inclined surface due to the mesa structure) may be substantially directed to an opposite direction of the first direction DR1.

Referring to FIG. 6 and FIG. 10, the electrode arrangement order of the second sub-pixel SPX2_1 (that is, the arrangement order of the pixel electrode AND and the common electrode COM) may be different from the electrode arrangement order of the first and third sub-pixels SPX1_1 and SPX3_1.

Based on the pixel electrode AND being positioned in the first direction DR1 from the common electrode COM, instead of the first sub-pixel SPX1_1, the pixel electrode AND and the common electrode COM of the second sub-pixel SPX2_1 may be swapped. The first sub-pixel SPX1_1 (and the first anode connecting electrode ACE1_1) and the second sub-pixel SPX2_1 (and the second anode connecting electrode ACE1_2) have been described with reference to FIG. 9, so a duplicate description thereof will not be repeated.

For example, the second light emitting element ED2_1 of the second sub-pixel SPX2_1 emits red light, or when the structure of the second light emitting element ED2_1 is opposite to that of the first and third light emitting elements ED1_1 and ED3, the pixel electrode AND and the common electrode COM of the second sub-pixel SPX2_1 may be swapped.

However, the present disclosure is not limited thereto. When the structure of the light emitting element of at least one of the sub-pixels SPX1_1, SPX2_1, and SPX3 is different from the structure of the other light emitting elements, the electrode arrangement order of the sub-pixels SPX1_1, SPX2_1, and SPX3 may be different from the electrode arrangement order of the remaining sub-pixels from among the sub-pixels SPX1_1, SPX2_1, and SPX3. For example, only the electrode arrangement order of the third sub-pixel SPX3 may be different from the electrode arrangement order of the first and second sub-pixels SPX1_1 and SPX2_1.

Figure 11:
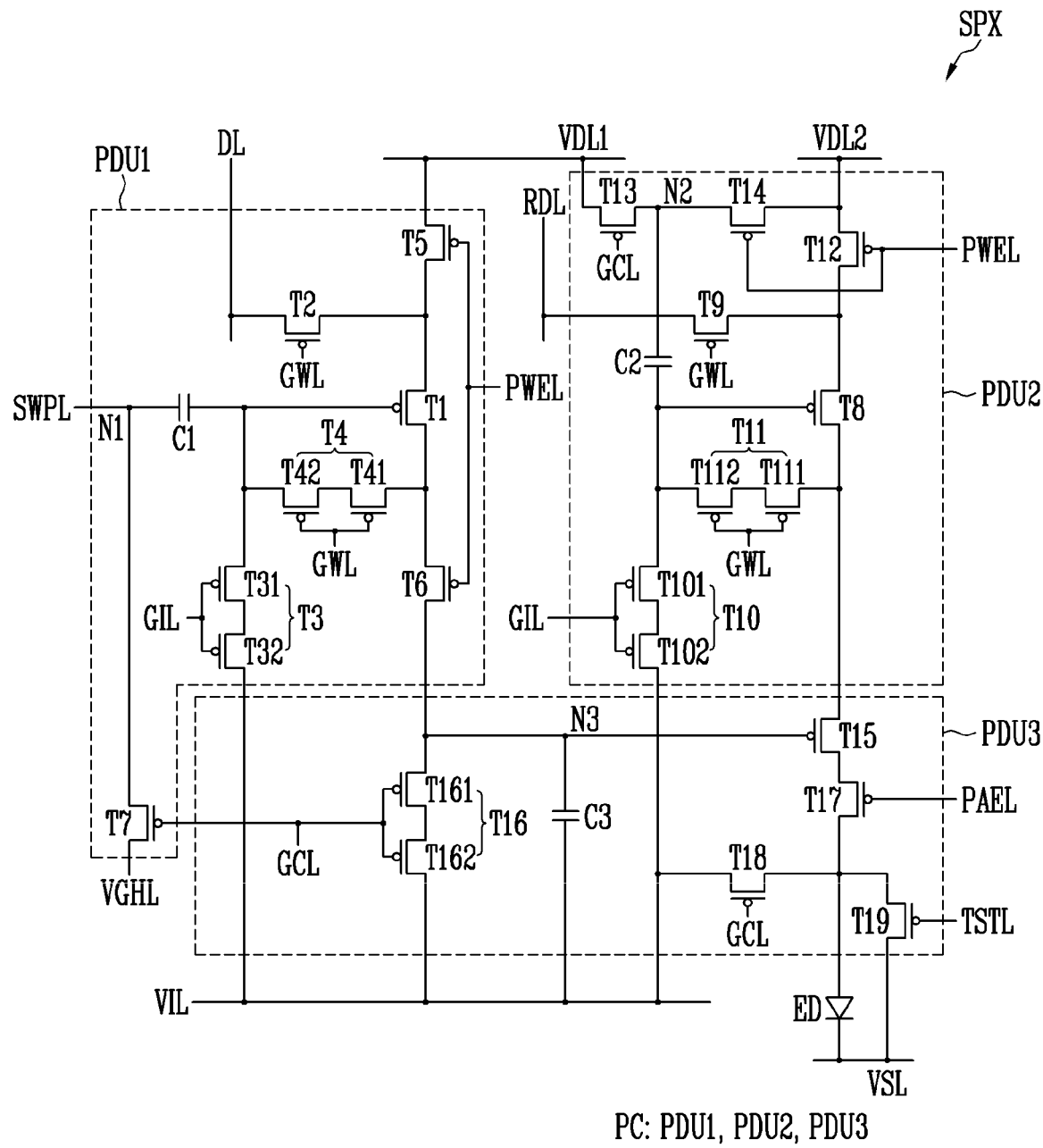
FIG. 11 illustrates a circuit diagram of an example of a sub-pixel of FIG. 2 to FIG. 4.

FIG. 11 illustrates a circuit diagram of an example of a sub-pixel of FIG. 2 to FIG. 4.

Referring to FIGS. 1 to 4 and FIG. 11, the pixel circuits of the sub-pixels SPX1, SPX2, and SPX3 may be substantially the same or similar to each other. A sub-pixel SPX may correspond to each of the sub-pixels SPX1, SPX2, and SPX3.

The sub-pixel SPX may include a light emitting element ED and a pixel circuit PC that provides a driving current to the light emitting element ED.

The pixel circuit PC may be connected to a scan writing line GWL, a scan initializing line GIL, a scan controlling line GCL, a sweep line SWPL, a pulse width modulation (PWM) light emitting line PWEL, a pulse amplified modulation (PAM) light emitting line PAEL, a data line DL, and a PAM data line RDL. The scan writing line GWL, the scan initializing line GIL, the scan controlling line GCL, the sweep line SWPL, the PWM light emitting line PWEL, and the PAM light emitting line PAEL may be included in a scan line. The data line DL and the PAM data line RDL may correspond to the gate line described with reference to FIG. 5, or may be included in the gate line. The pixel circuit PC may be connected to a first power line VDL1 to which a first power voltage is applied, a second power line VDL2 to which a second power voltage is applied, and a third power line VSL to which a third power voltage is applied, an initializing voltage line VIL to which an initializing voltage is applied, and a gate-off voltage line VGHL to which a gate-off voltage is applied.

The pixel circuit PC may include a first pixel driver PDU1 (or first sub-circuit), a second pixel driver PDU2 (or second sub-circuit), and a third pixel driver PDU3 (or third sub-circuit).

The light emitting element ED may emit light according to a driving current generated by the second pixel driver PDU2. The light emitting element ED may be disposed between a seventeenth transistor T17 and the third power line VSL. A first electrode of the light emitting element ED may be connected to a second electrode of the seventeenth transistor T17, and a second electrode of the light emitting element ED may be connected to the third power line VSL. Here, the first electrode of the light emitting element ED may be an anode electrode, and the second electrode may be a cathode electrode. The light emitting element ED may be an inorganic light emitting element including the first electrode, the second electrode, and an inorganic semiconductor disposed between the first electrode and the second electrode. For example, the light emitting element ED may be a micro LED made of an inorganic semiconductor, but is not limited thereto.

The first pixel driver PDU1 may generate a control current based on a data voltage of the data line DL to control a voltage of a third node N3 of the third pixel driver PDU3. The control current of the first pixel driver PDU1 may adjust a pulse width of a voltage applied to the first electrode of the light emitting element ED, and the first pixel driver PDU1 may perform pulse width modulation of the voltage applied to the first electrode of the light emitting element ED. Accordingly, the first pixel driver PDU1 may be a pulse width modulator (that is, a PWM portion).

The first pixel driver PDU1 may include first to seventh transistors T1 to T7 and a first capacitor C1.

The first transistor T1 may control a control current flowing between the first power line VDL1 and the third node N3 based on a voltage (e.g., a data voltage) applied to a gate electrode thereof.

The second transistor T2 may be turned on by a scan writing signal of the scan writing line GWL to supply a data voltage of the data line DL to a first electrode of the first transistor Ti. A gate electrode of the second transistor T2 may be connected to the scan writing line GWL, a first electrode thereof may be connected to the data line DL, and a second electrode thereof may be connected to the first electrode of the first transistor T1.

The third transistor T3 (e.g., T31, T32) may be turned on by the scan initializing signal of the scan initializing line GIL to electrically connect the initializing voltage line VIL to the gate electrode of the first transistor T1. During a period in which the third transistor T3 is turned on, the gate electrode of the first transistor T1 may be discharged to the initializing voltage of the initializing voltage line VIL. A gate-on voltage of the scan initializing signal may be different from the initializing voltage of the initializing voltage line VIL. Because a difference voltage between the gate-on voltage and the initializing voltage is larger than a threshold voltage of the third transistor T3, even after the initializing voltage is applied to the gate electrode of the first transistor T1, the third transistor T3 may be stably turned on. Accordingly, when the third transistor T3 is turned on, the gate electrode of the first transistor T1 may stably receive the initializing voltage regardless of the threshold voltage of the third transistor T3.

The third transistor T3 may include a plurality of transistors connected in series. For example, the third transistor T3 may include a first sub-transistor T31 and a second sub-transistor T32. The first and second sub-transistors T31 and T32 may prevent the voltage of the gate electrode of the first transistor T1 from leaking through the third transistor T3. A gate electrode of the first sub-transistor T31 may be connected to the scan initializing line GIL, a first electrode thereof may be connected to the gate electrode of the first transistor T1, and a second electrode thereof may be connected to the first electrode of the second sub-transistor T32. A gate electrode of the second sub-transistor T32 may be connected to the scan initializing line GIL, a first electrode thereof may be connected to the second electrode of the first sub-transistor T31, and a second electrode thereof may be connected to the initializing voltage line VIL.

The fourth transistor T4 may be turned on by the scan writing signal of the scan writing line GWL to electrically connect the gate electrode of the first transistor T1 and the second electrode of the first transistor T1. Accordingly, during a period in which the fourth transistor T4 is turned on, the first transistor T1 may operate as a diode (e.g., the first transistor T1 may be diode-connected).

The fourth transistor T4 may include a plurality of transistors connected in series. For example, the fourth transistor T4 may include a third sub-transistor T41 and a fourth sub-transistor T42. The third and fourth sub-transistors T41 and T42 may prevent the voltage of the gate electrode of the first transistor T1 from leaking through the fourth transistor T4. A gate electrode of the third sub-transistor T41 may be connected to the scan writing line GWL, a first electrode thereof may be connected to the second electrode of the first transistor T1, and a second electrode thereof may be connected to a first electrode of the fourth sub-transistor T42. A gate electrode of the fourth sub-transistor T42 may be connected to the scan writing line GWL, a first electrode thereof may be connected to the second electrode of the third sub-transistor T41, and a second electrode thereof may be connected to the gate electrode of the first transistor T1.

The fifth transistor T5 is turned on by the PWM light emitting signal of the PWM light emitting line PWEL to electrically connect the first power line VDL1 to the first electrode of the first transistor T1. A gate electrode of the fifth transistor T5 may be connected to the PWM light emitting line PWEL, a first electrode thereof may be connected to the first power line VDL1, and a second electrode thereof may be connected to the first electrode of the first transistor T1.

The sixth transistor T6 may be turned on by the PWM light emitting signal of the PWM light emitting line PWEL to electrically connect the second electrode of the first transistor T1 to the third node N3 of the third pixel driver PDU3. A gate electrode of the sixth transistor T6 may be connected to the PWM light emitting line PWEL, a first electrode thereof may be connected to the second electrode of the first transistor T1, and a second electrode thereof may be connected to the third node N3 of the third pixel driver PDU3.

The seventh transistor T7 may be turned on by the scan controlling signal of the scan controlling line GCL to supply the gate-off voltage of the gate-off voltage line VGHL to a first node N1 connected to the sweep line SWPL. Accordingly, during the period in which the initializing voltage is applied to the gate electrode of the first transistor T1 and the period in which the data voltage of the data line DL and the threshold voltage Vth1 of the first transistor T1 are programmed, it is possible to prevent the voltage change of the gate electrode of the first transistor T1 from being reflected in the sweep signal of the sweep line SWPL by the first capacitor C1. A gate electrode of the seventh transistor T7 may be connected to the scan controlling line GCL, a first electrode thereof may be connected to the gate-off voltage line VGHL, and a second electrode thereof may be connected to the first node N1.

The first capacitor C1 may be disposed between the gate electrode of the first transistor T1 and the first node N1. One electrode of the first capacitor C1 may be connected to the gate electrode of the first transistor T1, and the other electrode thereof may be connected to the first node N1.

The second pixel driver PDU2 may generate a driving current supplied to the light emitting element ED based on the PAM data voltage of the PAM data line RDL. The second pixel driver PDU2 may be a pulse amplitude modulator (that is, a PAM portion) that performs pulse amplitude modulation. The second pixel driver PDU2 may be a constant current generator that receives the same PAM data voltage to generate the same driving current regardless of the luminance of the sub-pixels SPX1, SPX2, and SPX3.

The second pixel driver PDU2 may include eighth to fourteenth transistors T8 to T14 and a second capacitor C2.

The eighth transistor T8 may control a driving current flowing into the light emitting element ED based on a voltage applied to a gate electrode thereof.

The ninth transistor T9 may be turned on by the scan writing signal of the scan writing line GWL to supply the PAM data voltage of the PAM data line RDL to a first electrode of the eighth transistor T8. The gate electrode of the eighth transistor T8 may be connected to the scan writing line GWL, the first electrode thereof may be connected to the PAM data line RDL, and a second electrode thereof may be connected to the first electrode of the eighth transistor T8.

The tenth transistor T10 may be turned on by the scan initializing signal of the scan initializing line GIL to electrically connect the initializing voltage line VIL to the gate electrode of the eighth transistor T8. During a period in which the tenth transistor T10 is turned on, the gate electrode of the eighth transistor T8 may be discharged to the initializing voltage of the initializing voltage line VIL. A gate-on voltage of the scan initializing signal may be different from the initializing voltage of the initializing voltage line VIL. Because a difference voltage between the gate-on voltage and the initializing voltage is larger than a threshold voltage of the tenth transistor T10, even after the initializing voltage is applied to the gate electrode of the eighth transistor T8, the tenth transistor T10 may be stably turned on. Accordingly, when the tenth transistor T10 is turned on, the gate electrode of the eighth transistor T8 may stably receive the initializing voltage regardless of the threshold voltage of the tenth transistor T10.

The tenth transistor T10 may include a plurality of transistors connected in series. For example, the tenth transistor T10 may include a fifth sub-transistor T101 and a sixth sub-transistor T102. The fifth and sixth sub-transistors T101 and T102 may prevent the voltage of the gate electrode of the eighth transistor T8 from leaking through the tenth transistor T10. A gate electrode of the fifth sub-transistor T101 may be connected to the scan initializing line GIL, a first electrode thereof may be connected to the gate electrode of the eighth transistor T8, and a second electrode thereof may be connected to a first electrode of the sixth sub-transistor T102. A gate electrode of the sixth sub-transistor T102 may be connected to the scan initializing line GIL, a first electrode thereof may be connected to the second electrode of the fifth sub-transistor T101, and a second electrode thereof may be connected to the initializing voltage line VIL.

The eleventh transistor T11 may be turned on by the scan writing signal of the scan writing line GWL to electrically connect the gate electrode of the eighth transistor T8 and a second electrode of the eighth transistor T8. Accordingly, during a period in which the eleventh transistor T11 is turned on, the eighth transistor T8 may operate as a diode (e.g., the eighth transistor T8 may be diode-connected).

The eleventh transistor T11 may include a plurality of transistors connected in series. For example, the eleventh transistor T11 may include a seventh sub-transistor T111 and an eighth sub-transistor T112. The seventh and eighth sub-transistors T111 and T112 may prevent the voltage of the gate electrode of the eighth transistor T8 from leaking through the eleventh transistor T11. A gate electrode of the seventh sub-transistor T111 may be connected to the scan writing line GWL, a first electrode thereof may be connected to the second electrode of the eighth transistor T8, and a second electrode thereof may be connected to a first electrode of the eighth sub-transistor T112. A gate electrode of the eighth sub-transistor T112 may be connected to the scan writing line GWL, a first electrode thereof may be connected to the second electrode of the seventh sub-transistor T111, and a second electrode thereof may be connected to the gate electrode of the eighth transistor T8.

The twelfth transistor T12 may be turned on by the PWM light emitting signal of the PWM light emitting line PWEL to electrically connect the first electrode of the eighth transistor T8 to the second power line VDL2. A gate electrode of the twelfth transistor T12 may be connected to the PWM light emitting line PWEL, a first electrode thereof may be connected to the second power line VDL2, and a second electrode thereof may be connected to the first electrode of the eighth transistor T8.

The thirteenth transistor T13 may be turned on by the scan controlling signal of the scan controlling line GCL to electrically connect the first power line VDL1 to a second node N2. A gate electrode of the thirteenth transistor T13 may be connected to the scan controlling line GCL, a first electrode thereof may be connected to the first power line VDL1, and a second electrode thereof may be connected to the second node N2.

The fourteenth transistor T14 may be turned on by the PWM light emitting signal of the PWM light emitting line PWEL to electrically connect the first electrode of the twelfth transistor T12 to the second node N2. A gate electrode of the fourteenth transistor T14 may be connected to the PWM light emitting line PWEL, a first electrode thereof may be connected to the second power line VDL2, and a second electrode thereof may be connected to the second node N2.

The second capacitor C2 may be disposed between the gate electrode of the eighth transistor T8 and the second node N2. One electrode of the second capacitor C2 may be connected to the gate electrode of the eighth transistor T8, and the other electrode thereof may be connected to the second node N2.

The third pixel driver PDU3 may control the period during which the driving current is supplied to the light emitting element ED based on the voltage of the third node N3.

The third pixel driver PDU3 may include fifteenth to nineteenth transistors T15 to T19 and a third capacitor C3.

The fifteenth transistor T15 may be turned on based on the voltage of the third node N3. When the fifteenth transistor T15 is turned on, the driving current of the eighth transistor T8 may be supplied to the light emitting element ED. When the fifteenth transistor T15 is turned off, the driving current of the eighth transistor T8 may not be supplied to the light emitting element ED. Accordingly, the turn-on period of the fifteenth transistor T15 may be substantially the same as the light emitting period of the light emitting element ED. A gate electrode of the fifteenth transistor T15 may be connected to the third node N3, a first electrode thereof may be connected to the second electrode of the eighth transistor T8, and a second electrode thereof may be connected to a first electrode of the seventeenth transistor T17.

The sixteenth transistor T16 may be turned on by the scan controlling signal of the scan controlling line GCL to electrically connect the initializing voltage line VIL to the third node N3. Accordingly, during the period in which the sixteenth transistor T16 is turned on, the third node N3 may be discharged to the initializing voltage of the initializing voltage line VIL.

The sixteenth transistor T16 may include a plurality of transistors connected in series. For example, the sixteenth transistor T16 may include a ninth sub-transistor T161 and a tenth sub-transistor T162. The ninth and tenth sub-transistor T161 and T162 may prevent the voltage of the third node N3 from leaking through the sixteenth transistor T16. A gate electrode of the ninth sub-transistor T161 may be connected to the scan controlling line GCL, a first electrode thereof may be connected to the third node N3, and a second electrode thereof may be connected to a first electrode of the tenth sub-transistor T162. A gate electrode of the tenth sub-transistor T162 may be connected to the scan controlling line GCL, the first electrode thereof may be connected to the second electrode of the ninth sub-transistor T161, and a second electrode thereof may be connected to the initializing voltage line VIL.

The seventeenth transistor T17 may be turned on by the PAM light emitting signal of the PAM light emitting line PAEL to electrically connect the second electrode of the fifteenth transistor T15 to the first electrode of the light emitting element ED. A gate electrode of the seventeenth transistor T17 may be connected to the PAM light emitting line PAEL, a first electrode thereof may be connected to the second electrode of the fifteenth transistor T15, and a second electrode thereof may be connected to the first electrode of the light emitting element ED.

The eighteenth transistor T18 may be turned on by the scan controlling signal of the scan controlling line GCL to electrically connect the initializing voltage line VIL to the first electrode of the light emitting element ED. Accordingly, during the period in which the eighteenth transistor T18 is turned on, the first electrode of the light emitting element ED may be discharged to the initializing voltage of the initializing voltage line VIL. A gate electrode of the eighteenth transistor T18 may be connected to the scan controlling line GCL, a first electrode thereof may be connected to the first electrode of the light emitting element ED, and a second electrode thereof may be connected to the initializing voltage line VIL.

The nineteenth transistor T19 may be turned on by the test signal of the test signal line TSTL to electrically connect the first electrode of the light emitting element ED to the third power line VSL. A gate electrode of the nineteenth transistor T19 may be connected to the test signal line TSTL, a first electrode thereof may be connected to the first electrode of the light emitting element ED, and a second electrode thereof may be connected to the third power line VSL.

The third capacitor C3 may be disposed between the third node N3 and the initializing voltage line VIL. One electrode of the third capacitor C3 may be connected to the third node N3, and the other electrode thereof may be connected to the initializing voltage line VIL.

One of the first and second electrodes of each of the first to nineteenth transistors T1 to T19 may be a source electrode, and the other thereof may be a drain electrode. The semiconductor layer of each of the first to nineteenth transistors T1 to T19 may be formed of one of poly silicon, amorphous silicon, and an oxide semiconductor. When the semiconductor layer of each of the first to nineteenth transistors T1 to T19 is poly silicon, it may be formed by a low temperature poly silicon (LTPS) process.

FIG. 11 mainly illustrates that each of the first to nineteenth transistors T1 to T19 is formed as a P-type of MOSFET, but the present specification is not limited thereto. In one or more embodiments, each of the first to nineteenth transistors T1 to T19 may be formed as an N-type of MOSFET.

Figure 12:
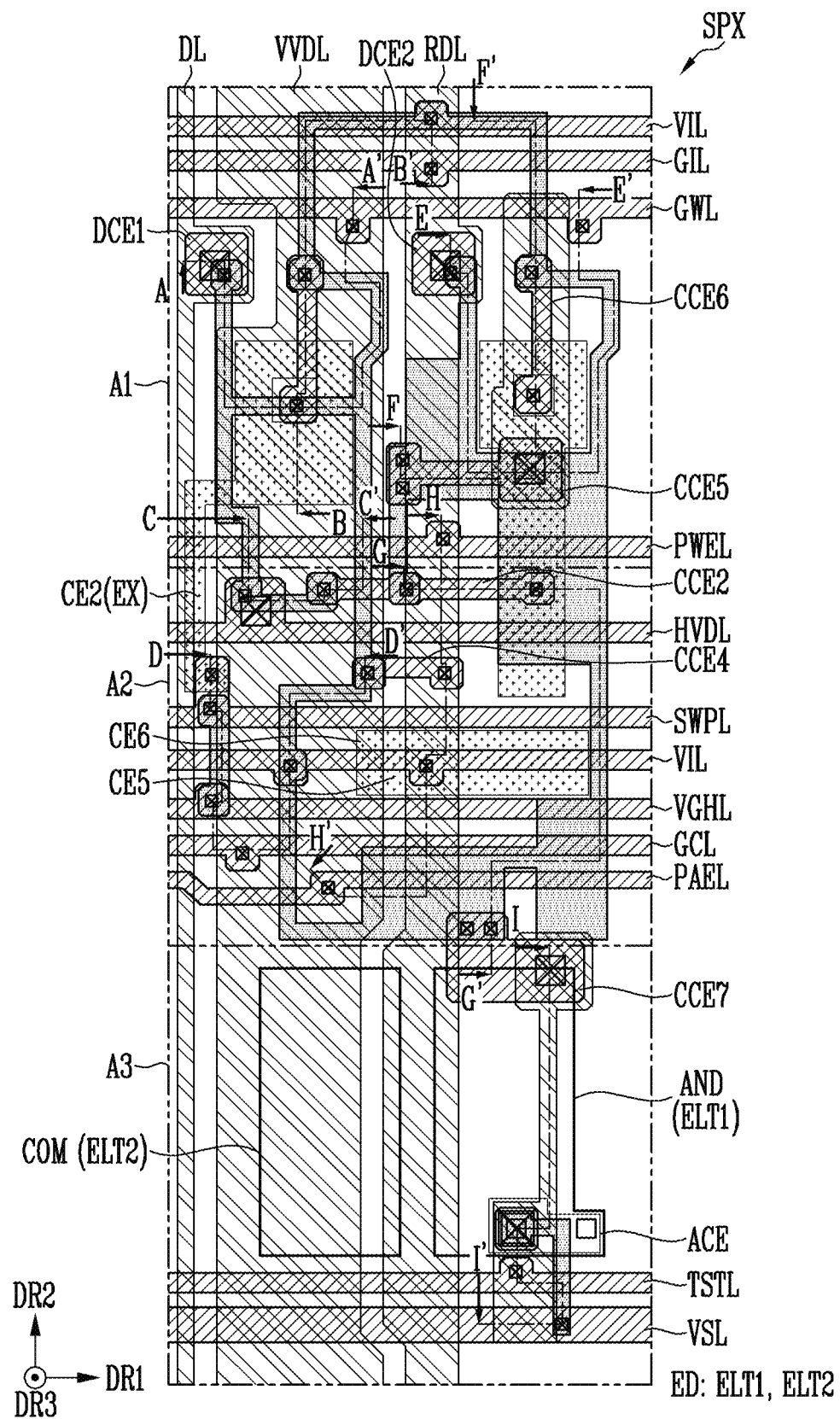
FIG. 12 illustrates a layout diagram of an example of a sub-pixel of FIG. 4.
Figure 13:
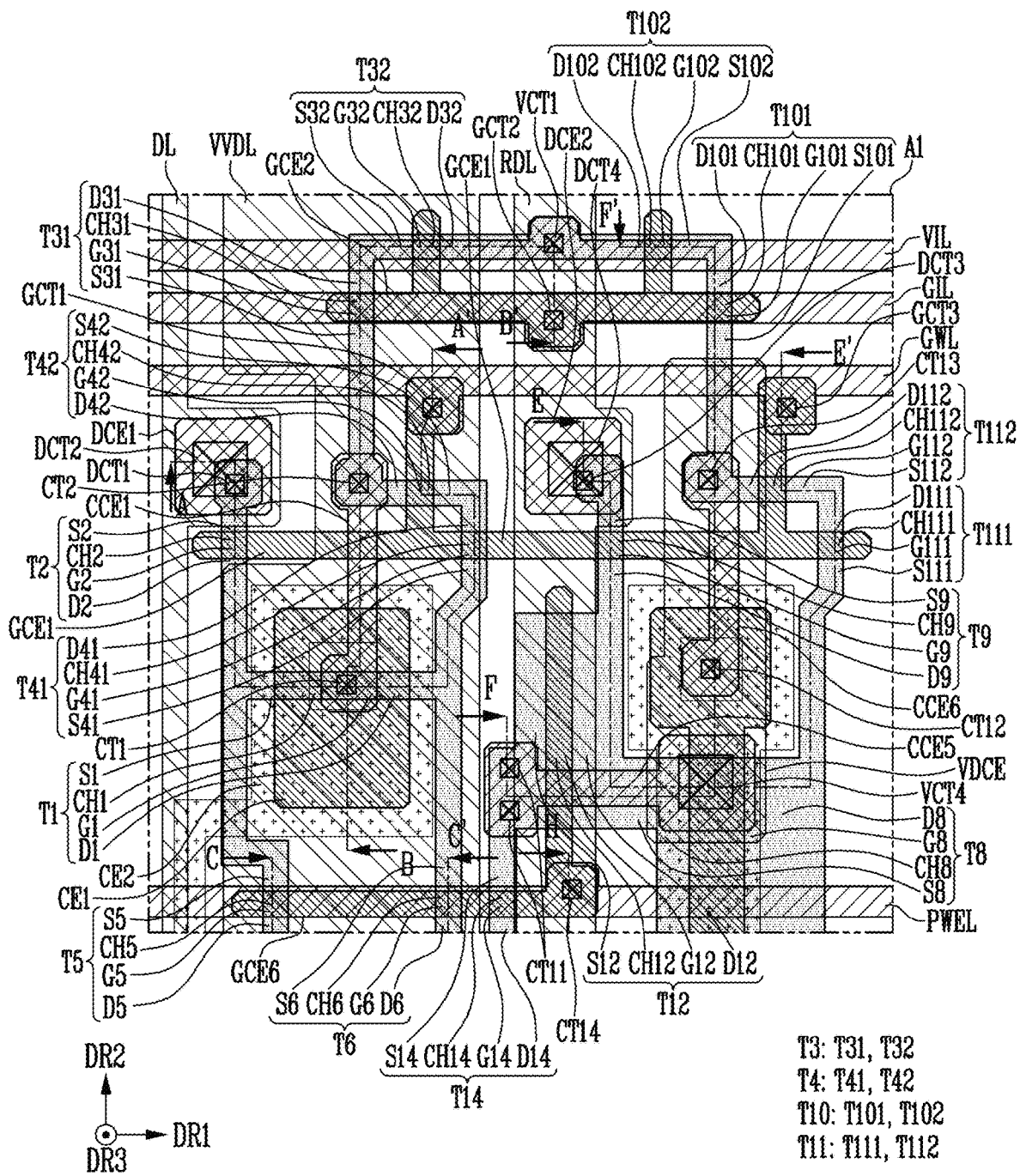
FIG. 13 illustrates an enlarged view of an area "A1" of FIG. 12.
Figure 14:
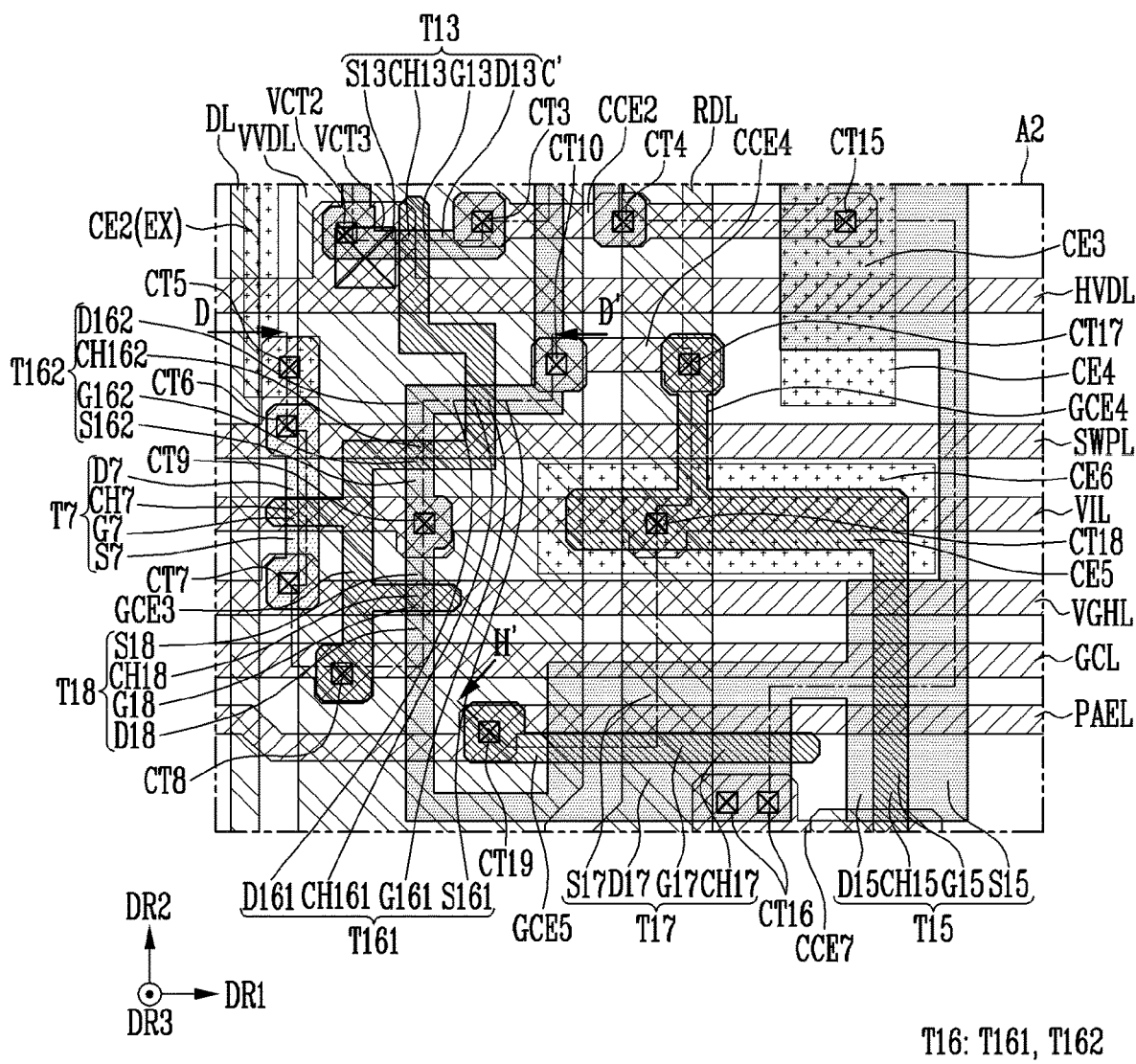
FIG. 14 illustrates an enlarged view of an area "A2" of FIG. 12.
Figure 15:
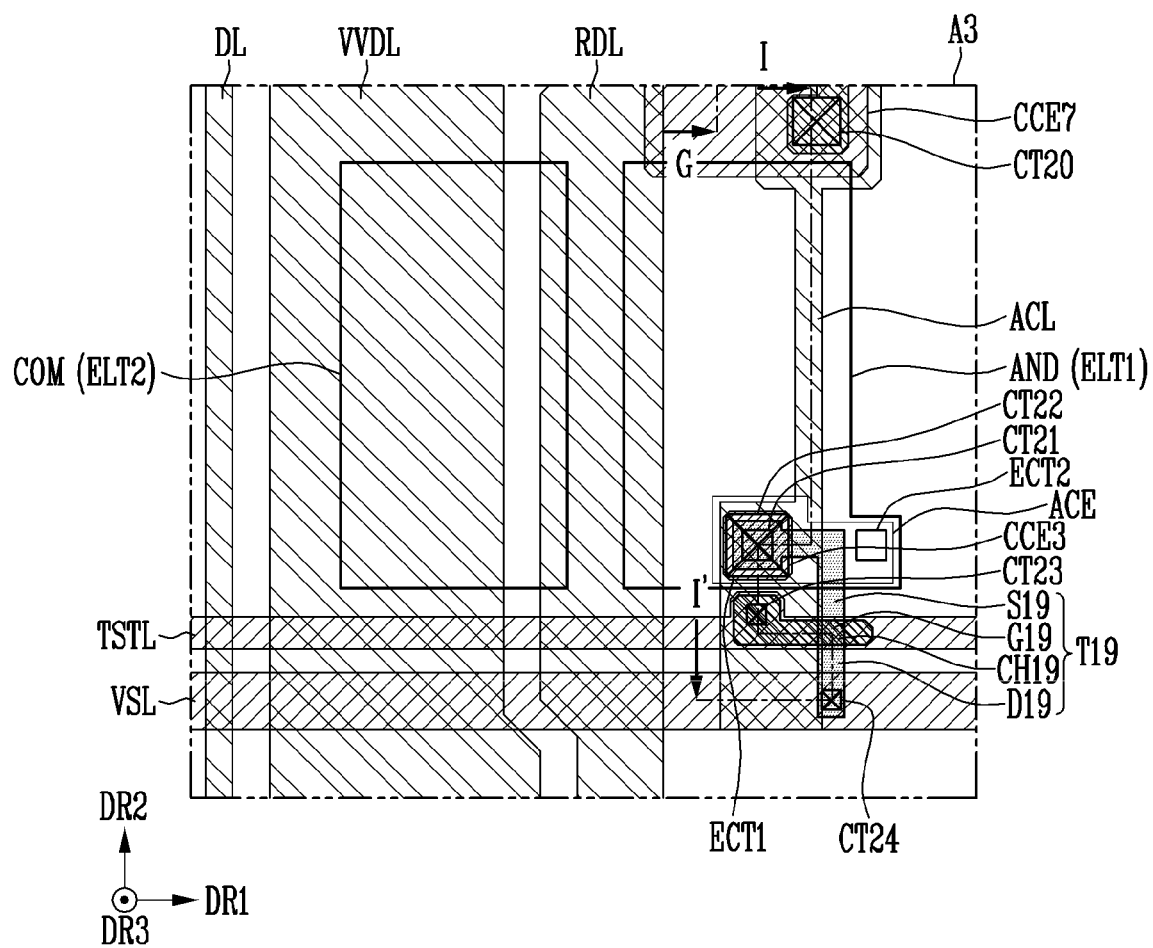
FIG. 15 illustrates an enlarged view of an area "A3" of FIG. 12.

FIG. 12 illustrates a layout diagram of an example of a sub-pixel of FIG. 4. FIG. 13 illustrates an enlarged view of an area "A1" of FIG. 12. FIG. 14 illustrates an enlarged view of an area "A2" of FIG. 12. FIG. 15 illustrates an enlarged view of an area "A3" of FIG. 12.

Referring to FIG. 4 and FIG. 11 to FIG. 15, the sub-pixel SPX of FIG. 12 may correspond to at least one of the sub-pixels SPX1, SPX2, and SPX3 of FIG. 4. For example, the sub-pixel SPX of FIG. 12 may correspond to the second and third sub-pixels SPX2 and SPX3 described in FIG. 4, FIG. 6, and FIG. 7, respectively, but is not limited thereto.

The initializing voltage line VIL, the scan initializing line GIL, the scan writing line GWL, the PWM light emitting line PWEL, the first horizontal power line HVDL, the gate-off voltage line VGHL, the sweep line SWPL, the scan controlling line GCL, the PAM light emitting line PAEL, the test signal line TSTL, and the third power line VSL may extend in the first direction DR1, and be spaced from each other in the second direction DR2.

The data line DL, the first vertical power line VVDL, and the PAM data line RDL may extend in the second direction DR2, and may be spaced from each other in the first direction DR1.

The pixel SPX may include the pixel circuit PC and the light emitting element ED. The pixel circuit PC includes first to nineteenth transistors T1 to T19, first to sixth capacitor electrodes CE1 to CE6, first to sixth gate connecting electrodes GCE1 to GCE6, first and second data connecting electrodes DCE1 and DCE2, first to seventh connecting electrodes CCE1 to CCE7, and an anode connecting line ACL.

The first transistor T1 may include a first channel CH1, a first gate electrode G1, a first source electrode S1, and a first drain electrode D1. The first channel CH1 may extend in the first direction DR1. The first channel CH1 may overlap the first gate electrode G1 in the third direction DR3. The first gate electrode G1 may be connected to the first connecting electrode CCE1 through a first contact hole CT1. The first gate electrode G1 may be integrally formed with the first capacitor electrode CE1. The first gate electrode G1 may overlap the second capacitor electrode CE2 in the third direction DR3. The first source electrode S1 may be disposed at one side of the first channel CH1, and the first drain electrode D1 may be disposed at the other side of the first channel CH1. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may not overlap the first gate electrode G1 in the third direction DR3. The first source electrode S1 and the first drain electrode D1 may overlap the second capacitor electrode CE2 in the third direction DR3.

The second transistor T2 may include a second channel CH2, a second gate electrode G2, a second source electrode S2, and a second drain electrode D2. The second channel CH2 may overlap the second gate electrode G2 in the third direction DR3. The second gate electrode G2 may be integrally formed with the first gate connecting electrode GCE1. The second source electrode S2 may be disposed at one side of the second channel CH2, and the second drain electrode D2 may be disposed at the other side of the second channel CH2. The second source electrode S2 may be connected to a first data connecting electrode DCE1 through a first data contact hole DCT1. The second drain electrode D2 may be connected to the first source electrode S1. The second source electrode S2 and the second drain electrode D2 may not overlap the second gate electrode G2 in the third direction DR3. The second drain electrode D2 may extend in the second direction DR2. The second drain electrode D2 may be connected to the first source electrode S1.

The first sub-transistor T31 of the third transistor T3 may include a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integrally formed with the second gate connecting electrode GCE2. The first sub-source electrode S31 may be disposed at one side of the first sub-channel CH31, and the first sub-drain electrode D31 may be disposed at the other side of the first sub-channel CH31. The first sub-source electrode S31 may be connected to a fourth sub-drain electrode D42, and the first sub-drain electrode D31 may be connected to a second sub-source electrode S32. The first sub-source electrode S31 and the first sub-drain electrode D31 may not overlap the first sub-gate electrode G31. The first sub-source electrode S31 may partially overlap the scan writing line GWL in the third direction DR3. The first sub-drain electrode D31 may partially overlap the initializing voltage line VIL in the third direction DR3.

The second sub-transistor T32 of the third transistor T3 may include a second sub-channel CH32, a second sub-gate electrode G32, a second sub-source electrode S32, and a second sub-drain electrode D32. The second sub-channel CH32 may overlap the second sub-gate electrode G32 in the third direction DR3. The second sub-gate electrode G32 may be integrally formed with the second gate connecting electrode GCE2. The second sub-source electrode S32 may be disposed at one side of the second sub-channel CH32, and the second sub-drain electrode D32 may be disposed at the other side of the second sub-channel CH32. The second sub-source electrode S32 may be connected to the first sub-drain electrode D31, and the second sub-drain electrode D32 may be connected to the initializing voltage line VIL through a first power contact hole VCT1. The second sub-source electrode S32 and the second sub-drain electrode D32 may not overlap the second sub-gate electrode G32. The second sub-source electrode S32 and the second sub-drain electrode D32 may partially overlap the initializing voltage line VIL in the third direction DR3.

The third sub-transistor T41 of the fourth transistor T4 may include a third sub-channel CH41, a third sub-gate electrode G41, a third sub-source electrode S41, and a third sub-drain electrode D41. The third sub-channel CH41 may overlap the third sub-gate electrode G41 in the third direction DR3. The third sub-gate electrode G41 may be integrally formed with the first gate connecting electrode GCE1. The third sub-source electrode S41 may be disposed at one side of the third sub-channel CH41, and the third sub-drain electrode D41 may be disposed at the other side of the third sub-channel CH41. The third sub-source electrode S41 may be connected to the first drain electrode D1, and the third sub-drain electrode D41 may be connected to the fourth sub-source electrode S42. The third sub-source electrode S41 and the third sub-drain electrode D41 may not overlap the third sub-gate electrode G41.

The fourth sub-transistor T42 of the fourth transistor T4 may include a fourth sub-channel CH42, a fourth sub-gate electrode G42, a fourth sub-source electrode S42, and a fourth sub-drain electrode D42. The fourth sub-channel CH42 may overlap the fourth sub-gate electrode G42 in the third direction DR3. The fourth sub-gate electrode G42 may be integrally formed with the first gate connecting electrode GCE1. The fourth sub-source electrode S42 may be disposed at one side of the fourth sub-channel CH42, and the fourth sub-drain electrode D42 may be disposed at the other side of the fourth sub-channel CH42. The fourth sub-source electrode S42 may be connected to the third sub-drain electrode D41, and the fourth sub-drain electrode D42 may be connected to the first sub-source electrode S31. The fourth sub-source electrode S42 and the fourth sub-drain electrode D42 may not overlap the fourth sub-gate electrode G42.

The fifth transistor T5 may include a fifth channel CH5, a fifth gate electrode G5, a fifth source electrode S5, and a fifth drain electrode D5. The fifth channel CH5 may overlap the fifth gate electrode G5 in the third direction DR3. The fifth gate electrode G5 may be integrally formed with a sixth gate connecting electrode GCE6. The fifth source electrode S5 may be disposed at one side of the fifth channel CH5, and the fifth drain electrode D5 may be disposed at the other side of the fifth channel CH5. The fifth source electrode S5 may be connected to a first horizontal power line HVDL through a second power contact hole VCT2. The fifth drain electrode D5 may be connected to the first source electrode S1. The fifth source electrode S5 and the fifth drain electrode D5 may not overlap the fifth gate electrode G5 in the third direction DR3. The fifth drain electrode D5 may overlap an extension EX of the second capacitor electrode CE2 in the third direction DR3.

The sixth transistor T6 may include a sixth channel CH6, a sixth gate electrode G6, a sixth source electrode S6, and a sixth drain electrode D6. The sixth channel CH6 may overlap the sixth gate electrode G6 in the third direction DR3. The sixth gate electrode G6 may be integrally formed with the sixth gate connecting electrode GCE6. The sixth source electrode S6 may be disposed at one side of the sixth channel CH6, and the sixth drain electrode D6 may be disposed at the other side of the sixth channel CH6. The sixth source electrode S6 may be connected to the first drain electrode D1. The sixth drain electrode D6 may be connected to the fourth connecting electrode CCE4 through a tenth contact hole CT10. The sixth source electrode S6 and the sixth drain electrode D6 may not overlap the sixth gate electrode G6 in the third direction DR3. The sixth drain electrode D6 may overlap the second connecting electrode CCE2 and the first horizontal power line HVDL in the third direction DR3.

The seventh transistor T7 may include a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integrally formed with the third gate connecting electrode GCE3. The seventh gate electrode G7 may overlap the initializing voltage line VIL in the third direction DR3. The seventh source electrode S7 may be disposed at one side of the seventh channel CH7, and the seventh drain electrode D7 may be disposed at the other side of the seventh channel CH7. The seventh source electrode S7 may be connected to the gate-off voltage line VGHL through a seventh contact hole CT7. The seventh drain electrode D7 may be connected to the sweep line SWPL through a sixth contact hole CT6. The seventh source electrode S7 and the seventh drain electrode D7 may not overlap the seventh gate electrode G7 in the third direction DR3.

The eighth transistor T8 may include a eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may extend in the second direction DR2. The eighth gate electrode G8 may be integrally formed with the third capacitor electrode CE3. The eighth source electrode S8 may be disposed at one side of the eighth channel CH8, and the eighth drain electrode D8 may be disposed at the other side of the eighth channel CH8. The eighth source electrode S8 may be connected to a ninth drain electrode D9 and a twelfth drain electrode D12. The eighth drain electrode D8 may be connected to a seventh sub-source electrode S111. The eighth source electrode S8 and the eighth drain electrode D8 may not overlap the eighth gate electrode G8 in the third direction DR3.

The ninth transistor T9 may include a ninth channel CH9, a ninth gate electrode G9, a ninth source electrode S9, and a ninth drain electrode D9. The ninth channel CH9 may overlap the ninth gate electrode G9 in the third direction DR3. The ninth gate electrode G9 may extend in the second direction DR2. The ninth gate electrode G9 may be integrally formed with the first gate connecting electrode GCE1. The ninth source electrode S9 may be disposed at one side of the ninth channel CH9, and the ninth drain electrode D9 may be disposed at the other side of the ninth channel CH9. The ninth source electrode S9 may be connected to the eighth source electrode S8. The ninth drain electrode D9 may be connected to a second data connecting electrode DCE2 through a third data contact hole DCT3. The ninth source electrode S9 and the ninth drain electrode D9 may not overlap the ninth gate electrode G9 in the third direction DR3.

The fifth sub-transistor T101 of the tenth transistor T10 may include a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integrally formed with the second gate connecting electrode GCE2. The fifth sub-source electrode S101 may be disposed at one side of the fifth sub-channel CH101, and the fifth sub-drain electrode D101 may be disposed at the other side of the fifth sub-channel CH101. The fifth sub-source electrode S101 may be connected to the eighth sub-drain electrode D112, and the fifth sub-drain electrode D101 may be connected to the sixth sub-source electrode S102. The fifth sub-source electrode S101 and the fifth sub-drain electrode D101 may not overlap the fifth sub-gate electrode G101. The fifth sub-source electrode S101 may partially overlap the scan writing line GWL in the third direction DR3. The fifth sub-drain electrode D101 may partially overlap the initializing voltage line VIL in the third direction DR3.

The sixth sub-transistor T102 of the tenth transistor T10 may include a sixth sub-channel CH102, a sixth sub-gate electrode G102, a sixth sub-source electrode S102, and a sixth sub-drain electrode D102. The sixth sub-channel CH102 may overlap the sixth sub-gate electrode G102 in the third direction DR3. The sixth sub-gate electrode G102 may be integrally formed with the second gate connecting electrode GCE2. The sixth sub-source electrode S102 may be disposed at one side of the sixth sub-channel CH102, and the sixth sub-drain electrode D102 may be disposed at the other side of the sixth sub-channel CH102. The sixth sub-source electrode S102 may be connected to the fifth sub-drain electrode D101, and the sixth sub-drain electrode D102 may be connected to the initializing voltage line VIL through the first power contact hole VCT1. The sixth sub-source electrode S102 and the sixth sub-drain electrode D102 may not overlap the sixth sub-gate electrode G102. The sixth sub-source electrode S102 and the sixth sub-drain electrode D102 may partially overlap the initializing voltage line VIL in the third direction DR3.

The seventh sub-transistor T111 of the eleventh transistor T11 may include a seventh sub-channel CH111, a seventh sub-gate electrode GI11, a seventh sub-source electrode S111, and a seventh sub-drain electrode D111. The seventh sub-channel CH111 may overlap the seventh sub-gate electrode GI11 in the third direction DR3. The seventh sub-gate electrode GI11 may be integrally formed with the first gate connecting electrode GCE1. The seventh sub-source electrode S111 may be disposed at one side of the seventh sub-channel CH111, and the seventh sub-drain electrode D111 may be disposed at the other side of the seventh sub-channel CH111.

The seventh sub-source electrode S111 may be connected to the eighth drain electrode D8, and the seventh sub-drain electrode D111 may be connected to the eighth sub-source electrode S112. The seventh sub-source electrode S111 and the seventh sub-drain electrode D111 may not overlap the seventh sub-gate electrode GI11.

The eighth sub-transistor T112 of the eleventh transistor T11 may include an eighth sub-channel CH112, an eighth sub-gate electrode GI12, an eighth sub-source electrode S112, and an eighth sub-drain electrode D112. The eighth sub-channel CH112 may overlap the eighth sub-gate electrode GI12 in third direction DR3. The eighth sub-gate electrode GI12 may be integrally formed with the first gate connecting electrode GCE1. The eighth sub-source electrode S112 may be disposed at one side of the eighth sub-channel CH112, and the eighth sub-drain electrode D112 may be disposed at the other side of the eighth sub-channel CH112. The eighth sub-source electrode S112 may be connected to the seventh sub-drain electrode D111, and the eighth sub-drain electrode D112 may be connected to the fifth sub-source electrode S101. The eighth sub-source electrode S112 and the eighth sub-drain electrode D112 may not overlap the eighth sub-gate electrode GI12.

The twelfth transistor T12 may include a twelfth channel CH12, a twelfth gate electrode G12, a twelfth source electrode S12, and a twelfth drain electrode D12. The twelfth channel CH12 may overlap the twelfth gate electrode G12 in the third direction DR3. The twelve gate electrode G12 may be integrally formed with the sixth gate connecting electrode GCE6. The twelfth source electrode S12 may be disposed at one side of the twelfth channel CH12, and the twelfth drain electrode D12 may be disposed at the other side of the twelfth channel CH12. The twelfth source electrode S12 may be connected to the fifth connecting electrode CCE5 through an eleventh contact holes CT11. The twelfth drain electrode D12 may be connected to the eighth source electrode S8. The twelfth source electrode S12 and the twelfth drain electrode D12 may not overlap the twelfth gate electrode G12 in the third direction DR3.

The thirteenth transistor T13 may include a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integrally formed with the third gate connecting electrode GCE3. The thirteenth source electrode S13 may be disposed at one side of the thirteenth channel CH13, and the thirteenth drain electrode D13 may be disposed at the other side of the thirteenth channel CH13. The thirteenth source electrode S13 may be connected to the first horizontal power line HVDL through the second power contact hole VCT2. The thirteenth drain electrode D13 may be connected to the second connecting electrode CCE2 through a third contact hole CT3. The thirteenth source electrode S13 and the thirteenth drain electrode D13 may not overlap the thirteenth gate electrode G13 in the third direction DR3.

The fourteenth transistor T14 may include a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integrally formed with the sixth gate connecting electrode GCE6. The fourteenth source electrode S14 may be disposed at one side of the fourteenth channel CH14, and the fourteenth drain electrode D14 may be disposed at the other side of the fourteenth channel CH14. The fourteenth source electrode S14 may be connected to the fifth connecting electrode CCE5 through the eleventh contact holes CT11. The fourth drain electrode D14 may be connected to the second connecting electrode CCE2 through a fourth contact hole CT4. The fourteenth source electrode S14 and the fourteenth drain electrode D14 may not overlap the fourteenth gate electrode G14 in the third direction DR3.

The fifteenth transistor T15 may include a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integrally formed with the fifth capacitor electrode CE5. The fifteenth source electrode S15 may be disposed at one side of the fifteenth channel CH15, and the fifteenth drain electrode D15 may be disposed at the other side of the fifteenth channel CH15. The fifteenth source electrode S15 may be connected to the eighth drain electrode D8. The fifteenth drain electrode D15 may be connected to the seventeenth source electrode S17. The fifteenth source electrode S15 and the fifteenth drain electrode D15 may not overlap the fifteenth gate electrode G15 in the third direction DR3.

The ninth sub-transistor T161 of the sixteenth transistor T16 may include a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be integrally formed with the third gate connecting electrode GCE3. The ninth sub-source electrode S161 may be disposed at one side of the ninth sub-channel CH161, and the ninth sub-drain electrode D161 may be disposed at the other side of the ninth sub-channel CH161. The ninth sub-source electrode S161 may be connected to the fourth connecting electrode CCE4 through the tenth contact hole CT10, and the ninth sub-drain electrode D161 may be connected to the tenth sub-source electrode S162. The ninth sub-source electrode S161 and the ninth sub-drain electrode D161 may not overlap the ninth sub-gate electrode G161.

The tenth sub-transistor T162 of the sixteenth transistor T16 may include a tenth sub-channel CH162, a tenth sub-gate electrode G162, a tenth sub-source electrode S162, and a tenth sub-drain electrode D162. The tenth sub-channel CH162 may overlap the tenth sub-gate electrode G162 in the third direction DR3. The tenth sub-gate electrode G162 may be integrally formed with the third gate connecting electrode GCE3. The tenth sub-source electrode S162 may be disposed at one side of the tenth sub-channel CH162, and the tenth sub-drain electrode D162 may be disposed at the other side of the tenth sub-channel CH162. The tenth sub-source electrode S162 may be connected to the ninth sub-drain electrode D161, and the tenth sub-drain electrode D162 may be connected to the initializing voltage line VIL through a ninth contact hole CT9. The tenth sub-source electrode S162 and the tenth sub-drain electrode D162 may not overlap the tenth sub-gate electrode G162.

The seventeenth transistor T17 may include a seventeenth channel CH17, a seventeenth gate electrode G17, a seventeenth source electrode S17, and a seventeenth drain electrode D17. The seventeenth channel CH17 may overlap the seventeenth gate electrode G17 in the third direction DR3. The seventeenth gate electrode G17 may be integrally formed with the fifth gate connecting electrode GCE5. The seventeenth source electrode S17 may be disposed at one side of the seventeenth channel CH17, and the seventeenth drain electrode D17 may be disposed at the other side of the seventeenth channel CH17. The seventeenth source electrode S17 may be connected to the fifteenth drain electrode D15. The seventeenth drain electrode D17 may be connected to the seventh connecting electrode CCE7 through a sixteenth contact holes CT16. The seventeenth source electrode S17 and the seventeenth drain electrode D17 may not overlap the seventeenth gate electrode G17 in the third direction DR3.

The eighteenth transistor T18 may include an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integrally formed with the third gate connecting electrode GCE3. The eighteenth source electrode S18 may be disposed at one side of the eighteenth channel CH18, and the eighteenth drain electrode D18 may be disposed at the other side of the eighteenth channel CH18. The eighteenth source electrode S18 may be connected to the initializing voltage line VIL through the ninth contact hole CT9. The eighteenth drain electrode D18 may be connected to the seventh connecting electrode CCE7 through the sixteenth contact hole CT16. The eighteenth source electrode S18 and the eighteenth drain electrode D18 may not overlap the eighteenth gate electrode G18 in the third direction DR3.

The nineteenth transistor T19 may include a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth gate electrode G19 may be connected to the test signal line TSTL through a twenty-third contact hole CT23. The nineteenth source electrode S19 may be disposed at one side of the nineteenth channel CH19, and the nineteenth drain electrode D19 may be disposed at the other side of the nineteenth channel CH19. The nineteenth source electrode S19 may be connected to the third connecting electrode CCE3 through a twenty-first contact hole CT21. The nineteenth drain electrode D19 may be connected to the third power line VSL through a twenty-fourth contact hole CT24. The nineteenth source electrode S19 and the nineteenth drain electrode D19 may not overlap the nineteenth gate electrode G19 in the third direction DR3.

The first capacitor electrode CE1 may be integrally formed with the first gate electrode G1. The second capacitor electrode CE2 may overlap the first capacitor electrode CE1 in the third direction DR3. The first capacitor electrode CE1 may be one electrode of the first capacitor C1, and the second capacitor electrode CE2 may be the other electrode of the first capacitor C1.

The second capacitor electrode CE2 may include a hole exposing the first gate electrode G1, and the first connecting electrode CCE1 may be connected to the first gate electrode G1 through the first contact hole CT1 in the hole.

The second capacitor electrode CE2 may include an extension EX extending in the second direction DR2. The extension EX of the second capacitor electrode CE2 may cross the PWM light emitting line PWEL and the first horizontal voltage line HVDL. The extension EX of the second capacitor electrode CE2 may be connected to the sweep line SWPL through a fifth contact hole CT5.

The third capacitor electrode CE3 may be integrally formed with the eighth gate electrode G8. The fourth capacitor electrode CE4 may overlap the third capacitor electrode CE3 in the third direction DR3. The third capacitor electrode CE3 may be one electrode of the second capacitor C2, and the fourth capacitor electrode CE4 may be the other electrode of the second capacitor C2.

The fourth capacitor electrode CE4 may include a hole exposing the eighth gate electrode G8, and the sixth connecting electrode CCE6 may be connected to the eighth gate electrode G8 through a twelfth contact hole CT12 in the hole.

The fifth capacitor electrode CE5 may be integrally formed with the fourth gate connecting electrode GCE4 and the fifteenth gate electrode G15. The sixth capacitor electrode CE6 may overlap the fifth capacitor electrode CE5 in the third direction DR3. The fifth capacitor electrode CE5 may be one electrode of the third capacitor C3, and the sixth capacitor electrode CE6 may be the other electrode of the third capacitor C3. The sixth capacitor electrode CE6 may be connected to the initializing voltage line VIL through an eighteenth contact hole CT18.

The first gate connecting electrode GCE1 may be connected to the scan writing line GWL through a first gate contact hole GCT1 and a third gate contact hole GCT3. The second gate connecting electrode GCE2 may be connected to the scan initializing line GIL through a second gate contact hole GCT2. The third gate connecting electrode GCE3 may be connected to the scan controlling line GCL through an eighth contact hole CT8. The fourth gate connecting electrode GCE4 may be connected to the fourth connecting electrode CCE4 through a seventeenth contact hole CT17. The fifth gate connecting electrode GCE5 may be connected to the PAM light emitting line PAEL through a nineteenth contact hole CT19. The sixth gate connecting electrode GCE6 may be connected to the PWM light emitting line PWEL through a fourteenth contact hole CT14.

The first data connecting electrode DCE1 may be connected to the second source electrode S2 through the first data contact hole DCT1, and may be connected to the data line DL through the second data contact hole DCT2. The second data connecting electrode DCE2 may be connected to the ninth source electrode S9 through the third data contact hole DCT3, and may be connected to the PAM data line RDL through the fourth data contact hole DCT4.

The first connecting electrode CCE1 may extend in the second direction DR2. The first connecting electrode CCE1 may be connected to the first gate electrode G1 through the first contact hole CT1, and may be connected to the first sub-source electrode S31 and the fourth sub-drain electrode D42 through the second contact hole CT2.

The second connecting electrode CCE2 may extend in the first direction DR1. The second connecting electrode CCE2 may be connected to the thirteenth drain electrode D13 through the third contact hole CT3, may be connected to the fourteenth drain electrode D14 through the fourth contact hole CT4, and may be connected to the fourth capacitor electrode CE4 through the fifteenth contact hole CT15.

The third connecting electrode CCE3 may be connected to the nineteenth source electrode S19 through the twenty-first contact hole CT21, and may be connected to the anode connecting line ACL through the twenty-second contact hole CT22.

The fourth connecting electrode CCE4 may extend in the first direction DR1. The fourth connecting electrode CCE4 may be connected to the sixth drain electrode D6 and the ninth sub-source electrode S161 through the tenth contact hole CT10, and may be connected to the fourth gate connecting electrode CCE4 through the seventeenth contact hole CT17.

The fifth connecting electrode CCE5 may extend in the first direction DR1. The fifth connecting electrode CCE5 may be connected to the twelfth source electrode S12 and the fourth source electrode S14 through the eleventh contact holes CT11, and may be connected to the fourth capacitor electrode CE4 through a fourth power contact hole VDCT4.

The sixth connecting electrode CCE6 may extend in the second direction DR2. The sixth connecting electrode CCE6 may be connected to the third capacitor electrode CE3 through the twelfth contact hole CT12, and may be connected to the fifth sub-source electrode S101 and the eighth sub-drain electrode D112 through a thirteenth contact hole CT13.

The seventh connecting electrode CCE7 may be connected to the seventeenth drain electrode D17 and the eighteenth drain electrode D18 through the sixteenth contact hole CT16. The seventh connecting electrode CCE7 may be connected to the anode connecting line ACL through a twentieth contact hole CT20.

A second power connecting electrode VDCE may extend in the second direction DR2. It may be connected to the fifth connecting electrode CCE5 through a fourth power contact hole VCT4.

The anode connecting line ACL may extend in the second direction DR2. The anode connecting line ACL may be connected to the seventh connecting electrode CCE7 through a twentieth contact hole CT20, and may be connected to the third connecting electrode CCE3 through the twenty-second contact hole CT22.

The anode connecting electrode ACE overlaps the anode connecting line ACL in the third direction DR3 as described with reference to FIG. 6, and may be connected to the anode connecting line ACL through a first electrode contact hole ECT1. In addition, the anode connecting electrode ACE may be connected to the pixel electrode AND through a second electrode contact hole ECT2. The pixel electrode AND may be connected to the first contact electrode ELT1 of the light emitting element ED.

As described with reference to FIG. 6 and FIG. 10, the anode connecting electrode ACE may have a different shape for each sub-pixel SPX1, SPX2, or SPX3. Corresponding to the anode connecting electrode ACE, the arrangement order of the pixel electrode AND and the common electrode COM may also be changed for each sub-pixel SPX1, SPX2, or SPX3.

Figure 16:
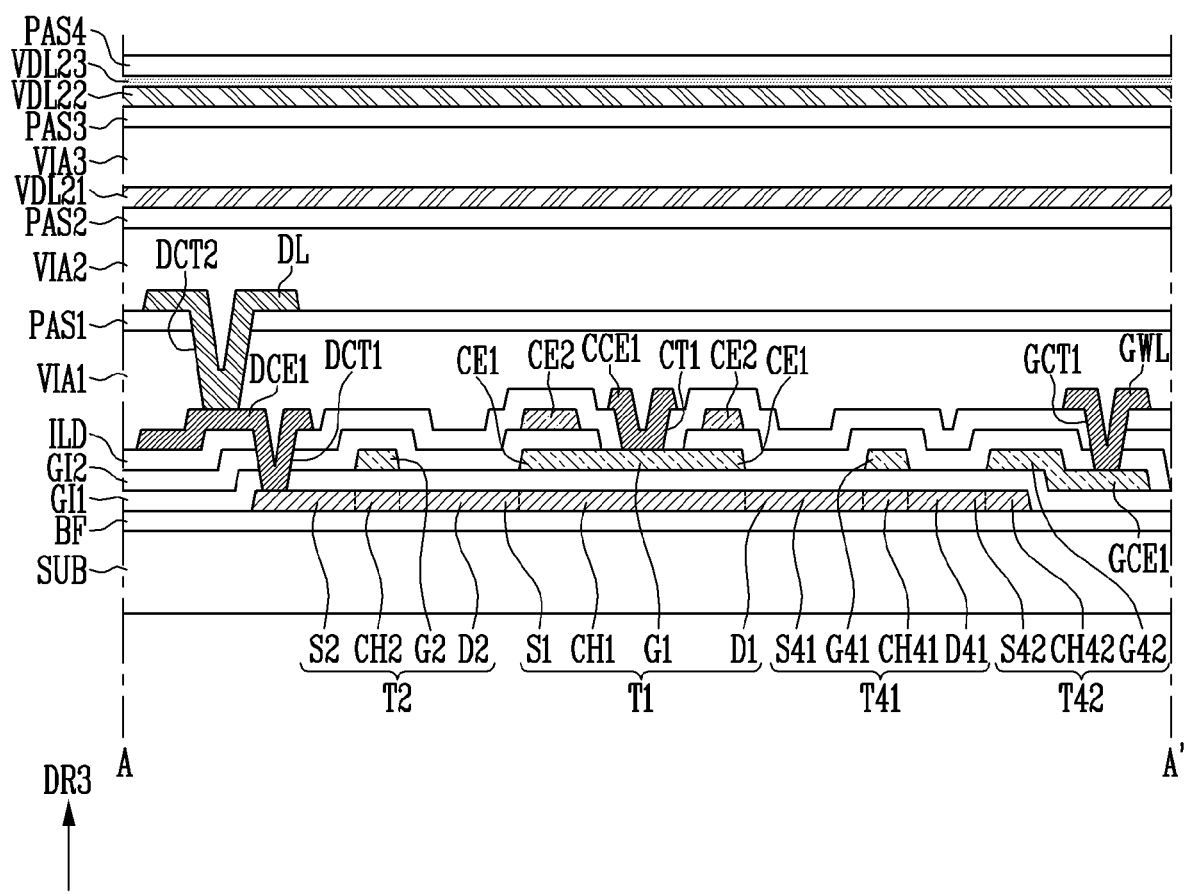
FIG. 16 illustrates a cross-sectional view taken along the line A-A' of FIG. 12.
Figure 17:
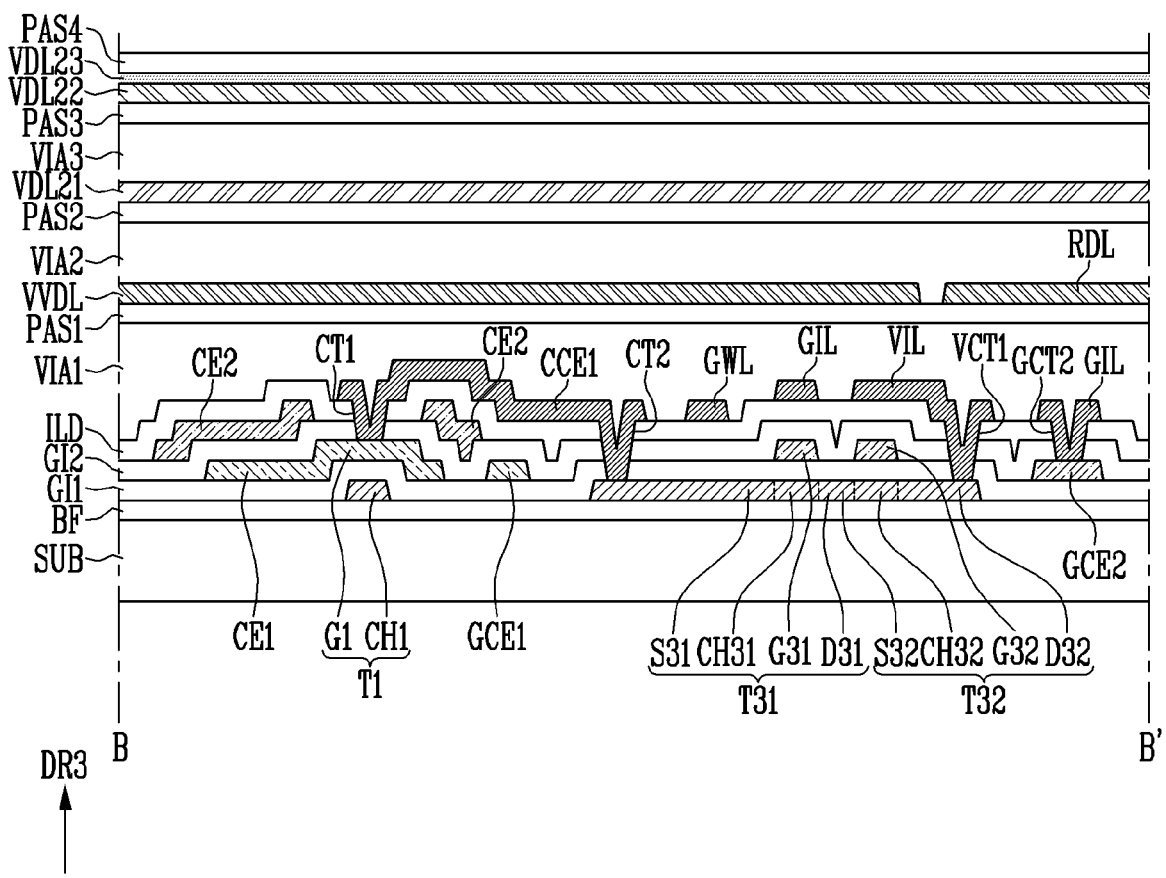
FIG. 17 illustrates a cross-sectional view taken along the line B-B' of FIG. 12.
Figure 18:
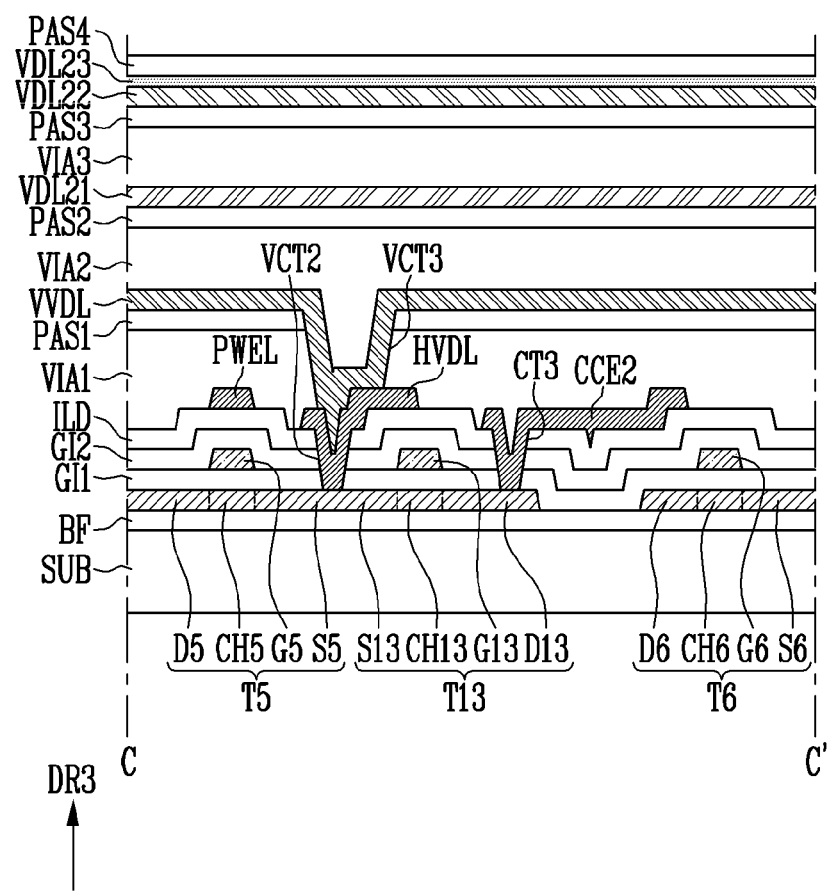
FIG. 18 illustrates a cross-sectional view taken along the line C-C' of FIG. 12.
Figure 19:
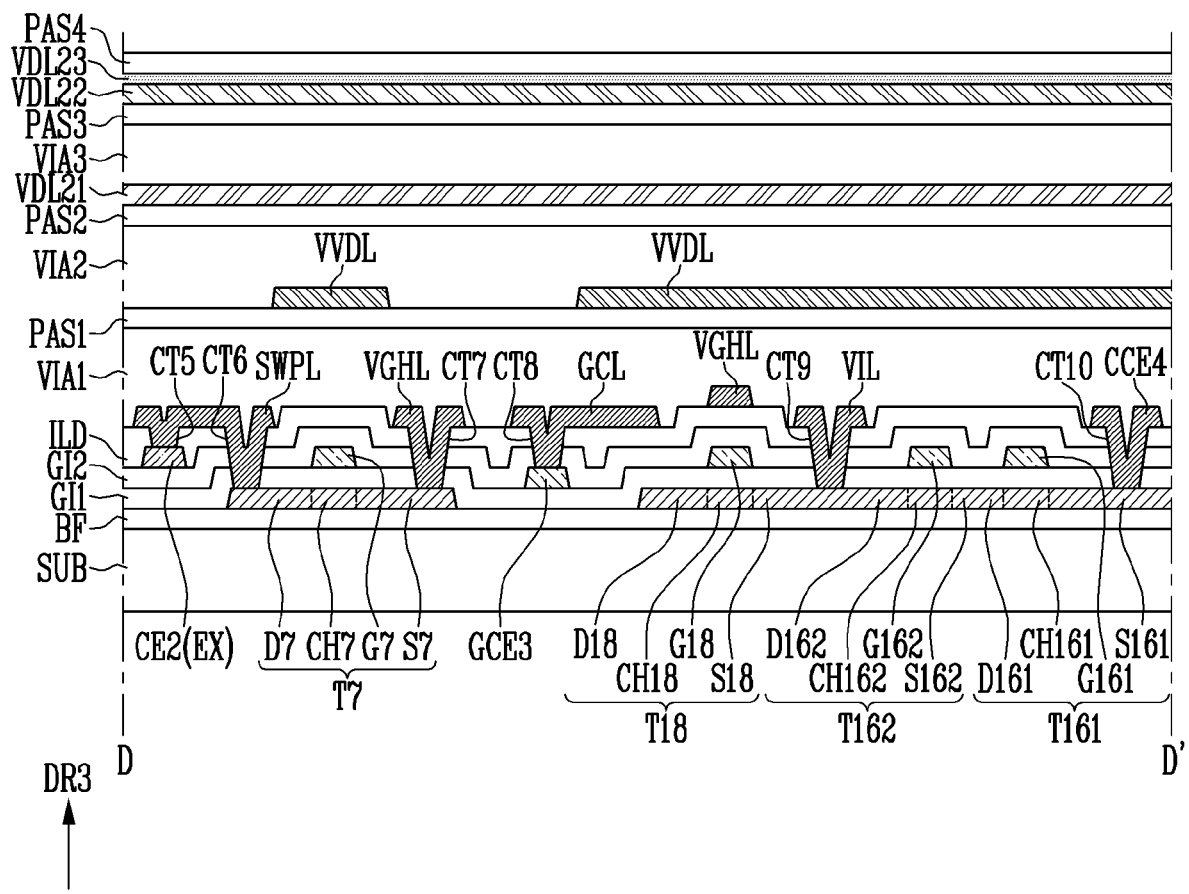
FIG. 19 illustrates a cross-sectional view taken along the line D-D' of FIG. 12.
Figure 20:
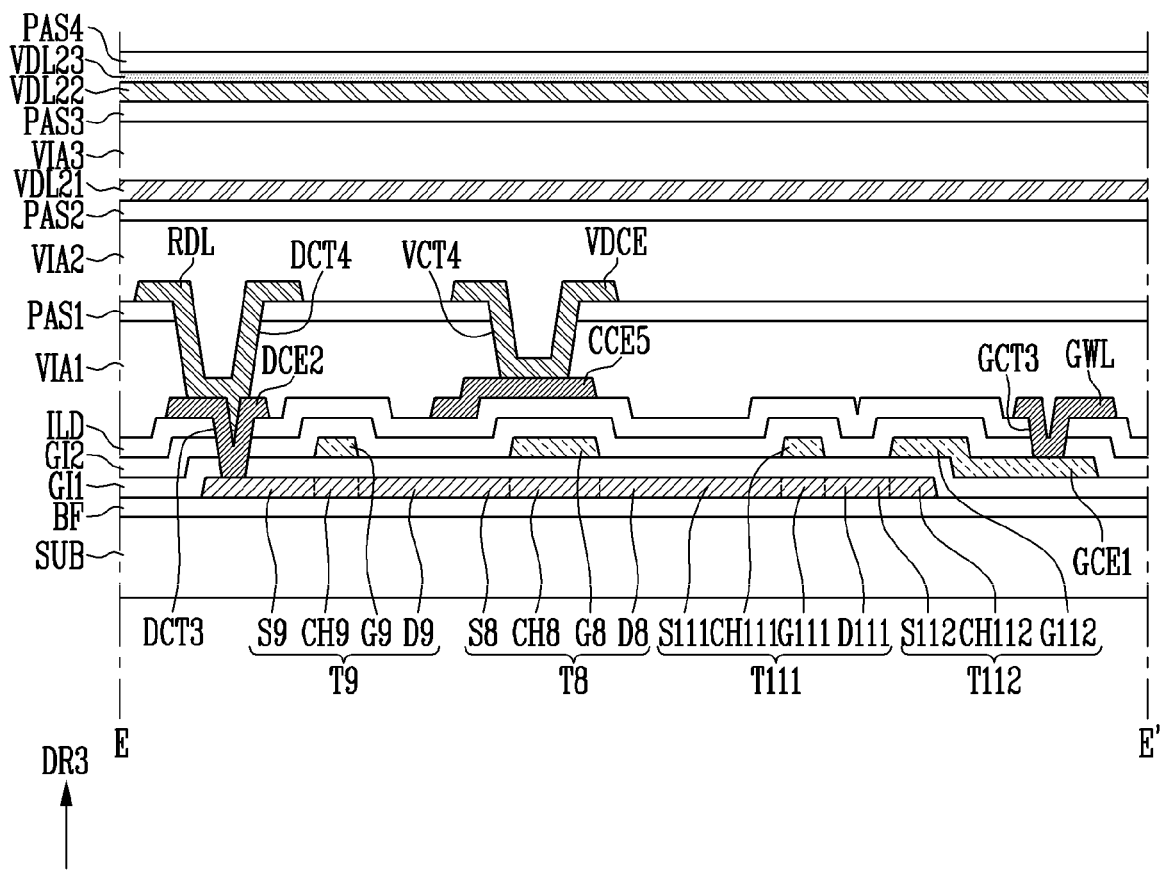
FIG. 20 illustrates a cross-sectional view taken along the line E-E' of FIG. 12.
Figure 21:
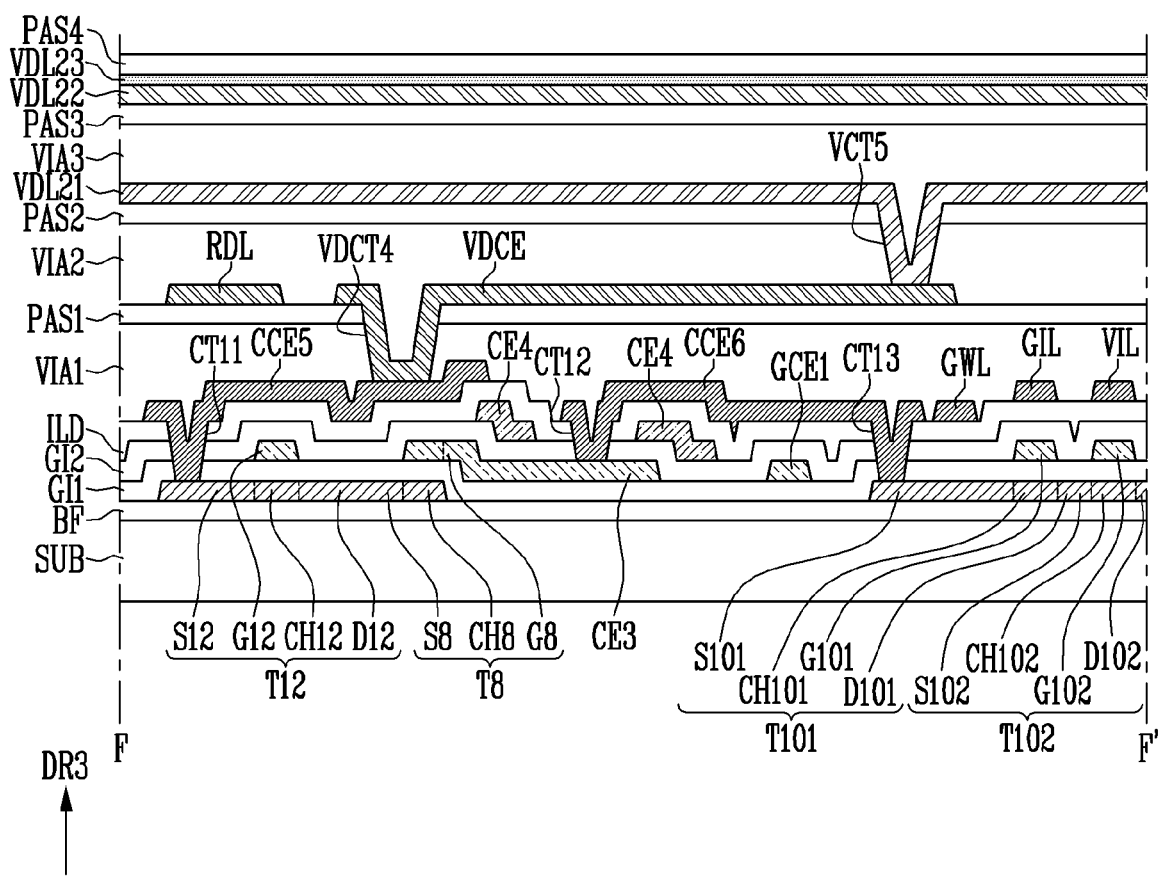
FIG. 21 illustrates a cross-sectional view taken along the line F-F' of FIG. 12.
Figure 22:
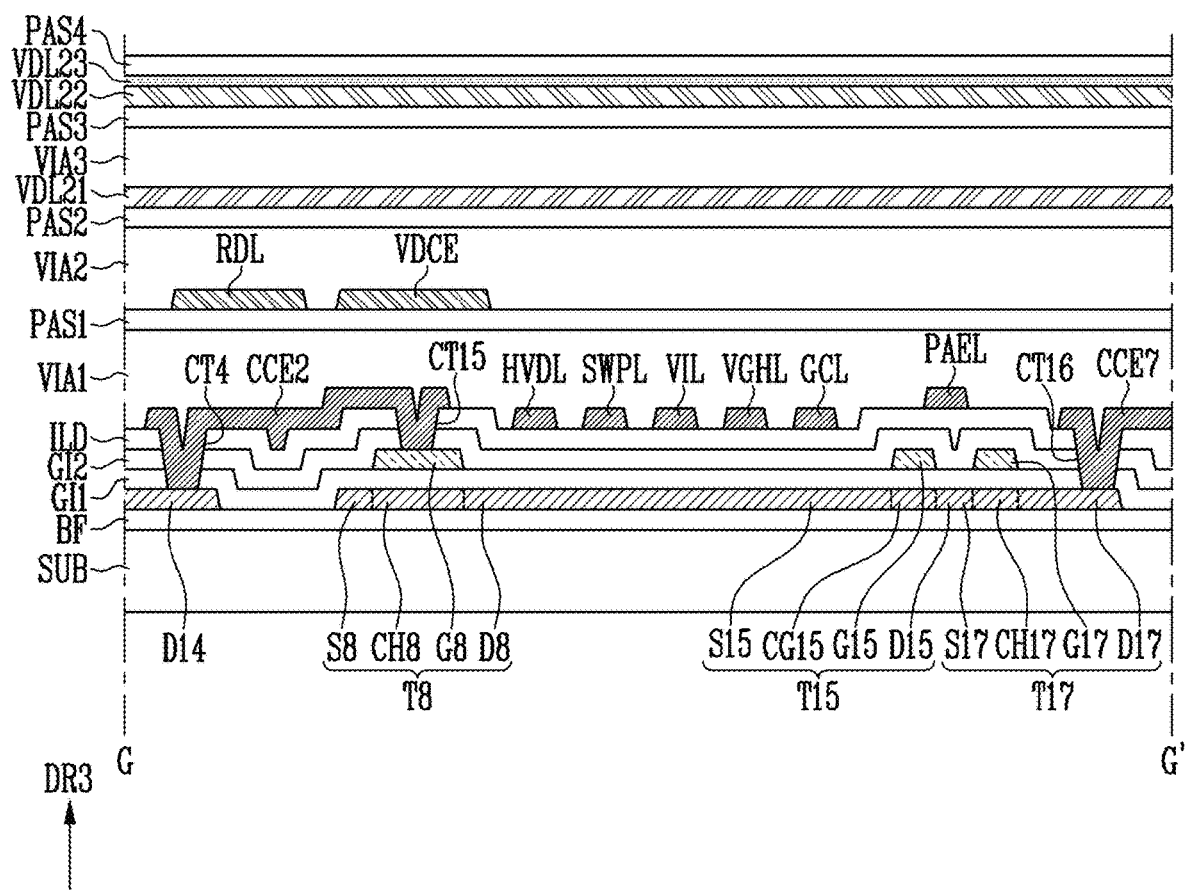
FIG. 22 illustrates a cross-sectional view taken along the line G-G' of FIG. 12.
Figure 23:
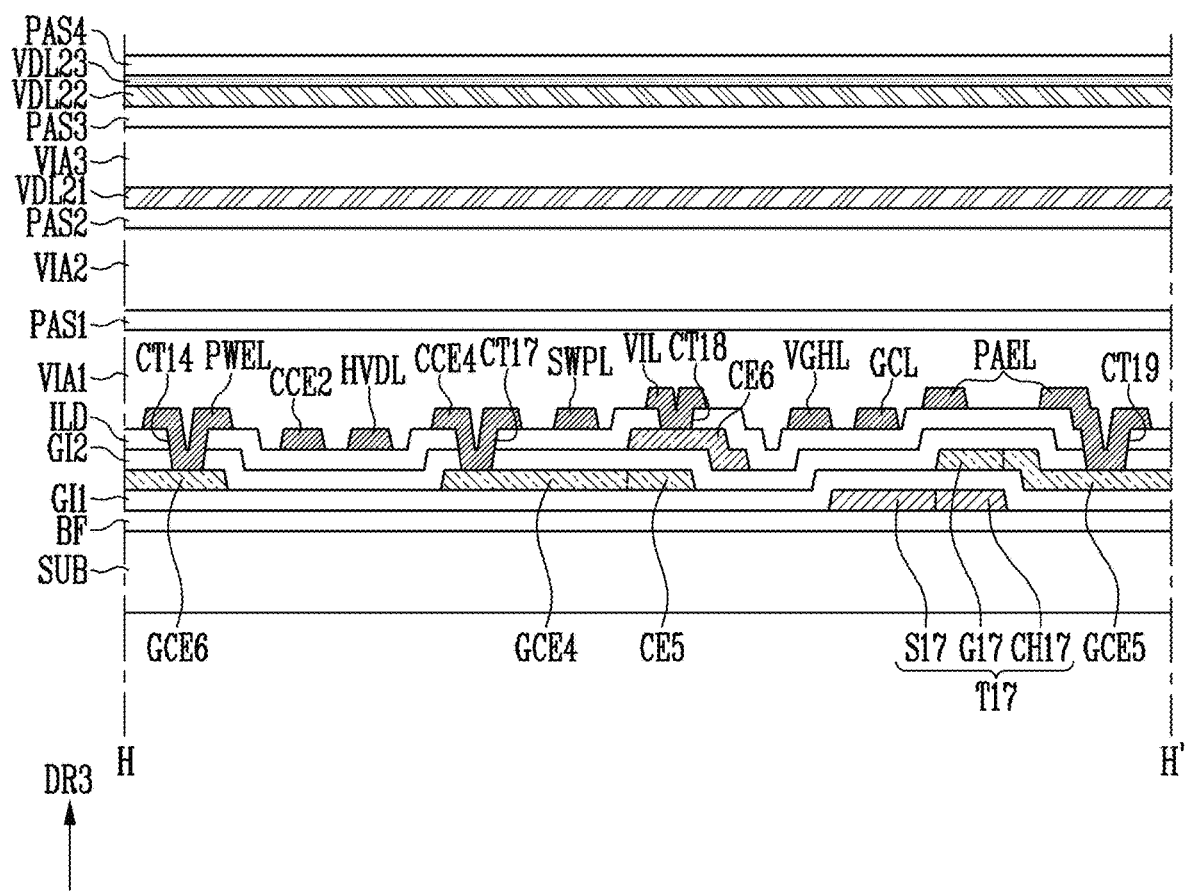
FIG. 23 illustrates a cross-sectional view taken along the line H-H' of FIG. 12.
Figure 24:
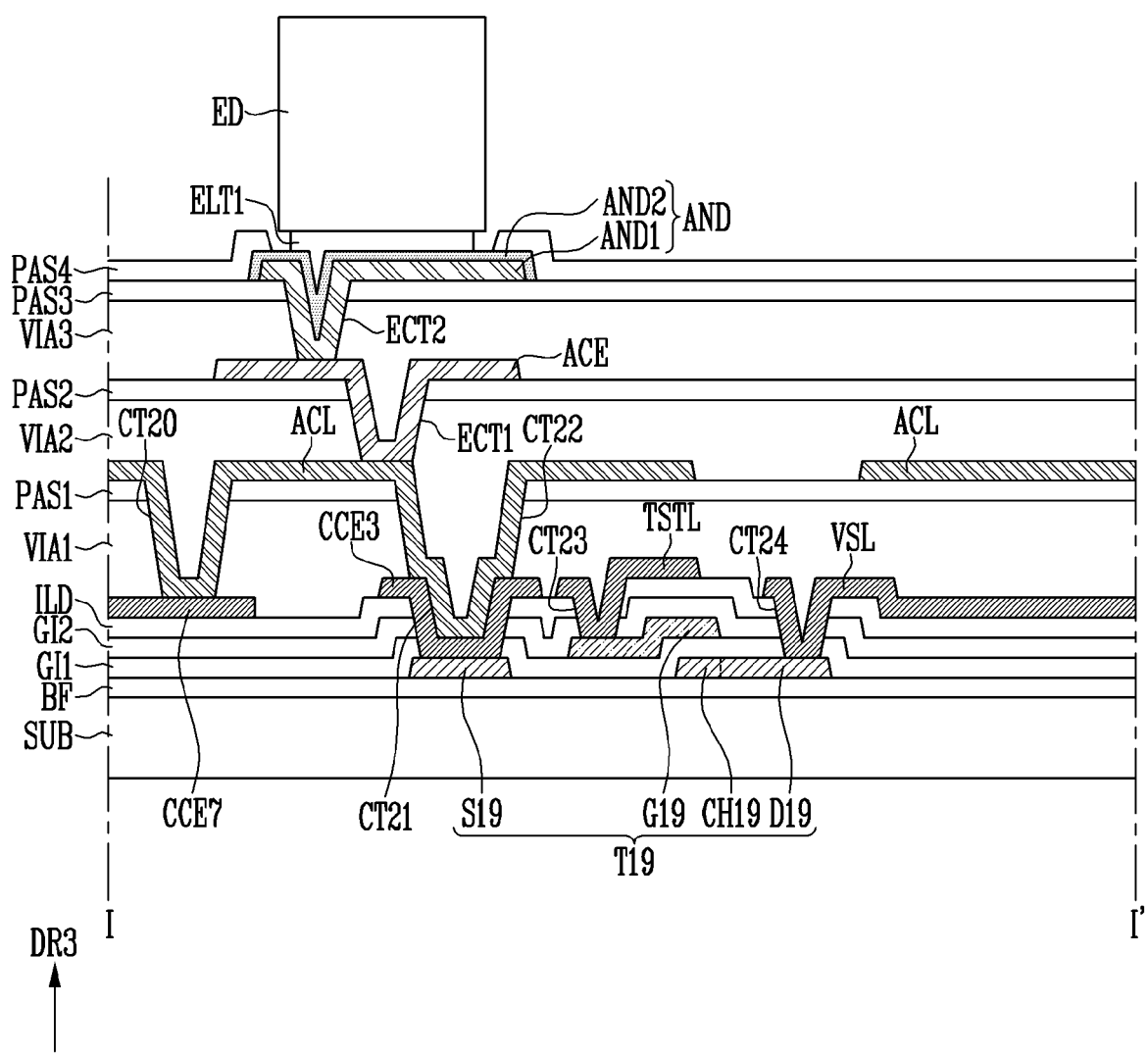
FIG. 24 illustrates a cross-sectional view taken along the line I-I' of FIG. 12.

FIG. 16 illustrates a cross-sectional view taken along the line A-A' of FIG. 12. FIG. 17 illustrates a cross-sectional view taken along the line B-B' of FIG. 12. FIG. 18 illustrates a cross-sectional view taken along line C-C' of FIG. 12. FIG. 19 illustrates a cross-sectional view taken along the line D-D' of FIG. 12. FIG. 20 illustrates a cross-sectional view taken along the line E-E' of FIG. 12. FIG. 21 illustrates a cross-sectional view taken along the line F-F' of FIG. 12. FIG. 22 illustrates a cross-sectional view taken along the line G-G' of FIG. 12. FIG. 23 illustrates a cross-sectional view taken along the line H-H' of FIG. 12. FIG. 24 illustrates a cross-sectional view taken along the line I-I' of FIG. 12.

Referring to FIG. 7 and FIG. 12 to FIG. 24, the cross-sectional structure of the display device 10 has been described with reference to FIG. 7, and the disposition of the semiconductor pattern and the conductive pattern in the sub-pixel SPX has been described with reference to FIG. 12 to FIG. 15, so duplicate descriptions thereof will not be repeated.

The substrate SUB may support the display device 10. The buffer film BF may be disposed on the substrate SUB.

The active layer ACTL (see FIG. 7) may be disposed on the buffer film BF. The active layer ACTL includes the first to nineteenth channels CH1 to CH19, the first to nineteenth source electrodes S1 to S19, and the first to nineteenth drain electrodes D1-D19 of the first to nineteenth transistors T1 to T19.

Each of the first to nineteenth channels CH1 to CH19 may overlap each of the first to nineteenth gate electrodes G1 to G19 in the third direction DR3. The first to nineteenth source electrodes S1 to S19 and the first to nineteenth drain electrodes D1 to D19 may be regions having conductivity by doping an ion or impurity in a silicon semiconductor or oxide semiconductor.

The first gate insulating film GI1 may be disposed on the active layer ACTL. The first gate insulating film GI1 may insulate each of the first to nineteenth channels CH1 to CH19 and each of the first to nineteenth gate electrodes G1 to G19.

The first gate layer GTL1 (see FIG. 7) may be disposed on the first gate insulating film GI1. The first gate layer GTL1 may include the first to nineteenth gate electrodes G1 to G19, the first capacitor electrode CE1, the third capacitor electrode CE3, the fifth capacitor electrode CE5, and the first to fifth gate connecting electrodes GCE1 to GCE5.

The second gate insulating film GI2 may be disposed on the first gate layer GTL1. The second gate insulating film GI2 may insulate the first gate layer GTL1 and the second gate layer GTL2 (see FIG. 7).

The second gate layer GTL2 may be disposed on the second gate insulating film GI2. The second gate layer GTL2 may include the second capacitor electrode CE2, the fourth capacitor electrode CE4, and the sixth capacitor electrode CE6.

The interlayer insulating film ILD may be disposed on the second gate layer GTL2. The interlayer insulating film ILD may insulate the first source metal layer SDL1 (see FIG. 7) and the second gate layer GTL2.

The first source metal layer SDL1 may be disposed on the interlayer insulating film ILD. The first source metal layer SDL1 may include the initializing voltage line VIL, the scan initializing line GIL, the scan writing line GWL, the PWM light emitting line PWEL, the first horizontal power line HVDL, the gate-off voltage line VGHL, the sweep line SWPL, the scan controlling line GCL, the PAM light emitting line PAEL, the test signal line TSTL, and the third power line VSL. The first source metal layer SDL1 may include the first and second data connecting electrodes DCE1 and DCE2 and the first to seventh connecting electrodes CCE1 to CCE7.

The scan writing line GWL may be connected to the first gate connecting electrode GCE1 through the first gate contact hole GCT1 and the third gate contact hole GCT3 passing through the second gate insulating film GI2 and the interlayer insulating film ILD (see FIG. 16 and FIG. 20). The scan initializing line GIL may be connected to the second gate connecting electrode GCE2 through the second gate contact hole GCT2 passing through the second gate insulating film GI2 and the interlayer insulating film ILD (see FIG. 17). The PWM light emitting line PWEL may be connected to the sixth gate connecting electrode GCE6 through the fourteenth contact hole CT14 passing through the second gate insulating film GI2 and the interlayer insulating film ILD (see FIG. 23). The scan controlling line GCL may be connected to the third gate connecting electrode GCE3 through the eighth contact hole CT8 passing through the second gate insulating film GI2 and the interlayer insulating film ILD (see FIG. 19). The PAM light emitting line PAEL may be connected to the fifth gate connecting electrode GCE5 through the nineteenth contact hole CT19 passing through the second gate insulating film GI2 and the interlayer insulating film ILD (see FIG. 23).

The initializing voltage line VIL may be connected to the second sub-drain electrode D32 and the sixth sub-drain electrode D102 through the first power contact hole VCT1 passing through the first gate insulating film GI1, the second gate insulating film GI2, and the interlayer insulating film ILD (see FIG. 17). The initializing voltage line VIL may be connected to the tenth sub-drain electrode D162 and the eighteenth drain electrode D18 through the ninth contact hole CT9 passing through the first gate insulating film GI1, the second gate insulating film GI2, and the interlayer insulating film ILD (see FIG. 19). In addition, the initializing voltage line VIL may be connected to the sixth capacitor electrode CE6 through the eighteenth contact hole CT18 passing through the interlayer insulating film ILD. The first horizontal power line HVDL may be connected to the fifth source electrode S5 and the thirteenth source electrode S13 through the second power contact hole VCT2 passing through the first gate insulating film GI1, the second gate insulating film GI2, and the interlayer insulating film ILD (see FIG. 18). The gate off voltage line VGHL may be connected to the seventh source electrode S7 through the seventh contact hole CT7 passing through the first gate insulating film GI1, the second gate insulating film GI2, and the interlayer insulating film ILD (see FIG. 19). The test signal line TSTL may be connected to the nineteenth gate electrode G19 through the twenty-third contact hole CT23 passing through the second gate insulating film GI2 and the interlayer insulating film ILD (see FIG. 24). The third power line VSL may be connected to the nineteenth drain electrode D19 through the twenty-fourth contact hole CT24 passing through the first gate insulating film GI1, the second gate insulating film GI2, and the interlayer insulating film ILD.

The first data connecting electrode DCE1 may be connected to the second source electrode S2 through the first data contact hole DCT1 passing through the first gate insulating film GI1, the second gate insulating film GI2, and the interlayer insulating film ILD (see FIG. 16). The second data connecting electrode DCE2 may be connected to the ninth source electrode S9 through the third data contact hole DCT3 passing through the first gate insulating film GI1, the second gate insulating film GI2, and the interlayer insulating film ILD (see FIG. 20).

The first connecting electrode CCE1 may be connected to the first gate electrode G1 through the first contact hole CT1 passing through the second gate insulating film GI2 and the interlayer insulating film ILD, and may be connected to the first sub-source electrode S31 and the fourth sub-drain electrode D42 through the second contact hole CT2 passing through the first gate insulating film GI1, the second gate insulating film GI2, and the interlayer insulating film ILD (see FIG. 17).

The second connecting electrode CCE2 may be connected to the thirteenth drain electrode D13 through the third contact hole CT3 passing through the first gate insulating film GI1, the second gate insulating film GI2, and the interlayer insulating film ILD (see FIG. 18), may be connected to fourteenth drain electrode D14 through the fourth contact hole CT4 passing through the first gate insulating film GI1, the second gate insulating film GI2, and the interlayer insulating film ILD, and may be connected to the fourth capacitor electrode CE4 through the fifteenth contact hole CT15 passing through the interlayer insulating film ILD (see FIG. 22).

The third connecting electrode CCE3 may be connected to the nineteenth source electrode S19 through the twenty-first contact hole CT21 passing through the first gate insulating film GI1, the second gate insulating film GI2, and the interlayer insulating film ILD (see FIG. 24).

The fourth connecting electrode CCE4 may be connected to the ninth sub-source electrode S161 through the tenth contact hole CT10 passing through the first gate insulating film GI1, the second gate insulating film GI2, and the interlayer insulating film ILD (e.g., see FIG. 19), and may be connected to the fourth gate connecting electrode CCE4 through the seventeenth contact hole CT17 passing through the second gate insulating film GI2 and the interlayer insulating film ILD (see FIG. 23).

The fifth connecting electrode CCE5 may be connected to the twelfth source electrode S12 and the fourteenth source electrode S14 through the eleventh contact holes CT11 passing through the first gate insulating film GI1, the second gate insulating film GI2, and the interlayer insulating film ILD (see FIG. 21).

The sixth connecting electrode CCE6 may be connected to the eighth gate electrode G8 through the twelfth contact hole CT12 passing through the second gate insulating film GI2 and the interlayer insulating film ILD, and may be connected to the fifth sub-source electrode S101 and the eighth sub-drain electrode D112 through the thirteenth contact hole CT13 passing through the first gate insulating film GI1, the second gate insulating film GI2, and the interlayer insulating film ILD (see FIG. 21).

The seventh connecting electrode CCE7 may be connected to the seventeenth drain electrode D17 and the eighteenth drain electrode D18 through the sixteenth contact hole CT16 passing through the first gate insulating film GI1, the second gate insulating film GI2, and the interlayer insulating film ILD (see FIG. 22).

The first via layer VIA1 may be disposed on the first source metal layer SDL1, and the first passivation layer PAS1 may be disposed on the first via layer VIA1.

The second source metal layer SDL2 (see FIG. 7) may be disposed on the first passivation layer PAS1. The second source metal layer SDL2 may include the data line DL, the first vertical power line VVDL, and the PAM data line RDL. In addition, the second source metal layer SDL2 may include the anode connecting line ACL and the second power connecting electrode VDCE.

The data line DL may be connected to the first data connecting electrode DCE1 through the second data contact hole DCT2 passing through the first passivation layer PAS1 and the first via layer VIA1 (see FIG. 16). The PAM data line RDL may be connected to the second data connecting electrode DCE2 through the fourth data contact hole DCT4 passing through the first passivation layer PAS1 and the first via layer VIA1 (see FIG. 20). The first vertical power line VVDL may be connected to the first horizontal power line HVDL through the third power contact hole VCT3 passing through the first passivation layer PAS1 and the first via layer VIA1 (see FIG. 18). The third power contact hole VCT3 may overlap the second power contact hole VCT2 in the third direction DR3. An area of the third power contact hole VCT3 may be larger than that of the second power contact hole VCT2.

The anode connecting line ACL may be connected to the seventh connecting electrode CCE7 through the twentieth contact hole CT20 through the first passivation layer PAS1 and the first via layer VIA1, and may be connected to the third connecting electrode CCE3 through the twenty-second contact hole CT22 through the first passivation layer PAS1 and the first via layer VIA1 (see FIG. 24). The second power connecting electrode VDCE may be connected to the fifth connecting electrode CCE5 through the fourth power contact hole VCT4 passing through the first passivation layer PAS1 and the first via layer VIA1 (e.g., see FIG. 21).

The second via layer VIA2 may be disposed on the second source metal layer SDL2, and the second passivation layer PAS2 may be disposed on the second via layer VIA2.

The third source metal layer SDL3 (see FIG. 7) may be disposed on the second passivation layer PAS2. The third source metal layer SDL3 may include the first sub-power line VDL21. The first sub-power line VDL21 may be connected to the second power connecting electrode VDCE through the fifth power contact hole VCT5 passing through the second passivation layer PAS2 and the second via layer VIA2 (see FIG. 21). In addition, the third source metal layer SDL3 may include then anode connecting electrode ACE. The anode connecting electrode ACE may be connected to the anode connecting line ACL through the first electrode contact hole ECT1 passing through the second passivation layer PAS2 and the second via layer VIA2 (see FIG. 24).

The third via layer VIA3 may be disposed on the third source metal layer SDL3, and the third passivation layer PAS3 may be disposed on the third via layer VIA3.

The electrode layer may be disposed on the third passivation layer PAS3. The electrode layer may include a second sub-power line VDL22, a third sub-power line VDL23, a first pixel electrode AND1, and a second pixel electrode AND2. The third sub-power line VDL23 may overlap the second sub-power line VDL22 in the third direction DR3, and the third sub-power line VDL23 and the second sub-power line VDL22 may configure the common electrode COM (e.g., see FIG. 7, FIG. 23). The second sub-power line VDL22 and the first pixel electrode AND1 may be formed as a single layer or a multilayer that is made of one of molybdenum (Mo), aluminum (Al), chromium (Cr), gold (Au), titanium (Ti), nickel (Ni), neodymium (Nd), and copper (Cu) or an alloy thereof. The second pixel electrode AND2 may overlap the first pixel electrode AND1 in the third direction DR3, and may configure one pixel electrode AND (see FIG. 7). The third sub-power line VDL23 and the second pixel electrode AND2 may contain a transparent conductive material (TCO) such as an ITO or an IZO.

The fourth passivation layer PAS4 may be disposed on the electrode layer. As shown in FIG. 7, the fourth via layer VIA4 may be further disposed between the fourth passivation layer PAS4 and the electrode layer.

The light emitting element ED may be disposed on the pixel electrode AND not covered by the fourth passivation layer PAS4. The first contact electrode ELT1 may be disposed between the light emitting element ED and the pixel electrode AND to electrically connect the light emitting element ED and the pixel electrode AND.

Figure 25:
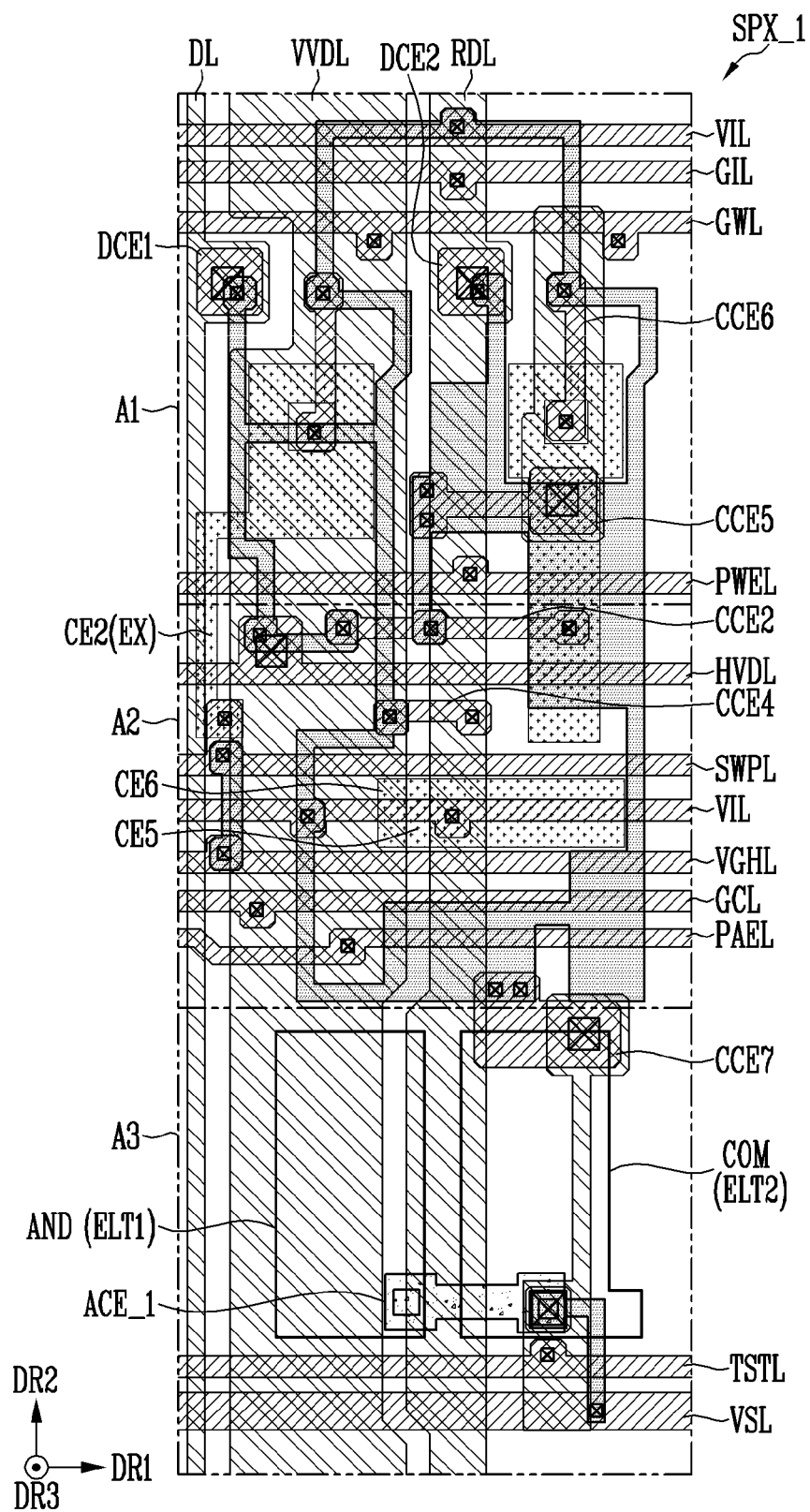
FIG. 25 illustrates a layout diagram of an example of a sub-pixel of FIG. 4.

FIG. 25 illustrates a layout diagram of an example of a sub-pixel of FIG. 4.

Referring to FIG. 4, FIG. 11, FIG. 12, and FIG. 25, a sub-pixel SPX_1 of FIG. 25 may correspond to at least one of the sub-pixels SPX1, SPX2, and SPX3 of FIG. 4. For example, the sub-pixel SPX_1 of FIG. 25 may correspond to the first sub-pixel SPX1 described with reference to FIG. 4, FIG. 6, and FIG. 7, but is not limited thereto. Except for a shape of an anode connecting electrode ACE_1 and disposition of first and second contact electrodes ELT1 and ETL2, the sub-pixel SPX_1 of FIG. 25 is substantially the same as the sub-pixel SPX of FIG. 12, so a duplicate description thereof will not be repeated.

The anode connecting electrode ACE_1 may overlap the anode connecting line ACL in the third direction DR3 as described with reference to FIG. 6, and may be connected to the anode connecting line ACL through the first electrode contact hole ECT1. In addition, the anode connecting electrode ACE_1 extends in the first direction DR1, and may overlap the pixel electrode AND and the common electrode COM in the third direction DR3.

The anode connecting electrode ACE_1 may be connected to the pixel electrode AND through the second electrode contact hole ECT2.

Figure 26:
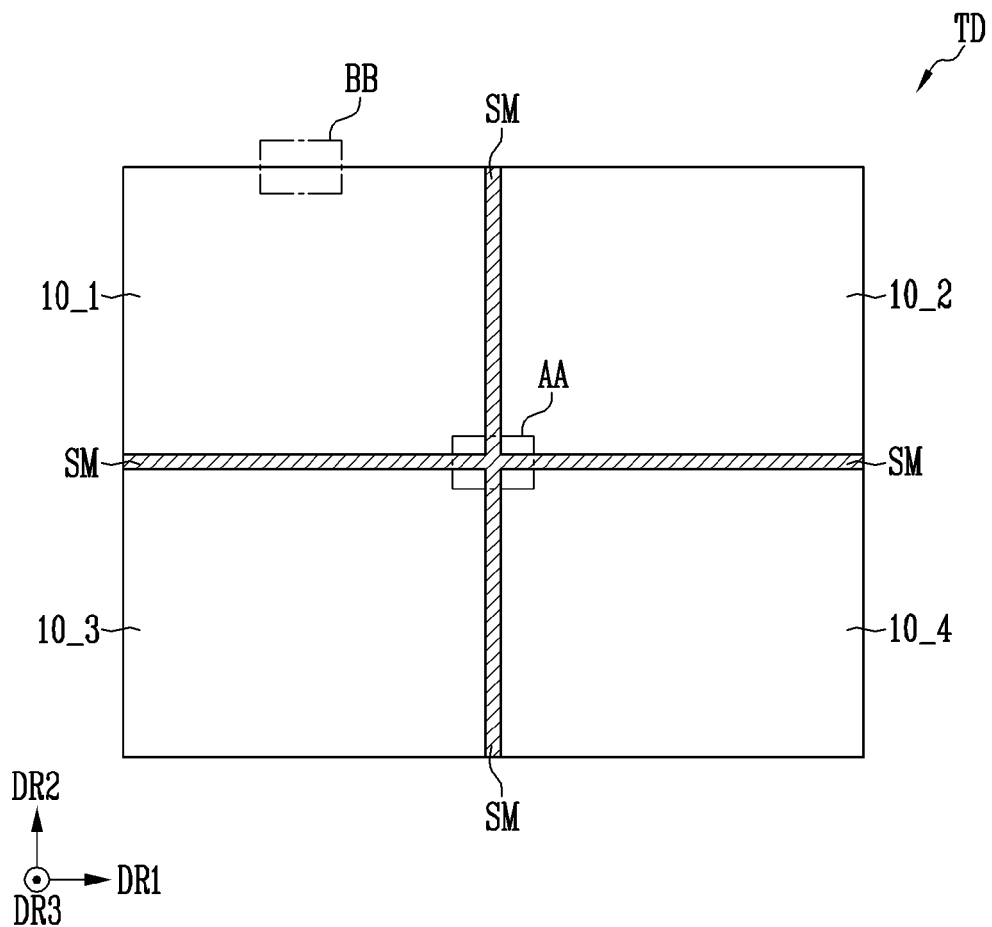
FIG. 26 illustrates a perspective view of a tiled display device including a plurality of display devices according to one or more embodiments.

FIG. 26 illustrates a perspective view of a tiled display device including a plurality of display devices according to one or more embodiments.

Referring to FIG. 26, a tiled display device TD may include a plurality of display devices 10_1, 10_2, 10_3, and 10_4 and a seaming portion SM. For example, the tiled display device TD may include a first display device 10_1, a second display device 10_2, a third display device 10_3, and a fourth display device 10_4.

The plurality of display devices 10_1, 10_2, 10_3, and 10_4 may be arranged in a lattice format. The plurality of display devices 10_1, 10_2, 10_3, and 10_4 may be arranged in a matrix format in M (M is a positive integer) rows and N (N is a positive integer) columns. For example, the first display device 10_1 and the second display device 10_2 may be adjacent to each other in the first direction DR1. The first display device 10_1 and the third display device 10_3 may be adjacent to each other in the second direction DR2. The third display device 10_3 and the fourth display device 10_4 may be adjacent to each other in the first direction DR1. The second display device 10_2 and the fourth display device 10_4 may be adjacent to each other in the second direction DR2.

However, the number and disposition of the plurality of display devices 10_1, 10_2, 10_3, and 10_4 in the tiled display device TD are not limited to those shown in FIG. 26. The number and disposition of the display devices 10_1, 10_2, 10_3, and 10_4 in the tiled display device TD may be determined depending on the size of each of the display device 10 and the tiled display device TD and the shape of the tiled display device TD.

The plurality of display devices 10_1, 10_2, 10_3, and 10_4 may have the same size, but the present disclosure is not limited thereto. For example, the plurality of display devices 10_1, 10_2, 10_3, and 10_4 may have different sizes.

Each of the plurality of display devices 10_1, 10_2, 10_3, and 10_4 may have a rectangular shape including a long side and a short side. The long sides or short sides of the plurality of display devices 10_1, 10_2, 10_3, and 10_4 may be connected and disposed to each other. Some or all of the plurality of display devices 10_1, 10_2, 10_3, and 10_4 may be disposed at the edge of the tiled display device TD, and may form one side of the tiled display device TD. At least one of the plurality of display devices 10_1, 10_2, 10_3, and 10_4 may be disposed in at least one corner of the tiled display device TD, and may form two adjacent sides of the tiled display device TD. At least one of the plurality of display devices 10_1, 10_2, 10_3, and 10_4 may be surrounded by other display devices.

Each of the plurality of display devices 10_1, 10_2, 10_3, and 10_4 may be substantially the same as the display device 10 described with reference to FIG. 1 to FIG. 5. Therefore, a description of each of the plurality of display devices 10_1, 10_2, 10_3, and 10_4 will be omitted.

The seaming portion SM may include a coupling member or an adhesive member. In this case, the plurality of display devices 10_1, 10_2, 10_3, and 10_4 may be connected to each other through the coupling member or the adhesive member of the seaming portion SM. The seaming portion SM may be disposed between the first display device 10_1 and the second display device 10_2, between the first display device 10_1 and the third display device 10_3, between the second display device 10_2 and the fourth display device 10_4, and between the third display device 10_3 and the fourth display device 10_4.

Figure 27:
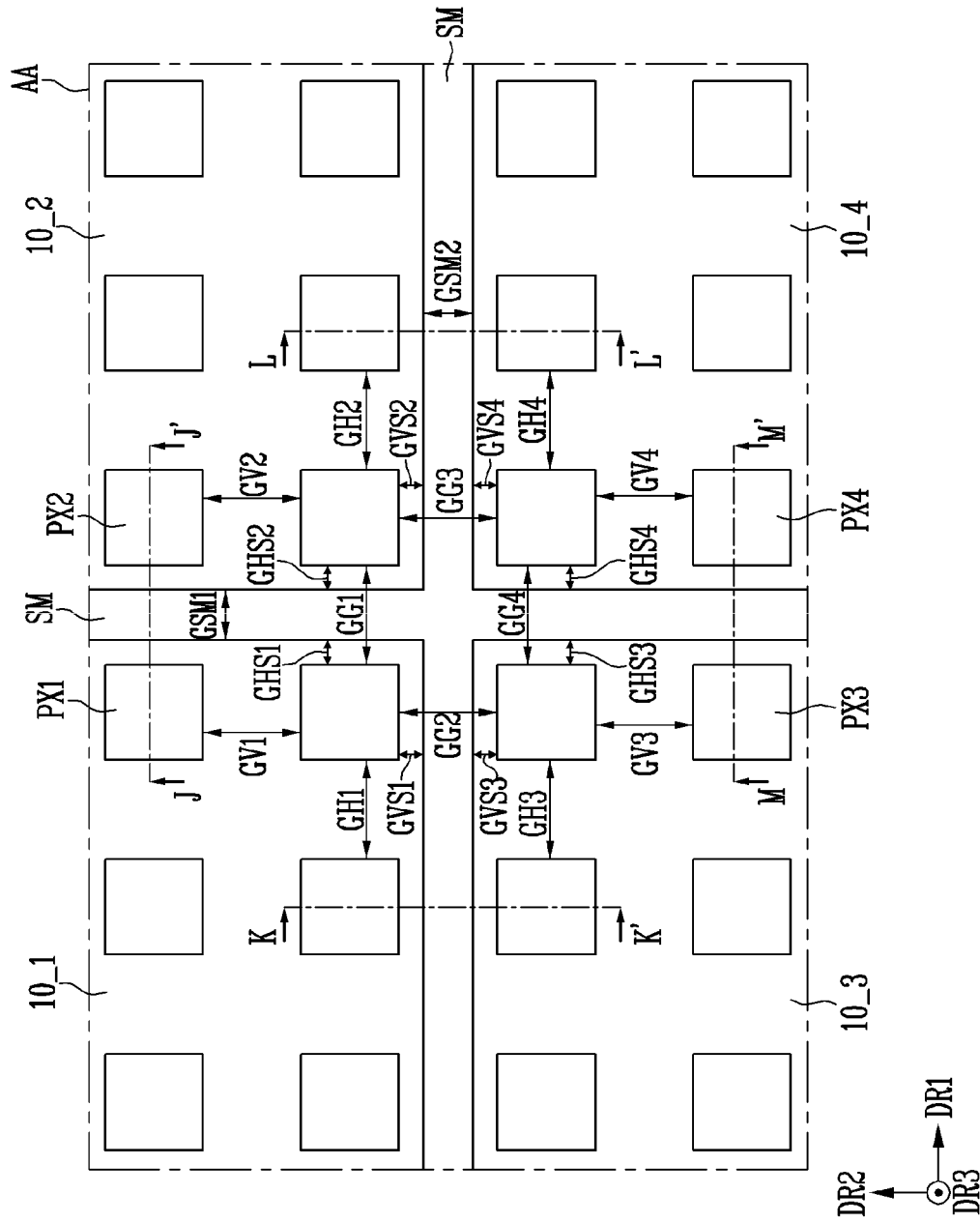
FIG. 27 illustrates an enlarged layout diagram in detail of an area "AA" of FIG. 26.

FIG. 27 illustrates an enlarged layout diagram in detail of an area "AA" of FIG. 26.

Referring to FIG. 27, the seaming portion SM may have a planar shape of a cross or plus sign in a central area of the tiled display device TD in which the first display device 10_1, the second display device 10_2, the third display device 10_3, and the fourth display device 10_4 are adjacent to each other. The seaming portion SM may be disposed between the first display device 10_1 and the second display device 10_2, between the first display device 10_1 and the third display device 10_3, between the second display device 10_2 and the fourth display device 10_4, and between the third display device 10_3 and the fourth display device 10_4.

The first display device 10_1 may include first pixels PX1 arranged in a matrix format along the first direction DR1 and the second direction DR2 so as to display an image. The second display device 10_2 may include second pixels PX2 arranged in a matrix format along the first direction DR1 and the second direction DR2 so as to display an image. The third display device 10_3 may include third pixels PX3 arranged in a matrix format along the first direction DR1 and the second direction DR2 so as to display an image. The fourth display device 10_4 may include fourth pixels PX4 arranged in a matrix format along the first direction DR1 and the second direction DR2 so as to display an image.

A minimum distance between adjacent first pixels PX1 in the first direction DR1 may be defined as a first horizontal separation distance GH1, and a minimum distance between adjacent second pixels PX2 in the first direction DR1 may be defined as a second horizontal separation distance GH2. The first horizontal separation distance GH1 and the second horizontal separation distance GH2 may be substantially the same.

The seaming portion SM may be disposed between the first pixel PX1 and the second pixel PX2 adjacent in the first direction DR1. A minimum distance GG1 between the first pixel PX1 and the second pixel PX2 adjacent in the first direction DR1 may be a sum of a minimum distance GHS1 between the first pixel PX1 and the seaming portion SM in the first direction DR1, a minimum distance GHS2 between the second pixel PX2 and the seaming portion SM in the first direction DR1, and a width GSM1 of the seaming portion SM in the first direction DR1.

The minimum distance GG1 between the first pixel PX1 and the second pixel PX2 adjacent in the first direction DR1, the first horizontal separation distance GH1, and the second horizontal separation distance GH2 may be substantially the same. For this, the minimum distance GHS1 between the first pixel PX1 and the seaming portion SM in the first direction DR1 may be smaller than the first horizontal separation distance GH1, and the minimum distance GHS2 between the second pixel PX2 and the seaming portion SM in the first direction DR1 may be smaller than the second horizontal separation distance GH2. In addition, the width GSM1 of the seaming portion SM in the first direction DR1 may be smaller than the first horizontal separation distance GH1 or the second horizontal separation distance GH2.

A minimum distance between adjacent third pixels PX3 in the first direction DR1 may be defined as a third horizontal separation distance GH3, and a minimum distance between adjacent fourth pixels PX4 in the first direction DR1 may be defined as a fourth horizontal separation distance GH4. The third horizontal separation distance GH3 and the fourth horizontal separation distance GH4 may be substantially the same.

The seaming portion SM may be disposed between the third pixel PX3 and the fourth pixel PX4 adjacent in the first direction DR1. A minimum distance GG4 between the third pixel PX3 and the fourth pixel PX4 adjacent in the first direction DR1 may be a sum of a minimum distance GHS3 between the third pixel PX3 and the seaming portion SM in the first direction DR1, a minimum distance GHS4 between the fourth pixel PX4 and the seaming portion SM in the first direction DR1, and the width GSM1 of the seaming portion SM in the first direction DR1.

The minimum distance GG4 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the seaming portion SM in the first direction DR1 may be smaller than the third horizontal separation distance GH3, and the minimum distance GHS4 between the fourth pixel PX4 and the seaming portion SM in the first direction DR1 may be smaller than the fourth horizontal separation distance GH4. In addition, the width GSM1 of the seaming portion SM in the first direction DR1 may be smaller than the third horizontal separation distance GH3 or the fourth horizontal separation distance GH4.

A minimum distance between adjacent first pixels PX1 in the second direction DR2 may be defined as a first vertical separation distance GV1, and a minimum distance between adjacent third pixels PX3 in the second direction DR2 may be defined as a third vertical separation distance GV3. The first vertical separation distance GV1 and the third vertical separation distance GV3 may be substantially the same.

The seaming portion SM may be disposed between the first pixel PX1 and the third pixel PX3 adjacent in the second direction DR2. A minimum distance GG2 between the first pixel PX1 and the third pixel PX3 adjacent in the second direction DR2 may be a sum of a minimum distance GVS1 between the first pixel PX1 and the seaming portion SM in the second direction DR2, a minimum distance GVS3 between the third pixel PX3 and the seaming portion SM in the second direction DR2, and a width GSM2 of the seaming portion SM in the second direction DR2.

The minimum distance GG2 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the seaming portion SM in the second direction DR2 may be smaller than the first vertical separation distance GV1, and the minimum distance GVS3 between the third pixel PX3 and the seaming portion SM in the second direction DR2 may be smaller than the third vertical separation distance GV3. In addition, the width GSM2 of the seaming portion SM in the second direction DR2 may be smaller than the first vertical separation distance GV1 or the third vertical separation distance GV3.

A minimum distance between adjacent second pixels PX2 in the second direction DR2 may be defined as a second vertical separation distance GV2, and a minimum distance between adjacent fourth pixels PX4 in the second direction DR2 may be defined as a fourth vertical separation distance GV4. The second vertical separation distance GV2 and the fourth vertical separation distance GV4 may be substantially the same.

The seaming portion SM may be disposed between the second pixel PX2 and the fourth pixel PX4 adjacent in the second direction DR2. A minimum distance GG3 between the second pixel PX2 and the fourth pixel PX4 adjacent in the second direction DR2 may be a sum of a minimum distance GVS2 between the second pixel PX2 and the seaming portion SM in the second direction DR2, a minimum distance GVS4 between the fourth pixel PX4 and the seaming portion SM in the second direction DR2, and the width GSM2 of the seaming portion SM in the second direction DR2.

The minimum distance GG3 between the second pixel PX2 and the fourth pixel PX4 adjacent in the second direction DR2, the second vertical separation distance GV2, and the fourth vertical separation distance GV4 may be substantially the same. To this end, the minimum distance GVS2 between the second pixel PX2 and the seaming portion SM in the second direction DR2 may be smaller than the second vertical separation distance GV2, and the minimum distance GVS4 between the fourth pixel PX4 and the seaming portion SM in the second direction DR2 may be smaller than the fourth vertical separation distance GV4. In addition, the width GSM2 of the seaming portion SM in the second direction DR2 may be smaller than the second vertical separation distance GV2 or the fourth vertical separation distance GV4.

As shown in FIG. 27, in order to prevent the seaming portion SM between images displayed by the plurality of display devices 10_1, 10_2, 10_3, and 10_4 from being viewed, the minimum distance between the pixels of adjacent display devices may be substantially the same as the minimum distance between the pixels of each of the display devices.

Figure 28:
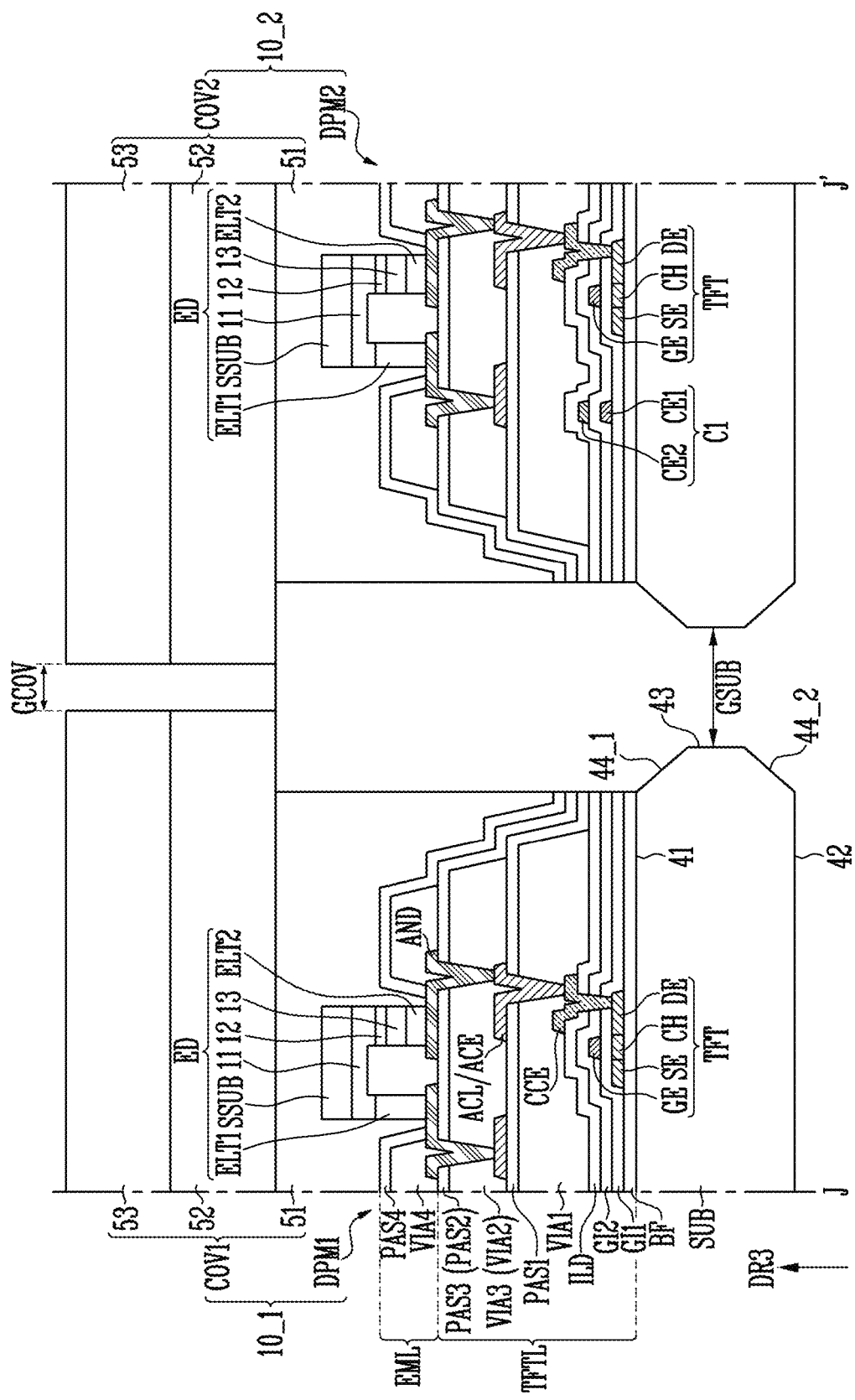
FIG. 28 illustrates a cross-sectional view of an example of a tiled display device taken along the line J-J' of FIG. 27.

FIG. 28 illustrates a cross-sectional view of an example of a tiled display device taken along the line J-J' of FIG. 27.

Referring to FIG. 28, the first display device 10_1 includes a first display module DPM1 and a first front cover COV1. The second display device 10_2 includes a second display module DPM2 and a second front cover COV2.

Each of the first display module DPM1 and the second display module DPM2 includes a substrate SUB, a thin film transistor layer TFTL, and a light emitting element layer EML. The thin film transistor layer TFTL and the light emitting element layer EML have already been described in detail with reference to FIG. 7. In FIG. 28, descriptions described in FIG. 7 will be omitted.

The substrate SUB may include a first surface 41 on which the thin film transistor layer TFTL is disposed, a second surface 42 that is opposite the first surface, and a first side surface 43 disposed between the first surface 41 and the second surface 42. The first surface 41 may be a front or upper surface of the substrate SUB, and the second surface 42 may be a rear or lower surface of the substrate SUB.

In addition, the substrate SUB may further include chamfer surfaces 44_1 and 44_2 that are disposed between the first surface 41 and the first side surface 43 and between the second surface 42 and the first side surface 43. The thin film transistor layer TFTL and the light emitting element layer EML may not be disposed on the chamfer surfaces 44_1 and 44_2. Due to the chamfer surfaces 44_1 and 44_2, it is possible to prevent the substrate SUB of the first display device 10_1 and the substrate of the second display device 10_2 from colliding and being damaged.

The chamfer surfaces 44_1 and 44_2 may be disposed between the other side surfaces except the first surface 41 and the first side surface 43, and between the other side surfaces except the second surface 42 and the first side surface 43, respectively. For example, when the first display device 10_1 and the second display device 10_2 have a rectangular planar shape as shown in FIG. 26, the chamfer surfaces 44_1 and 44_2 may be disposed between the first surface 41 and upper, left side, and lower side surfaces of the first display device 10_1, respectively, and between the second surface 42 and the upper, left, and lower side surfaces of the first display device 10_1, respectively.

The first front cover COV1 may be disposed on the chamfer surfaces 44_1, 44_2 of the substrate SUB. That is, the first front cover COV1 may be further protrude than the substrate SUB in the first direction DR1 and the second direction DR2. Accordingly, a distance GSUB between the substrate SUB of the first display device 10_1 and the substrate SUB of the second display device 10_2 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to bond the light emitting element layer EML of the first display module DPM1 and the first front cover COV1. The adhesive member 51 of the second front cover COV2 serves to bond the light emitting element layer EML of the second display module DPM2 and the second front cover COV2. The adhesive member 51 may be a transparent adhesive member capable of transmitting light. For example, the adhesive member 51 may be an optically clear adhesive film or an optically clear adhesive resin.

The anti-glare layer 53 may be designed to diffusely reflect external light to prevent deterioration of image visibility by reflecting the external light as it is. Accordingly, due to the anti-glare layer 53, a contrast ratio of images displayed by the first display device 10_1 and the second display device 10_2 may be increased.

The light transmittance control layer 52 may be designed to reduce transmittance of external light or light reflected from the first display module DPM1 and the second display module DPM2. Accordingly, the distance GSUB between the substrate SUB of the first display module DPM1 and the substrate SUB of the second display module DPM2 may be prevented from being viewed from the outside.

The anti-glare layer 53 may be implemented as a polarizing plate, and the light transmittance control layer 52 may be implemented as a phase delay layer, but the embodiment of the present specification is not limited thereto.

An example of the tiled display device taken along the line K-K', the line L-L', and the line M-M' of FIG. 27 is substantially the same as an example of the tiled display device taken along the line J-J' described with reference to FIG. 28, so a description thereof will be omitted.

Figure 29:
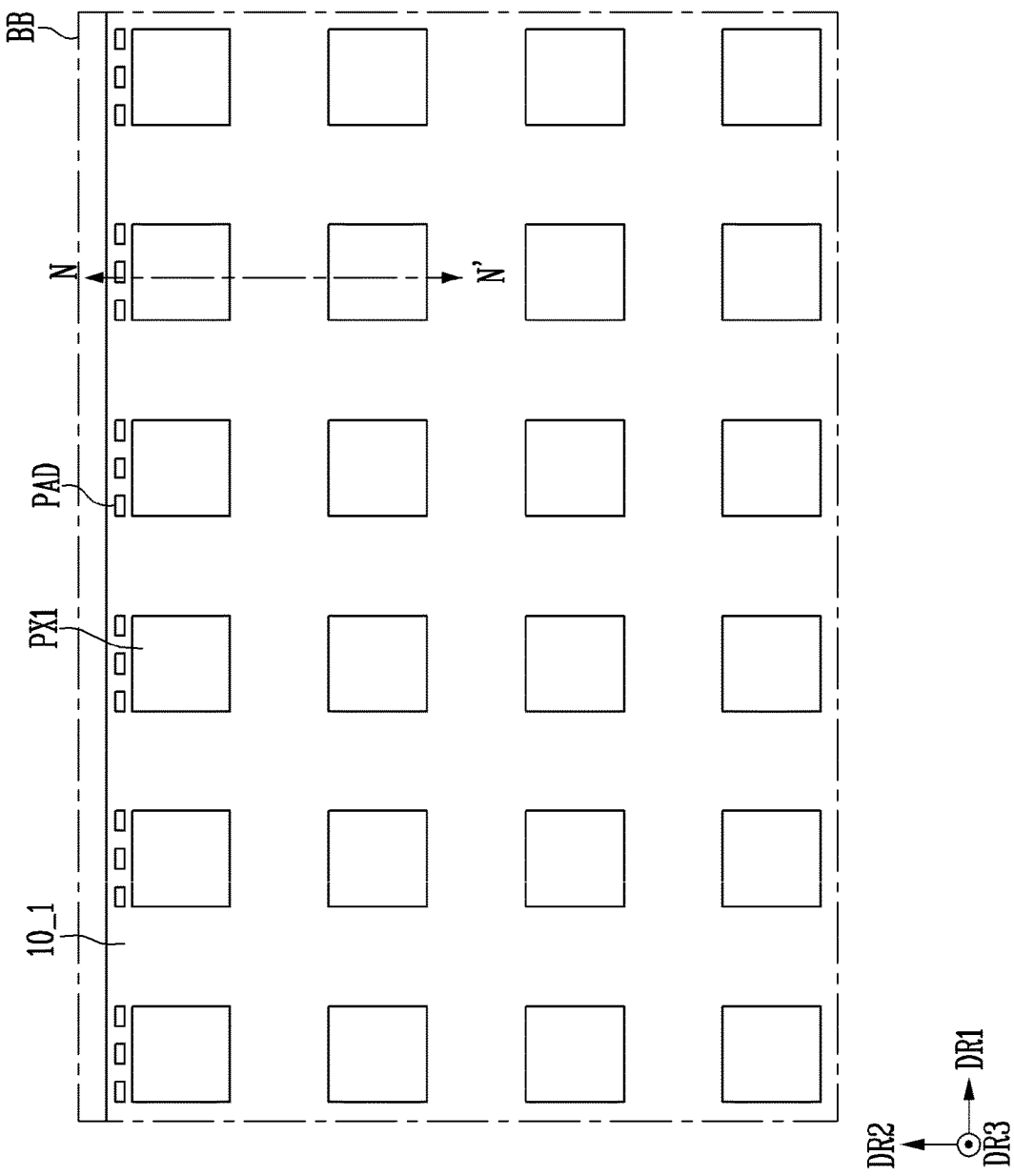
FIG. 29 illustrates an enlarged layout diagram in detail of an area "BB" of FIG. 26.

FIG. 29 illustrates an enlarged layout diagram in detail of area "BB" of FIG. 26. FIG. 29 illustrates, for better understanding and ease of description, pads PAD and first pixels PX1 disposed at an upper side of the first display device 10_1. The second display device 10_2, the third display device 10_3, and the fourth display device 10_4 substantially have the same configuration as that of the first display device 10_1, so duplicate descriptions thereof will be omitted.

Referring to FIG. 29, the pads PAD may be disposed at an upper edge of the first display device 10_1. When data lines (refer to "DL" in FIG. 5 or FIG. 30) of the first display device 10_1 extend in the second direction DR2, the pads PAD may be disposed at the upper and lower edges of the first display device 10_1. Alternatively, when the data lines of the first display device 10_1 extend in the first direction DR1, the pads PAD may be disposed at the left edge and the right edge of the first display device 10_1.

Each of the pads PAD may be connected to the data line on the upper surface of the substrate SUB. In addition, each of the pads PAD may be connected to a side wire (refer to "SSL" in FIG. 30). The side wire may be disposed at the upper surface, one side surface, and the lower surface (or rear surface) of the substrate SUB. The side wire SSL may be connected to a connecting wire (refer to "CCL" in FIG. 30) on the lower surface of the substrate SUB.

Figure 30:
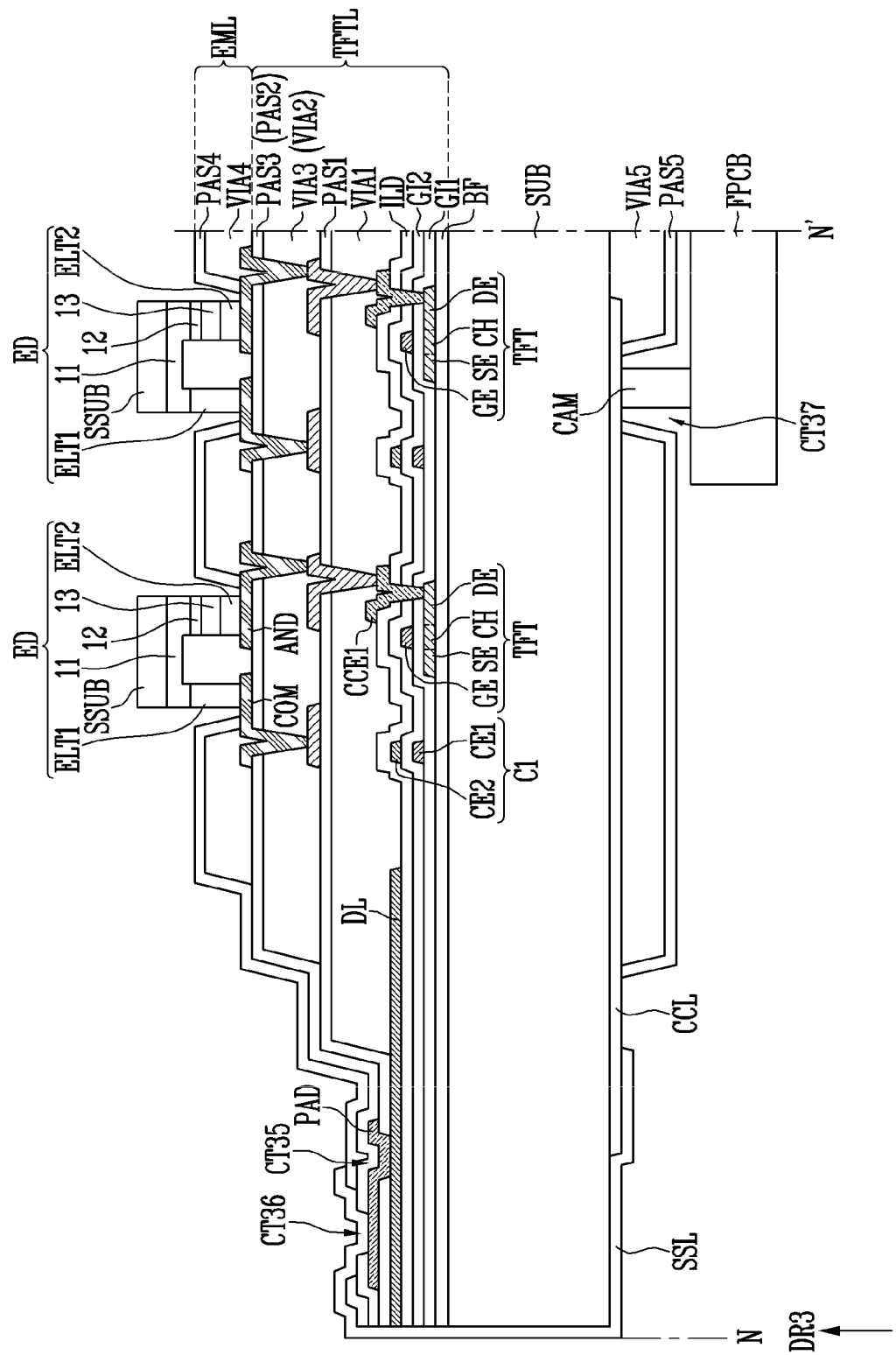
FIG. 30 illustrates a cross-sectional view of an example of a tiled display device taken along the line N-N' of FIG. 29.

FIG. 30 illustrates a cross-sectional view of an example of a tiled display device taken along the line N-N' of FIG. 29. In FIG. 30, the same reference numerals are denoted to the same as the constituent elements of the cross-sectional views shown in FIG. 28 and FIG. 7, and the contents described in FIG. 28 and FIG. 7 will be omitted.

Referring to FIG. 30, the pad PAD may be disposed on the first passivation layer PAS1. A portion of the pad PAD may be exposed without being covered by the third passivation layer PAS3 (and/or the second passivation layer PSA2) and the fourth passivation layer PAS4. The pad PAD may include the same material as the pixel electrodes AND and the common electrodes COM. For example, the pad PAD may include a highly reflective metallic material such as a stacked structure (Ti/Al/Ti) of aluminum and titanium, a stacked structure (ITO/Al/ITO) of aluminum and an ITO, an APC alloy, and a stacked structure (ITO/APC/ITO) of an APC alloy and an ITO.

The first source metal layer SDL1 (e.g., see FIG. 7) may include the data line DL. The data line DL may be disposed on the interlayer insulating film ILD. That is, the data line DL may be disposed on (or at) the same layer as the connecting electrode CCE1, and may include the same material as the connecting electrode CCE1.

The pad PAD may be connected to the data line DL through a thirty-fifth contact hole CT35 passing through the first via layer VIA1, the first passivation layer PAS1, and in some embodiments, passing through the third via layer VIA3 (and/or the second via layer VIA2), and the third passivation layer PAS3 (and/or the second passivation layer PAS2).

The connecting wire CCL may be disposed on the lower surface of the substrate SUB. The connecting wire CCL may be a single layer or a multilayer that is made of one of molybdenum (Mo), aluminum (Al), chromium (Cr), gold (Au), titanium (Ti), nickel (Ni), neodymium (Nd), and copper (Cu) or an alloy thereof.

The fifth via layer VIA5 may be disposed on a portion of the connecting wire CCL. The fifth via layer VIA5 may be formed as an organic film including an acryl resin, an epoxy resin, a phenolic resin, a polyamide resin, a polyimide resin, and the like.

The fifth passivation layer PAS5 may be disposed on the fifth via layer VIA5. The fifth passivation layer PAS5 may be formed as an inorganic film, for example, a silicon nitride layer, a silicon oxynitride layer, a silicon oxide layer, a titanium oxide layer, or an aluminum oxide layer.

The side wire SSL may be disposed at the upper, side, and lower edges of the substrate SUB. One end of the side wire SSL may be connected to the pad PAD. One end of the side wire SSL may be connected to the pad PAD through a thirty-sixth contact hole CT36 passing through the fourth passivation layer PAS4. The other end of the side wire SSL may be connected to the connecting wire CCL.

The side wire SSL may be disposed on the side surface of the substrate SUB, the side surface of the buffer film BF, the side surface of the first gate insulating film GI1, the side surface of the second gate insulating film GI2, the side surface of the interlayer insulating film ILD, the side surface of the first passivation layer PAS1, and the side surface of the third via layer VIA3 (and/or the second via layer VIA2).

Because the pad PAD formed at the upper edge of the substrate SUB and the connecting wire CCL formed at the lower edge of the substrate SUB are connected through the side wire SSL, a first coating pattern PR and a second coating pattern OC surrounding an edge area EDG to protect the side wire SSL exposed to the outside from moisture and oxygen and to prevent it from being viewed by the user from the outside may be formed.

A flexible film FPCB may be disposed on the lower surface of the fifth passivation layer PAS5. The flexible film FPCB may be connected to the connecting wire CCL through a thirty-seventh contact hole CT37 passing through the fifth via layer VIA5 and the fifth passivation layer PAS5 by using a conductive adhesive member CAM. A source driving circuit for supplying data voltages to the data lines DL may be disposed on the lower surface of the flexible film FPCB. The conductive adhesive member CAM may be an anisotropic conductive film or an anisotropic conductive paste.

As described above, in the first display device 10_1, the source driving circuit of the flexible film FPCB disposed at the lower portion of the substrate SUB may be connected to the data line DL through the connecting wire CCL, the side wire SSL, and the pad PAD. That is, because the source driving circuit is disposed to the substrate SUB, a non-display area NDA may be eliminated, so that the pixels PX may be formed at the edge of the substrate SUB.

Figure 31:
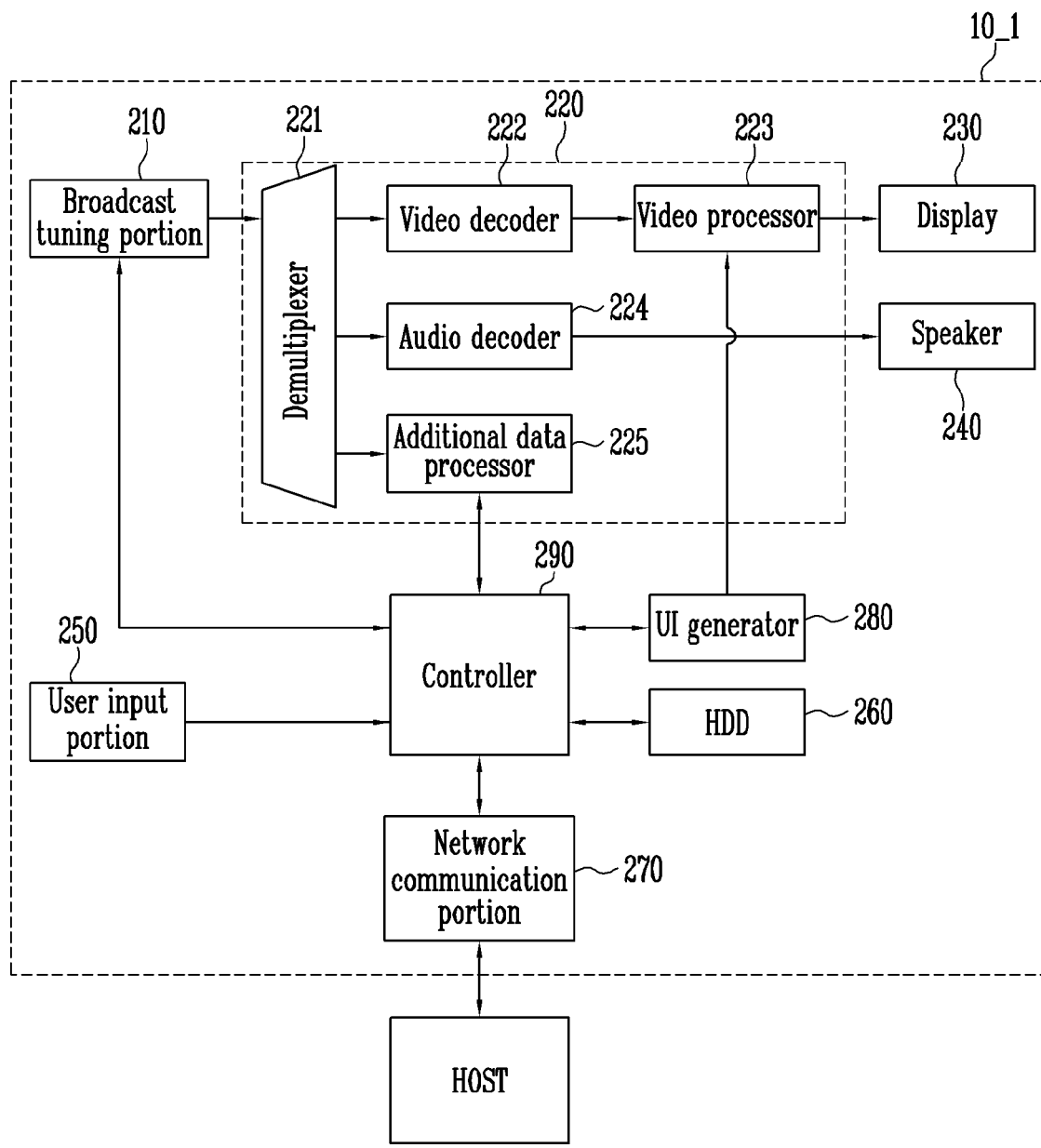
FIG. 31 illustrates a block diagram of a tiled display device according to one or more embodiments.

FIG. 31 illustrates a block diagram of a tiled display device according to one or more embodiments. FIG. 31 illustrates, for better comprehension and ease of description, the first display device 10_1 and a host system HOST.

Referring to FIG. 31, the tiled display device TD according to one or more embodiments may include the host system HOST, a broadcast tuning portion 210, a signal processor 220, a display portion 230, a speaker 240, a user input portion 250, a hard drive disk (HDD) 260, a network communication portion 270, a UI generator 280, and a controller 290.

The host system HOST may be implemented as one of a television system, a home theater system, a set-top box, a navigation system, a DVD player, a Blu-ray player, a personal computer, a mobile phone system, and a tablet.

A user's instruction may be inputted to the host system HOST in various formats. For example, a command by a user's touch input may be inputted to the host system HOST. In addition, a user command by a keyboard input or a button input of a remote controller may be inputted to the host system HOST.

The host system HOST may receive an original video data corresponding to an original image from the outside. The host system HOST may divide the original video data by the number of display devices. For example, the host system HOST may divide the original video data into a first video data corresponding to a first image, a second video data corresponding to a second image, a third video data corresponding to a third image, and a fourth video data corresponding to a fourth image, corresponding to the first display device 10_1, the second display device 10_2, the third display device 10_3, and the fourth display device 10_4. The host system HOST may transmit the first video data to the first display device 10_1, transmit the second video data to the second display device 10_2, transmit the third video data to the third display device 10_3, and transmit the fourth video data to the fourth display device 10_4.

The first display device 10_1 may display the first image according to the first video data, the second display device 10_2 may display the second image according to the second video data, the third display device 10_3 may display the third image according to the third video data, and the fourth display device 10_4 may display the fourth image according to the fourth video data. Accordingly, the user may view the original image in which the first to fourth images displayed on the first to fourth display devices 10_1, 10_2, 10_3, and 10_4 are combined.

The first display device 10_1 may include a broadcast tuning portion 210, a signal processor 220, a display portion 230, a speaker 240, a user input portion 250, an HDD 260, a network communication portion 270, a UI generator 280, and a controller 290.

The broadcast tuning portion 210 may receive a broadcast signal of a corresponding channel through an antenna by tuning a desired channel frequency (e.g., a predetermined channel frequency) according to control of the controller 290. The broadcast tuning portion 210 may include a channel detection module and an RF demodulation module.

The broadcast signal demodulated by the broadcast tuning portion 210 is processed by the signal processor 220 to output to the display portion 230 and the speaker 240. Here, the signal processor 220 may include a demultiplexer 221, a video decoder 222, a video processor 223, an audio decoder 224, and an additional data processor 225.

The demultiplexer 221 separates the demodulated broadcast signal into a video signal, an audio signal, and additional data. The separated video signal, audio signal, and additional data are restored by the video decoder 222, the audio decoder 224, and the additional data processor 225, respectively. In this case, the video decoder 222, the audio decoder 224, and the additional data processor 225 restore them into a decoding format corresponding to an encoding format when a broadcast signal is transmitted.

In one or more embodiments, the decoded video signal is converted by the video processor 223 to fit a vertical frequency, a resolution, a screen ratio, and the like that meet an output standard of the display portion 230, and the decoded audio signal is outputted to the speaker 240.

The display portion 230 may include a display panel on which an image is displayed and a panel driver for controlling driving of the display panel.

The user input portion 250 may receive a signal transmitted by the host system HOST. The user input portion 250 allows the user to receive commands related to communication with other display devices as well as data related to channel selection, user Interface (UI) menu selection, and operation transmitted by the host system HOST. Data for selection and input may be provided to be inputted.

The HDD 260 stores various software programs including OS programs, recorded broadcast programs, moving pictures, photos, and other data, and may be realized as a storage medium such as a hard disk or a non-volatile memory.

The network communication portion 270 is for short-distance communication with the host system HOST and other display devices, and is a communication module including an antenna pattern that can implement mobile communication, data communication, Bluetooth, RF, Ethernet, and the like may be implemented.

The network communication portion 270 is a technical standard or communication method for mobile communication (for example, Global System for Mobile communication (GSM), Code Division Multi Access (CDMA), Code Division Multi Access (CDMA2000)) through an antenna pattern to be described later. 2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, and the like) may transmit/receive a radio signal with at least one of a base station, an external terminal, and a server on a mobile communication network.

The network communication portion 270 may transmit/receive a wireless signal in a communication network according to wireless Internet technologies through an antenna pattern to be described later. As wireless Internet technologies, for example, WLAN (Wireless LAN), Wi-Fi (Wireless-Fidelity), Wi-Fi (Wireless Fidelity) Direct, DLNA (Digital Living Network Alliance), WiBro (Wireless Broadband), WiMAX (World Interoperability for Microwave Access), High Speed Downlink Packet Access (HSDPA), High Speed Uplink Packet Access (HSUPA), Long Term Evolution (LTE), Long Term Evolution-Advanced (LTE-A), and the like, and the antenna pattern transmits and receives data according to at least one wireless Internet technology within a range including Internet technologies not listed above.

The UI generator 280 generates a UI menu for communication with the host system HOST and other display devices, and may be implemented by an algorithm code and an on-screen display (OSD) integrated circuit (IC). The UI menu for communication with the host system HOST and other display devices is a menu for designating a counterpart digital TV for communication and selecting a desired function.

The controller 290 is in charge of overall control of the first display device 10_1 and is in charge of communication control of the host system HOST and other display devices 10_2, 10_3, and 10_4, and a corresponding algorithm code for control is stored and, and it may be implemented by a micro controller unit (MCU) in which the stored algorithm code is executed.

The controller 290 controls to transmit the corresponding control command and data to the host system HOST and other display devices 10_2, 10_3, and 10_4 through the network communication portion 270 according to the input and selection of the user input portion 250. Of course, when suitable control command and data (e.g., predetermined control command and data) are input from the host system HOST and other display devices 10_2, 10_3, and 10_4, an operation is performed according to the control command.

In one or more embodiments, a block diagram of the second display device 10_2, a block diagram of the third display device 10_3, and a block diagram of the fourth display device 10_4 are substantially the same as the block diagram of the first display device 10_1 described with reference to FIG. 31, so duplicate descriptions will be omitted.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by on the technical scope of the accompanying claims and their equivalents.

What is claimed is:

1. A display device comprising:
  a pixel, wherein the pixel comprises:
    a first light emitting element, a second light emitting element, and a third light emitting element that are arranged at equal distances from each other along a first direction;
    first pixel electrodes arranged along the first direction and contacting the first to third light emitting elements; and
    second pixel electrodes paired with the first pixel electrodes, arranged along the first direction, and contacting the first to third light emitting elements,
    wherein each of the first to third light emitting elements comprises a first semiconductor layer, a second semiconductor layer, and an active layer between the first semiconductor layer and the second semiconductor layer, and comprises a mesa area in which one of the first and second semiconductor layers is partially exposed by another thereof;
    wherein the mesa area of the first light emitting element overlaps one of the first pixel electrodes in a thickness direction;
    wherein the mesa area of the second light emitting element overlaps one of the second pixel electrodes in the thickness direction; and
    wherein an arrangement order of the first and second pixel electrodes contacting the first light emitting element is opposite to an arrangement order of the first and second pixel electrodes contacting the second light emitting element.

2. The display device of claim 1, wherein each of the first to third light emitting elements comprises an inclined surface along an edge of the mesa area, and wherein the inclined surfaces of the first to third light emitting elements respectively face a same direction.

3. The display device of claim 1, wherein an arrangement order of the first and second pixel electrodes contacting the third light emitting element is a same as the arrangement order of the first and second pixel electrodes contacting the second light emitting element.

4. The display device of claim 1, wherein the first to third light emitting elements are sequentially arranged along the first direction, and
wherein a distance in the first direction between the first pixel electrodes contacting the first and second light emitting elements is different from a distance in the first direction between the first pixel electrodes contacting the second and third light emitting elements.

5. The display device of claim 1, wherein a distance in the first direction between the first pixel electrodes contacting the first and second light emitting elements is different from a distance in the first direction between the second pixel electrodes contacting the first and second light emitting elements.

6. The display device of claim 5, wherein a distance in the first direction between the first pixel electrodes contacting the second and third light emitting elements is a same as a distance in the first direction between the second pixel electrodes contacting the second and third light emitting elements.

7. The display device of claim 1, wherein the first light emitting element is configured to emit light of a red color, and the second light emitting element is configured to emit light of a green color or light of a blue color.

8. The display device of claim 1, wherein the pixel further comprises a first pixel circuit, a second pixel circuit, and a third pixel circuit that are respectively configured to supply driving currents to the first to third light emitting elements through the first pixel electrodes, and
wherein each of the first to third pixel circuits comprises at least one transistor and at least one capacitor.

9. The display device of claim 8, wherein each of the first to third pixel circuits further comprises a bridge pattern contacting the first pixel electrodes, and
wherein a shape of the bridge pattern of the first pixel circuit is different from a shape of the bridge pattern of the second pixel circuit.

10. The display device of claim 9, wherein the bridge pattern of the first pixel circuit overlaps the second pixel electrodes in a plan view, and the bridge pattern of the second pixel circuit does not overlap the second pixel electrodes in a plan view.

11. The display device of claim 8, wherein the first to third pixel circuits have a same circuit structure.

12. The display device of claim 11, wherein the first pixel circuit is positioned in a second direction with respect to the first light emitting element, the second pixel circuit is positioned in the second direction with respect to the second light emitting element, and the third pixel circuit is positioned in the second direction with respect to the third light emitting element, and
wherein the second direction is perpendicular to the first direction.

13. The display device of claim 1, wherein each of the first to third light emitting elements is a flip-chip type of micro light emitting diode.

14. A display device comprising:
a pixel, wherein the pixel comprises:
a first light emitting element, a second light emitting element, and a third light emitting element that are arranged at equal distances from each other along a first direction; and
first pixel electrodes arranged along the first direction and contacting the first to third light emitting elements,
wherein each of the first to third light emitting elements comprises a first semiconductor layer, a second semiconductor layer, and an active layer between the first semiconductor layer and the second semiconductor layer, and comprises a mesa area in which one of the first and second semiconductor layers is partially exposed by another thereof;
wherein the mesa area of the first light emitting element is in the first semiconductor layer;
wherein the mesa area of the second light emitting element is in the second semiconductor layer; and
wherein the first pixel electrodes are arranged at different distances along the first direction.

15. A tiled display device comprising:
a plurality of display devices, and a seaming portion located between the plurality of display devices,
wherein a first display device of the plurality of display devices comprises:
a substrate; and
a pixel on a first surface of the substrate,
wherein the pixel comprises:
a first light emitting element, a second light emitting element, and a third light emitting element that are arranged at equal distances from each other along a first direction;
first pixel electrodes arranged along the first direction and contacting the first to third light emitting elements; and
second pixel electrodes paired with the first pixel electrodes, arranged along the first direction, and contacting the first to third light emitting elements,
wherein each of the first to third light emitting elements comprises a first semiconductor layer, a second semiconductor layer, and an active layer between the first semiconductor layer and the second semiconductor layer, and comprises a mesa area in which one of the first and second semiconductor layers is partially exposed by another thereof;
wherein the mesa area of the first light emitting element overlaps one of the first pixel electrodes in a thickness direction;
wherein the mesa area of the second light emitting element overlaps one of the second pixel electrodes in the thickness direction; and
wherein an arrangement order of the first and second pixel electrodes contacting the first light emitting element is opposite to an arrangement order of the first and second pixel electrodes contacting the second light emitting element.

16. The tiled display device of claim 15, wherein each of the first to third light emitting elements is a flip chip type of micro light emitting diode.

17. The tiled display device of claim 15, wherein the substrate comprises glass.

18. The tiled display device of claim 15, wherein the first display device further comprises:
a pad on the first surface of the substrate; and
a side wire on the first surface of the substrate, a second surface opposite to the first surface, and one side surface between the first surface and the second surface, and is connected to the pad.

19. The tiled display device of claim 18, wherein the first display device further comprises:
- a connecting wire on the second surface of the substrate; and
- a flexible film connected to the connecting wire through a conductive adhesive member, and
- wherein the side wire is connected to the connecting wire.

20. The tiled display device of claim 15, wherein the plurality of display devices are arranged in a matrix format in M rows and N columns.

* * * * *